US012740314B2

(12) United States Patent
Shin et al.

(10) Patent No.: US 12,740,314 B2
(45) Date of Patent: Sep. 15, 2026

(54) LIGHT-EMITTING DEVICE AND ELECTRONIC APPARATUS INCLUDING THE SAME

(71) Applicant: Samsung Display Co., Ltd., Yongin-si (KR)

(72) Inventors: Hyosup Shin, Yongin-si (KR); Tsuyoshi Naijo, Yongin-si (KR); Sungsoo Bae, Yongin-si (KR); Hojung Syn, Yongin-si (KR); Jiyoung Lee, Yongin-si (KR); Changwoong Chu, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 420 days.

(21) Appl. No.: 18/370,815

(22) Filed: Sep. 20, 2023

(65) Prior Publication Data

US 2024/0298517 A1 Sep. 5, 2024

(30) Foreign Application Priority Data

Feb. 15, 2023 (KR) ........................ 10-2023-0020118

(51) Int. Cl.
*H10K 85/30* (2023.01)
*C09K 11/06* (2006.01)
(Continued)

(52) U.S. Cl.
CPC ............ *H10K 85/346* (2023.02); *C09K 11/06* (2013.01); *H10K 85/658* (2023.02);
(Continued)

(58) Field of Classification Search
None
See application file for complete search history.

(56) References Cited

U.S. PATENT DOCUMENTS 11,296,292 B2 4/2022 Sharifidehsari et al.
2021/0257575 A1 8/2021 Yoon et al.
(Continued)

FOREIGN PATENT DOCUMENTS

KR 10-2021-0098361 A 8/2021
KR 10-2021-0101056 A 8/2021
KR 10-2022-0039108 A 3/2022

OTHER PUBLICATIONS

Liu, Junyuan et al., "Toward a BT.2020 green emitter through a combined multiple resonance effect and multi-lock strategy", Nat. Commun. 2022, 13, 4876; https://doi.org/10.1038/s41467-022-32607-3 (8 pages).

(Continued)

*Primary Examiner* — Anthony Ho
(74) *Attorney, Agent, or Firm* — Womble Bond Dickinson (US) LLP

(57) ABSTRACT

A light-emitting device including a first electrode, a second electrode facing the first electrode, and an interlayer between the first electrode and the second electrode and including an emission layer is provided. The emission layer includes a sensitizer and an emitter and a spectral overlap integral of an emission spectrum of the sensitizer and an absorption spectrum of the emitter is at least $1\times10^{13}$ $M^{-1}$ $cm^4$. A highest occupied molecular orbital (HOMO) energy level of the sensitizer is greater than a HOMO energy level of the emitter, and the spectral overlap integral is evaluated by Equation 1:

$$J(\lambda) = \int_0^\infty \varepsilon(\lambda)\lambda^4 F_D(\lambda)d\lambda. \quad \text{Equation 1}$$

20 Claims, 6 Drawing Sheets

(51) Int. Cl.
*H10K 85/60* (2023.01)
*H10K 50/12* (2023.01)
*H10K 101/30* (2023.01)

(52) U.S. Cl.
CPC ................ *C09K 2211/1018* (2013.01); *C09K 2211/1029* (2013.01); *C09K 2211/1033* (2013.01); *C09K 2211/185* (2013.01); *H10K 50/121* (2023.02); *H10K 2101/30* (2023.02)

(56) References Cited

U.S. PATENT DOCUMENTS

| | | | |
|---|---|---|---|
| 2021/0284906 | A1 | 9/2021 | Nam et al. |
| 2022/0093878 | A1 | 3/2022 | Kim et al. |

OTHER PUBLICATIONS

Qi, Yanyu et al., "Peripheral Decoration of Multi-Resonance Molecules as a Versatile Approach for Simultaneous Long-Wavelength and Narrowband Emission" Adv. Funct. Mater. 2021, 31, 29, 2102017 (7 pages).

Turner, Eric et al., "Cyclometalated Platinum Complexes with Luminescent Quantum Yields Approaching 100%", Inorg. Chem. 2013, 52, 13, 7344-7351; dx.doi.org/10.1021/ic302490c (8 pages).

Yang, Minlang et al., "Full-Color, Narrowband, and High-Efficiency Electroluminescence from Boron and Carbazole Embedded Polycyclic Heteroaromatics", J. Am. Chem. Soc. 2020, 142, 46, 19468-19472 (5 pages).

LIGHT-EMITTING DEVICE AND ELECTRONIC APPARATUS INCLUDING THE SAME

CROSS-REFERENCE TO RELATED APPLICATION

This application claims priority to and the benefit of Korean Patent Application No. 10-2023-0020118, filed on Feb. 15, 2023, in the Korean Intellectual Property Office, the disclosure of which is incorporated by reference herein in its entirety.

BACKGROUND

1. Field

One or more embodiments relate to a light-emitting device and an electronic apparatus including the same.

2. Description of the Related Art

Light-emitting devices may include a first electrode, a hole transport region, an emission layer, an electron transport region, and a second electrode, sequentially arranged. Holes injected from the first electrode can move toward the emission layer through the hole transport region. Electrons injected from the second electrode can move toward the emission layer through an electron injection layer in the electron transport region. Carriers such as the holes and the electrons may combine in the emission layer to produce excitons. The excitons may transition (i.e., relax) from an excited state to a ground state to thereby generate light.

SUMMARY

One or more aspects of embodiments of the present disclosure are directed toward a light-emitting device and an electronic apparatus employing the same, the light-emitting device having improved current efficiency and improved lifespan while emitting green light.

Additional aspects will be set forth in part in the description which follows and, in part, will be apparent from the description, or may be learned by practice of the presented embodiments of the disclosure.

According to one or more embodiments, a light-emitting device includes a first electrode, a second electrode facing the first electrode, and an interlayer between the first electrode and the second electrode and including an emission layer, wherein the emission layer includes a sensitizer and an emitter, wherein a spectral overlap integral of an emission spectrum of the sensitizer and an absorption spectrum of the emitter is at least (e.g., greater than) $1\times10^{13}$ $M^{-1}$ $cm^4$, a highest occupied molecular orbital (HOMO) energy level of the sensitizer is higher than a HOMO energy level of the emitter, and the spectral overlap integral is evaluated by Equation 1:

$$J(\lambda)=\int_0^\infty \varepsilon(\lambda)\lambda^4 F_D(\lambda)d\lambda \qquad \text{Equation 1}$$

wherein, in Equation 1, $J(\lambda)$ is the spectral overlap integral of the emission spectrum of the sensitizer and the absorption spectrum of the emitter, $\varepsilon(\lambda)$ is a molar extinction coefficient of the emitter calculated from the absorption spectrum of the emitter, $\lambda$ is a wavelength of the emission spectrum and the absorption spectrum, and $F_D(\lambda)$ is a normalized emission spectrum of the sensitizer.

According to one or more embodiments, an electronic apparatus includes the light-emitting device.

According to one or more embodiments, electronic equipment includes the light-emitting device, wherein the electronic equipment is at least one selected from among a flat panel display, a curved display, a computer monitor, a medical monitor, a television, a billboard, an indoor or outdoor light and/or light for signal, a head-up display, a fully or partially transparent display, a flexible display, a rollable display, a foldable display, a stretchable display, a laser printer, a telephone, a portable phone, a tablet personal computer, a phablet, a personal digital assistant (PDA), a wearable device, a laptop computer, a digital camera, a camcorder, a viewfinder, a micro display, a three-dimensional (3D) display, a virtual reality or augmented reality display, a vehicle, a video wall with multiple displays tiled together, a theater or stadium screen, a phototherapy device, a signboard, and combinations thereof.

BRIEF DESCRIPTION OF THE DRAWINGS

The accompanying drawings are included to provide a further understanding of the above and other aspects, features, and advantages of certain embodiments of the present disclosure are incorporated in and constitute a part of this specification. The drawings illustrate example embodiments and, together with the following description taken in conjunction with the accompanying drawings, serve to make the principles of the present disclosure more apparent. In the drawings.

DETAILED DESCRIPTION

Figure 1:
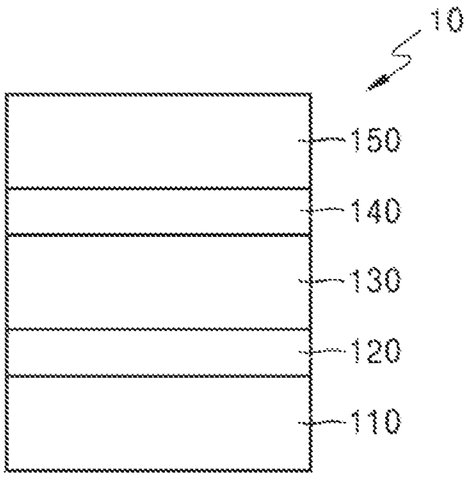
FIG. 1 is a schematic cross-sectional view of a light-emitting device according to one or more embodiments of the present disclosure.

Reference will now be made in more detail to embodiments of the present disclosure, examples of which are illustrated in the accompanying drawings, wherein like reference numerals refer to like elements throughout, and duplicative descriptions thereof may not be provided. In this regard, the present embodiments may have different forms and should not be construed as being limited to the descriptions set forth herein. Accordingly, the embodiments are merely described, by referring to the drawings, to explain aspects of the present description.

As utilized herein, the term "and/or" includes any and all combinations of one or more of the associated listed items. Expressions such as "at least one of," "one of," and "selected from," when preceding a list of elements, modify the entire list of elements and do not modify the individual elements of the list. For example, throughout the disclosure, the expression "at least one of a, b or c" indicates only a, only b, only c, both (e.g., simultaneously) a and b, both (e.g., simultaneously) a and c, both (e.g., simultaneously) b and c, all of a, b, and c, or variations thereof.

The terminology used herein is for the purpose of describing embodiments and is not intended to limit the embodiments described herein. Unless otherwise defined, all chemical names, technical and scientific terms, and terms defined in common dictionaries should be interpreted as having meanings consistent with the context of the related art, and should not be interpreted in an ideal or overly formal sense. It will be understood that, although the terms first, second, etc. may be used herein to describe various elements, these elements should not be limited by these terms. These terms are only used to distinguish one element from another element. Thus, a first element could be termed a second element without departing from the teachings of the present disclosure. Similarly, a second element could be termed a first element.

As used herein, singular forms such as "a," "an," and "the" are intended to include the plural forms as well, unless the context clearly indicates otherwise.

It will be further understood that the terms "comprise," "comprises," "comprising," "has," "have," "having," "include," "includes," and/or "including," when used in this specification, specify the presence of stated features, steps, operations, elements, and/or components, but do not preclude the presence or addition of one or more other features, steps, operations, elements, components, and/or groups thereof.

As used herein, the terms "use," "using," and "used" may be considered synonymous with the terms "utilize," "utilizing," and "utilized," respectively.

As used herein, the term "and/or" includes any, and all, combination(s) of one or more of the associated listed items.

The term "may" will be understood to refer to "one or more embodiments of the present disclosure," some of which include the described element and some of which exclude that element and/or include an alternate element. Similarly, alternative language such as "or" refers to "one or more embodiments of the present disclosure," each including a corresponding listed item.

It will be understood that when an element is referred to as being "on," "connected to," or "on" another element, it may be directly on, connected, or coupled to the other element or one or more intervening elements may also be present. When an element is referred to as being "directly on," "directly connected to," or "directly coupled to" another element, there are no intervening elements present.

Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

Unless otherwise defined, all terms (including technical and scientific terms) used herein have the same meaning as commonly understood by those of ordinary skill in the art to which the present disclosure pertains. It is also to be understood that terms defined in commonly used dictionaries should be interpreted as having meanings consistent with meanings in the context of the related art, unless expressly defined herein, and should not be interpreted in an ideal or overly formal sense.

In this context, "consisting essentially of" means that any additional components will not materially affect the chemical, physical, optical or electrical properties of the semiconductor film.

Further, in this specification, the phrase "on a plane," or "plan view," means viewing a target portion from the top, and the phrase "on a cross-section" means viewing a cross-section formed by vertically cutting a target portion from the side.

According to one or more embodiments, a light-emitting device includes:

a first electrode;

a second electrode facing the first electrode; and an interlayer between the first electrode and the second electrode and including an emission layer, wherein the emission layer includes a sensitizer and an emitter, a spectral overlap integral of an emission spectrum of the sensitizer and an absorption spectrum of the emitter is at least (e.g., greater than) $1\times10^{13}$ $M^{-1}$ $cm^4$, a highest occupied molecular orbital (HOMO) energy level of the sensitizer is higher than a HOMO energy level of the emitter, and the spectral overlap integral is evaluated by Equation 1:

$$J(\lambda) = \int_0^\infty \varepsilon(\lambda)\lambda^4 F_D(\lambda)d\lambda \qquad \text{Equation 1}$$

wherein, in Equation 1,

J(λ) is the spectral overlap integral of the emission spectrum of the sensitizer and the absorption spectrum of the emitter, ε(λ) is a molar extinction coefficient of the emitter calculated from the absorption spectrum of the emitter, Δ is a wavelength of the emission spectrum and the absorption spectrum, and $F_D(\lambda)$ is a normalized emission spectrum of the sensitizer.

The HOMO energy level refers to a highest occupied molecular orbital energy level.

In one or more embodiments, J(λ) may have a unit of $M^{-1}$ $cm^4$ (inverse molarity-centimeter to the fourth), ε(λ) may have a unit of $M^{-1}$ $cm^{-1}$ (inverse molarity-inverse centimeter), and A may have a unit of nm (nanometer).

In one or more embodiments, the emission spectrum of the sensitizer may be an emission spectrum evaluated at room temperature (e.g., a standard ambient temperature of 25° C.) for a film including the sensitizer, toluene, and PMMA, and the absorption spectrum of the emitter may be an absorption spectrum evaluated at room temperature for a 5 micromolar (μM) toluene solution of the emitter.

In one or more embodiments, the light-emitting device may further include a first compound including at least one π electron-deficient nitrogen-containing $C_1$-$C_{60}$ heterocyclic group, a second compound including a group represented by Formula 2, or any combination thereof:

Formula 2

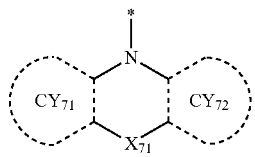

wherein, in Formula 2, ring $CY_{71}$ and ring $CY_{72}$ may each independently be a π electron-rich $C_3$-$C_{60}$ cyclic group or a pyridine group, $X_{71}$ is a single bond or a linking group including O, S, N, B, C, Si, or any combination thereof, and

* indicates a binding site to any atom included in the remaining portion other than the group represented by Formula 2 in the second compound.

For example, the light-emitting device may include i) the first compound, the sensitizer, and the emitter, ii) the second compound, the sensitizer, and the emitter, or iii) the first compound, the second compound, the sensitizer, and the emitter.

In one or more embodiments, J(λ) may be $4\times10^{14}$ $M^{-1}$ $cm^4$ or less. For example, J(λ) may be in a range of about $1.01\times10^{13}$ $M^{-1}$ $cm^4$ to about $4\times10^{14}$ $M^{-1}$ $cm^4$, about $1.01\times10^{13}$ $M^{-1}$ $cm^4$ to about $3.9\times10^{14}$ $M^{-1}$ $cm^4$, about $1.01\times10^{13}$ $M^{-1}$ $cm^4$ to about $3.8\times10^{14}$ $M^{-1}$ $cm^4$, about $1.01\times10^{13}$ $M^{-1}$ $cm^4$ to about $3.7\times10^{14}$ $M^{-1}$ $cm^4$, about $1.01\times10^{13}$ $M^{-1}$ $cm^4$ to about $3.6\times10^{14}$ $M^{-1}$ $cm^4$, about $1.01\times10^{13}$ $M^{-1}$ $cm^4$ to about $3.5\times10^{14}$ $M^{-1}$ $cm^4$ about $1.1\times10^{13}$ $M^{-1}$ $cm^4$ to $4\times10^{14}$ $M^{-1}$ $cm^4$, about $1.2\times10^{13}$ $M^{-1}$ $cm^4$ to about $4\times10^{14}$ $M^{-1}$ $cm^4$, about $1.3\times10^{13}$ $M^{-1}$ $cm^4$ to about $4\times10^{14}$ $M^{-1}$ $cm^4$, about $1.4\times10^{13}$ $M^{-1}$ $cm^4$ to about $4\times10^{14}$ $M^{-1}$ $cm^4$, about $1.5\times10^{13}$ $M^{-1}$ $cm^4$ to about $4\times10^{14}$ $M^{-1}$ $cm^4$, about $1.5\times10^{13}$ $M^{-1}$ $cm^4$ to about $3.5\times10^{14}$ $M^{-1}$ $cm^4$, or about $1.5\times10^{13}$ $M^{-1}$ $cm^4$ to about $2\times10^{14}$ $M^{-1}$ $cm^4$.

In one or more embodiments, the HOMO energy level of the sensitizer may be in a range of about −5.5 eV to about −4.7 eV. For example, the HOMO energy level of the sensitizer may be in a range of about −5.5 eV to about −4.8 eV, about −5.5 eV to about −4.9 eV, about −5.5 eV to about −5.0 eV, about −5.5 eV to about −5.1 eV, about −5.4 eV to about −4.7 eV, about −5.3 eV to about −4.7 eV, about −5.4 eV to about −4.9 eV, or about −5.3 eV to about −5.0 eV.

In one or more embodiments, the HOMO energy level of the emitter may be in a range of about −6.0 eV to about −5.0 eV. For example, the HOMO energy level of the emitter may be in a range of about −6.0 eV to about −5.1 eV, about −6.0 eV to about −5.2 eV, about −5.5 eV to about −5.0 eV, about −5.4 eV to about −5.0 eV, about −5.3 eV to about −5.0 eV, about −5.4 eV to about −5.2 eV, or about −5.3 eV to −5.2 eV.

In one or more embodiments, ε(λ) may be at least (e.g., greater) than $1.5\times10^4$ $M^{-1}$ $cm^{-1}$. For example, (λ) may be in a range of about $1.51\times10^4$ $M^{-1}$ $cm^{-1}$ to about $5.0\times10^5$ $M^{-1}$ $cm^{-1}$, about $1.51\times10^4$ $M^{-1}$ $cm^{-1}$ to about $1.0\times10^5$ $M^{-1}$ $cm^{-1}$, about $1.51\times10^4$ $M^{-1}$ $cm^{-1}$ to about $5.0\times10^4$ $M^{-1}$ $cm^{-1}$, about $1.51\times10^4$ $M^{-1}$ $cm^{-1}$ to about $4.0\times10^4$ $M^{-1}$ $cm^{-1}$, about $1.51\times10^4$ $M^{-1}$ $cm^{-1}$ to about $3.8\times10^4$ $M^{-1}$ $cm^{-1}$, about $2.0\times10^4$ $M^{-1}$ $cm^{-1}$ to about $5.0\times10^5$ $M^{-1}$ $cm^{-1}$, about $3.0\times10^4$ $M^{-1}$ $cm^{-1}$ to about $5.0\times10^5$ $M^{-1}$ $cm^{-1}$, about $3.0\times10^4$ $M^{-1}$ $cm^{-1}$ to about $4.0\times10^4$ $M^{-1}$ $cm^{-1}$, or about $3.2\times10^4$ $M^{-1}$ $cm^{-1}$ to about $3.8\times10^4$ $M^{-1}$ $cm^{-1}$.

In one or more embodiments, the sensitizer may be a transition metal-containing organometallic compound. For example, the transition metal may be platinum (Pt), palladium (Pd), copper (Cu), silver (Ag), gold (Au), rhodium (Rh), iridium (Ir), ruthenium (Ru), or osmium (Os). For example, the sensitizer may include Pt or Ir.

In one or more embodiments, the sensitizer may include a bidentate ligand, a tridentate ligand, and/or a tetradentate ligand, any of which (e.g., each) may be bonded to the transition metal.

In one or more embodiments, the sensitizer may include oxygen (O) directly bonded to the transition metal.

In one or more embodiments, the sensitizer may include at least one tert-butyl group. For example, the sensitizer may include at least two tert-butyl groups.

In one or more embodiments, the sensitizer may not include (e.g., may exclude) a ring including at least two nitrogen (N) atoms as ring-forming atoms. For example, the sensitizer may not include (e.g., may exclude (e.g., any of the)) groups selected from among an imidazole group and a benzimidazole group.

In one or more embodiments, the sensitizer may not include (e.g., may exclude) a (e.g., any) carbene group.

In one or more embodiments, the sensitizer may include at least one benzene group and at least one pyridine group. For example, the sensitizer may include at least two benzene groups and at least two pyridine groups.

In one or more embodiments, the emitter may be a compound including at least one boron (B).

In one or more embodiments, the emitter may include at least one tert-butyl group. For example, the emitter may include at least two tert-butyl groups.

In one or more embodiments, the weight of the emitter may be 1 part by weight or more with respect to 100 parts by weight of the emission layer. For example, the weight of the emitter may be 1.5 parts by weight or more with respect to 100 parts by weight of the emission layer.

In one or more embodiments, excitons transition (e.g., relax) from a lowest excitation triplet energy level of the sensitizer to a lowest excitation singlet energy level of the emitter, and the excitons transition (e.g., relax) from the lowest excitation singlet energy level of the emitter to a ground state, thereby emitting light.

In one or more embodiments, the emission layer may be to emit light having a maximum emission wavelength in a range of about 510 nm to about 550 nm. For example, the emission layer may be to emit green light.

In one or more embodiments, the sensitizer may be any one selected from among Compounds S1 to S5:
S1
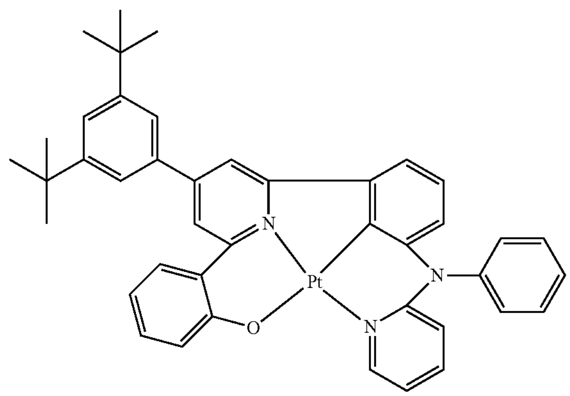
S2
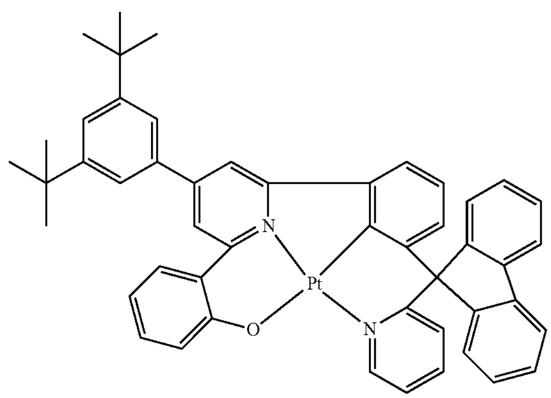
S3
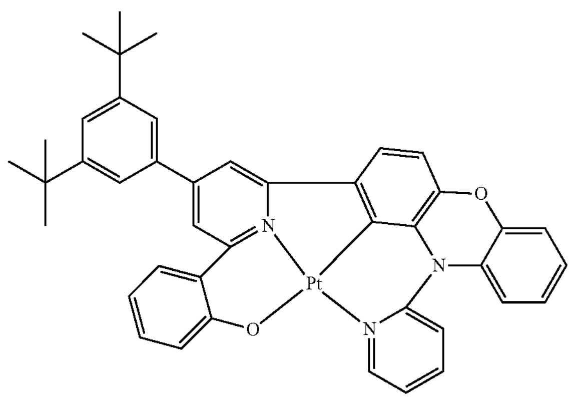
-continued
S4
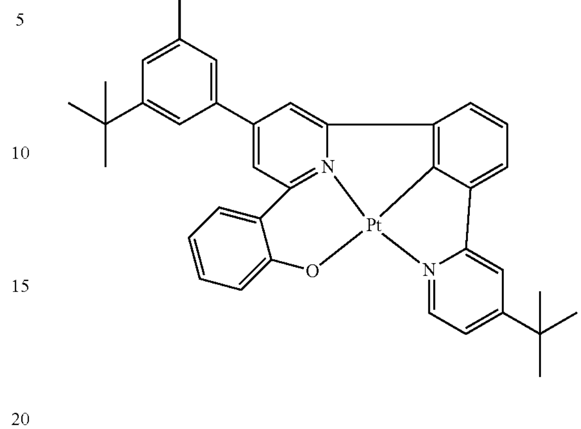
S5
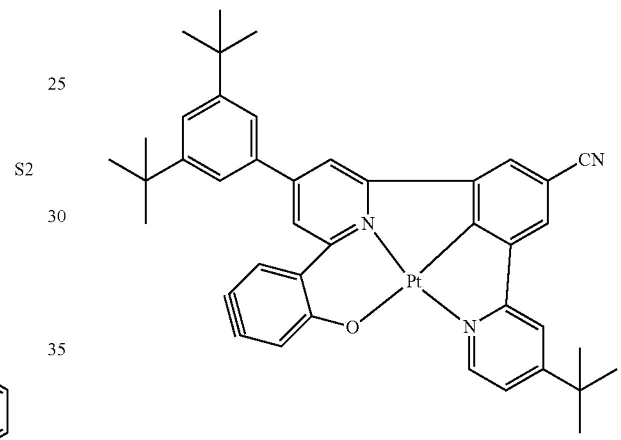
The CAS number of Compound S1 is 1469779-71-2. The CAS number of Compound S2 is 1815579-05-5. The CAS number of Compound S3 is 1607796-61-1. The CAS number of Compound S4 is 1355043-00-3.
In one or more embodiments, the emitter may be any one selected from among Compounds E1 to E3:
E1
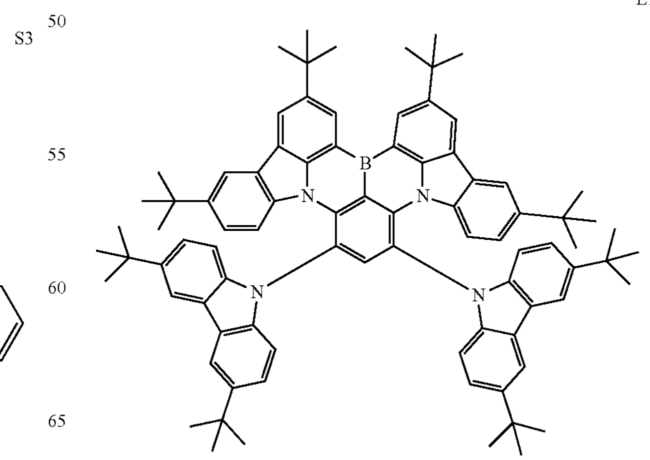

-continued

E2

E3

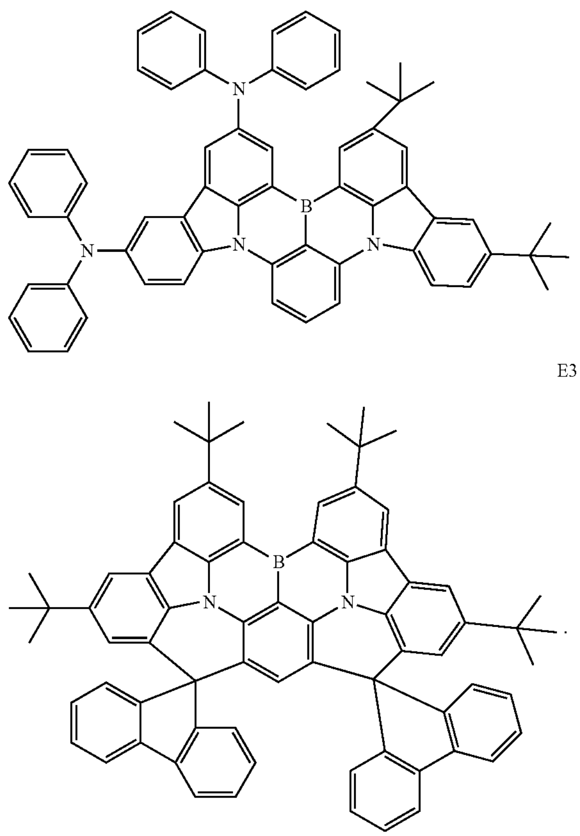

The properties of Compound E1 may be referred to "Full-Color, Narrowband, and High-Efficiency Electroluminescence from Boron and Carbazole Embedded Polycyclic Heteroaromatics," (J. Am. Chem. Soc. 2020, 142, 19468-19472), the disclosure of which is incorporated by reference herein in its entirety. The properties of Compound E2 may be referred to "Peripheral Decoration of Multi-Resonance Molecules as a Versatile Approach for Simultaneous Long-Wavelength and Narrowband Emission," (Adv. Funct. Mater., 2021, 2102017, DOI: 10.1002/adfm.202102017), the disclosure of which is incorporated by reference herein in its entirety. The properties of Compound E3 may be referred to "Toward a BT.2020 green emitter through a combined multiple resonance effect and multi-lock strategy," (Nature Communications, 2022, 13:4876), the disclosure of which is incorporated by reference herein in its entirety.

According to one or more embodiments, an electronic apparatus includes the light-emitting device as described above.

In one or more embodiments, the electronic apparatus may further include: a thin-film transistor electrically connected to the light-emitting device; and a color filter, a color conversion layer, a touch screen layer, a polarizing layer, or any combination thereof.

According to one or more embodiments, electronic equipment includes the light-emitting device and is at least one selected from among a flat panel display, a curved display, a computer monitor, a medical monitor, a television, a billboard, an indoor or outdoor light and/or light for signal, a head-up display, a fully or partially transparent display, a flexible display, a rollable display, a foldable display, a stretchable display, a laser printer, a telephone, a portable phone, a tablet personal computer, a phablet, a personal digital assistant (PDA), a wearable device, a laptop computer, a digital camera, a camcorder, a viewfinder, a micro display, a three-dimensional (3D) display, a virtual reality or augmented reality display, a vehicle, a video wall with multiple displays tiled together, a theater or stadium screen, a phototherapy device, a signboard, and combinations thereof.

Because the spectral overlap integral of the emission spectrum of the sensitizer and the absorption spectrum of the emitter is at least (e.g., greater than) about $1\times10^{13}$ $M^{-1}$ $cm^4$, energy transfer ability of the sensitizer may be enhanced or improved.

Because the HOMO energy level of the sensitizer is greater than the HOMO energy level of the emitter, hole traps may be suppressed or reduced.

Because each of the sensitizer and the emitter includes at least one tert-butyl group, Dexter energy transfer may be suppressed or reduced and Forster energy transfer may be improved.

Because the weight of the emitter is about 1 part by weight or more with respect to 100 parts by weight of the emission layer, energy transfer ability of the emitter may be enhanced or improved.

Thus, the light-emitting device including the sensitizer and the emitter may have enhanced or improved current efficiency and enhanced or improved lifespan.

Description of FIG. 1

FIG. 1 is a schematic cross-sectional view of a light-emitting device 10 according to one or more embodiments. The light-emitting device 10 may include a first electrode 110, an interlayer, and a second electrode 150. The interlayer may include a hole transport region 120, an emission layer 130, and an electron transport region 140.

Hereinafter, the structure of the light-emitting device 10 according to one or more embodiments and a method of manufacturing the light-emitting device 10 will be described with reference to FIG. 1.

First Electrode 110

In FIG. 1, a substrate may be further provided under the first electrode 110 or on the second electrode 150. The substrate may be a glass substrate or a plastic substrate. The substrate may be a flexible substrate. For example, the substrate may include a plastic with excellent or suitable heat resistance and durability, such as polyimide, polyethylene terephthalate (PET), polycarbonate, polyethylene naphthalate, polyarylate (PAR), polyetherimide, or any combination thereof.

The first electrode 110 may be formed by depositing or sputtering a material for forming the first electrode 110 on the substrate. When the first electrode 110 is an anode, a high work function material that facilitates hole injection may be utilized as a material for forming the first electrode 110. The "term "high work function material" as utilized herein refers to a substance (e.g., a metal or metal alloy) that requires a relatively high amount of energy to emit electrons from its surface.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. When the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be utilized as a material for forming the first electrode 110.

The first electrode 110 may have a single-layered structure including (e.g., consisting of) a single layer, or a multi-layered structure including a plurality of layers. For example, the first electrode 110 may have a three-layered structure of ITO/Ag/ITO.

Interlayer

An interlayer may be provided on the first electrode 110. The interlayer may include a hole transport region 120, an emission layer 130, and an electron transport region 140.

The interlayer may include one or more suitable organic materials, metal-containing compounds such as organometallic compounds, inorganic materials such as quantum dots, and/or the like.

In one or more embodiments, the interlayer may include i) at least two emitting units sequentially stacked between the first electrode 110 and the second electrode 150, and ii) a charge generation layer provided between the at least two emitting units. When the interlayer includes the emitting units and the charge generation layer as described, the light-emitting device 10 may be a tandem light-emitting device.

Hole Transport Region 120

The hole transport region 120 may have i) a single-layered structure including (e.g., consisting of) a single layer including (e.g., consisting of) a single material, ii) a single-layered structure including (e.g., consisting of) a single layer including a plurality of different materials, or iii) a multi-layered structure including a plurality of layers including a plurality of different materials.

The hole transport region 120 may include a hole injection layer, a hole transport layer, an emission auxiliary layer, an electron blocking layer, or any combination thereof.

For example, the hole transport region 120 may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron-blocking layer structure. In one or more embodiments, constituent layers of each structure are stacked sequentially from the first electrode 110.

The hole transport region may include a compound represented by Formula 201, a compound represented by Formula 202, or any combination thereof:

Formula 201

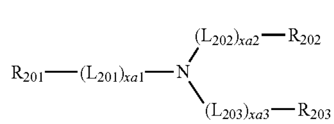

Formula 202

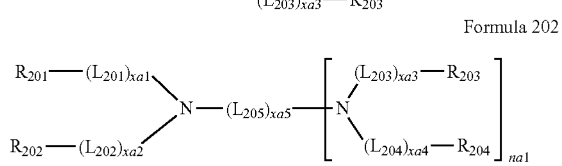

wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)—*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group, etc.) unsubstituted or substituted with at least one $R_{10a}$ (for example, Compound HT16, etc.), $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

For example, each of Formulae 201 and 202 may include at least one selected from among groups represented by Formulae CY201 to CY217:

CY201

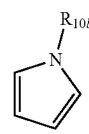

CY202

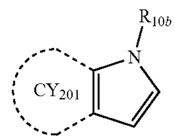

CY203

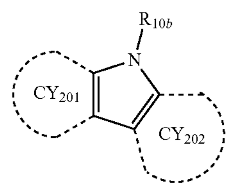

CY204

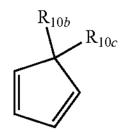

CY205

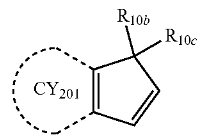

-continued

CY206

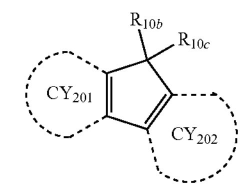

CY207

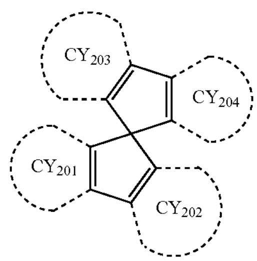

CY208

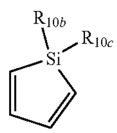

CY209

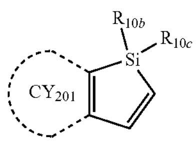

CY210

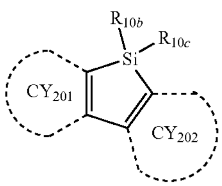

CY211

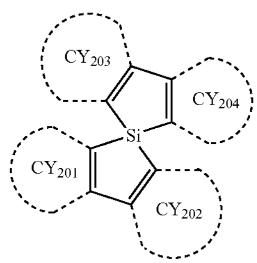

CY212

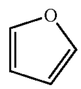

CY213

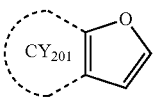

CY214

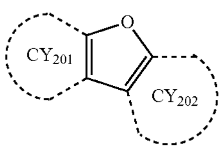

-continued

CY215

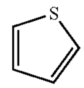

CY216

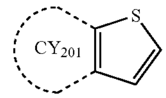

CY217

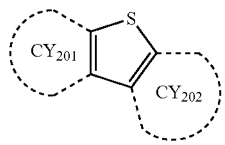

.

In Formulae CY201 to CY217, $R_{10b}$ and $R_{10c}$ may each be the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae $CY_{201}$ to $CY_{217}$ may be unsubstituted or substituted with $R_{10a}$.

In one or more embodiments, in Formulae CY201 to CY217, ring $CY_{201}$ to ring $CY_{204}$ may each independently be a benzene group, a naphthalene group, a phenanthrene group, or an anthracene group.

In one or more embodiments, each of Formulae 201 and 202 may include at least one selected from among the groups represented by Formulae CY201 to CY203.

In one or more embodiments, Formula 201 may include at least one selected from among the groups represented by Formulae CY201 to CY203 and at least one selected from among the groups represented by Formulae CY204 to CY217.

In one or more embodiments, in Formula 201, xa1 may be 1, $R_{201}$ may be one selected from among the groups represented by Formulae CY201 to CY203, xa2 may be 0, and $R_{202}$ may be one selected from among the groups represented by Formulae CY204 to CY207.

In one or more embodiments, each of Formulae 201 and 202 may not include (e.g., may exclude) the (e.g., any) groups represented by Formulae CY201 to CY203.

In one or more embodiments, each of Formulae 201 and 202 may not include (e.g., may exclude) the (e.g., any) groups represented by Formulae CY201 to CY203, and may include at least one of the groups represented by Formulae CY204 to CY217.

In one or more embodiments, each of Formulae 201 and 202 may not include (e.g., may exclude) the (e.g., any) groups represented by Formulae CY201 to CY217.

For example, the hole transport region may include one selected from among Compounds HT1 to HT46, m-MTDATA, TDATA, 2-TNATA, NPB(NPD), β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), and/or any combination thereof:

HT1
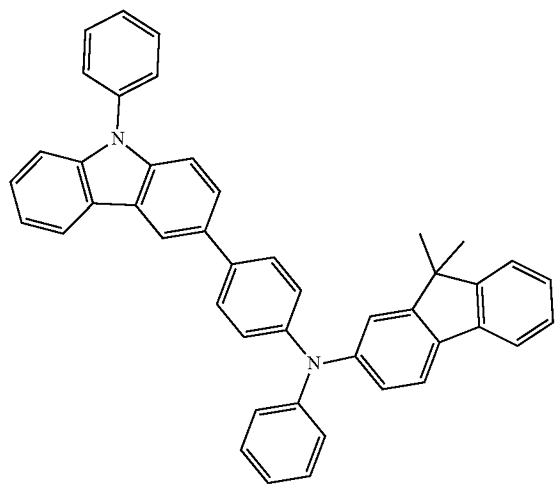
HT2
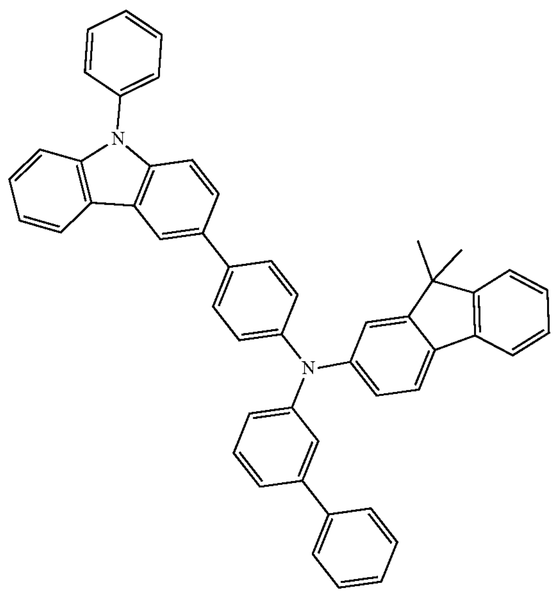
HT3
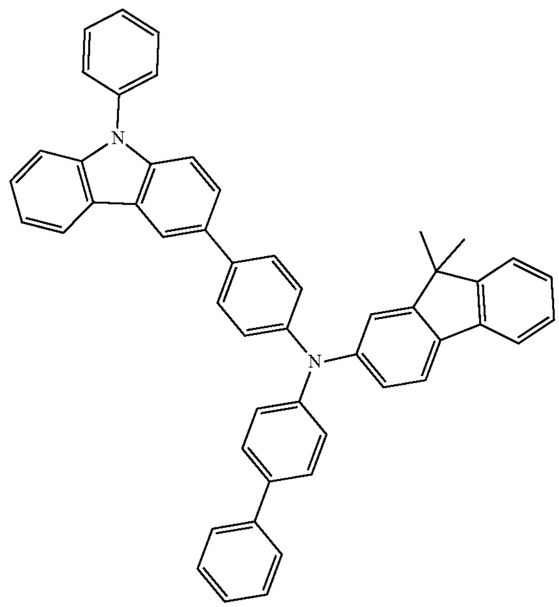
HT4
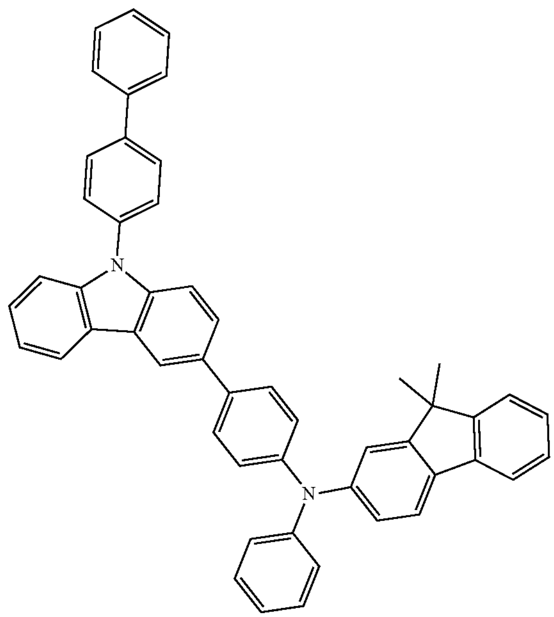

-continued
HT5
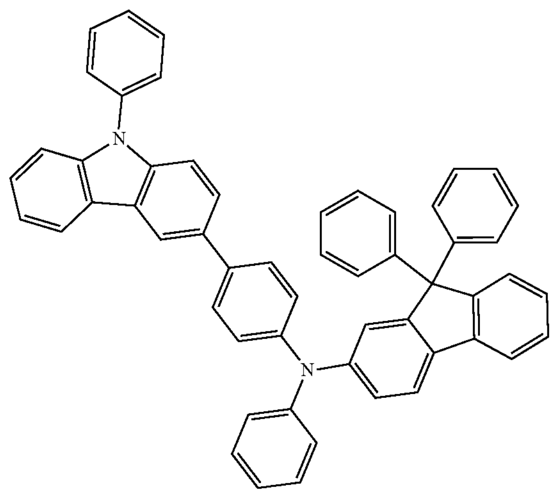
HT6
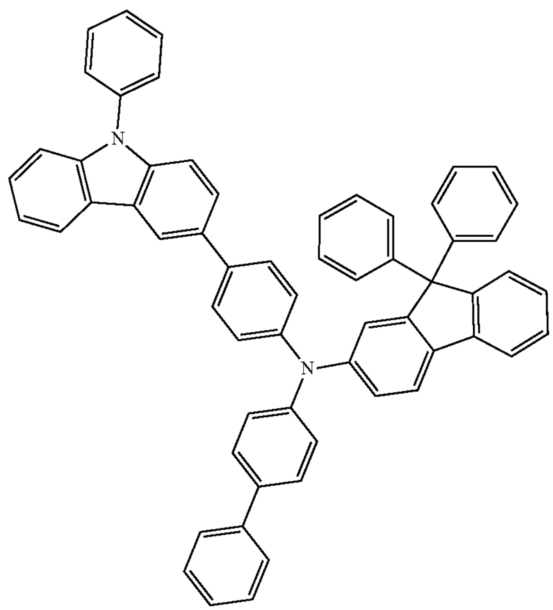
HT7
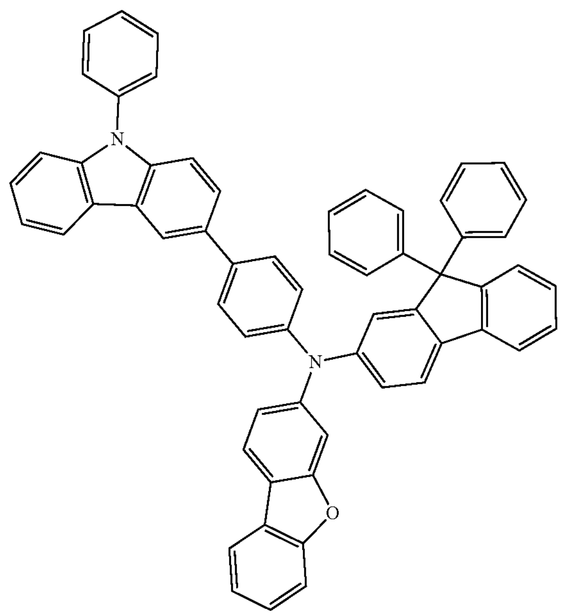
HT8
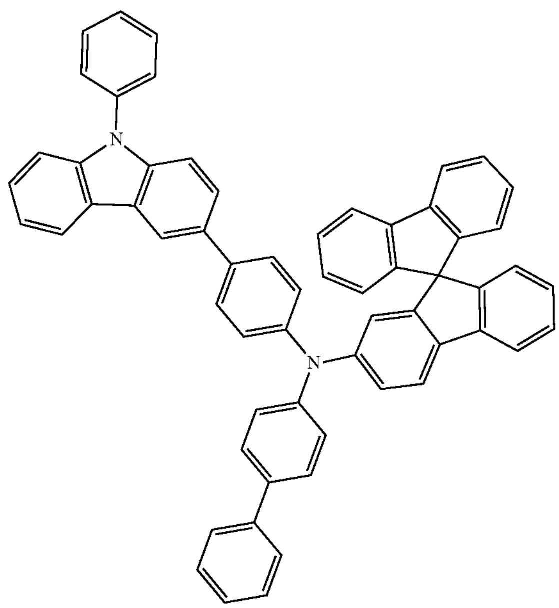

-continued
HT9
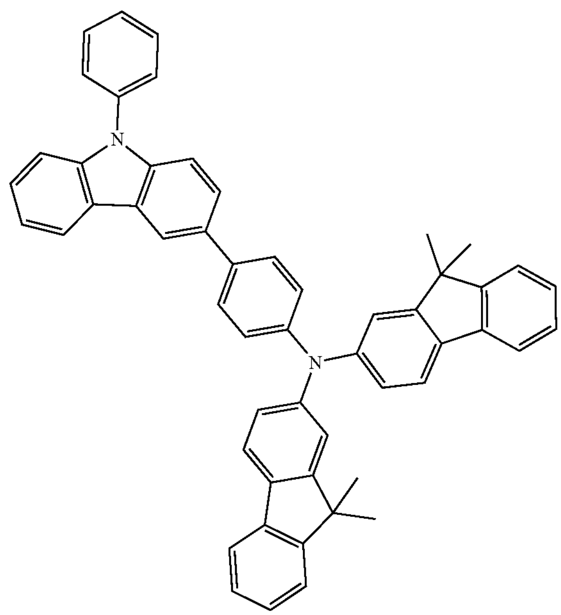
HT10
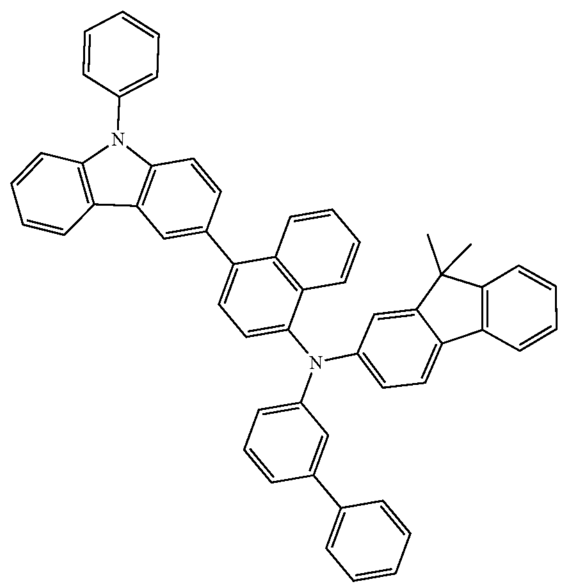
HT11
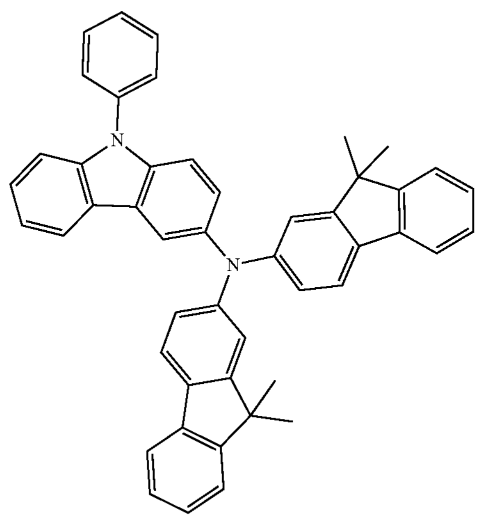
HT12
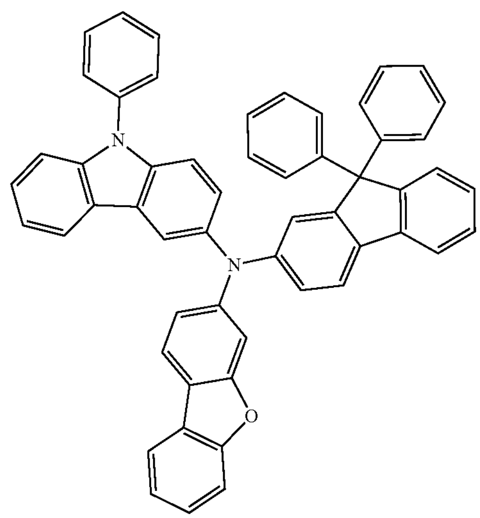

-continued
HT13
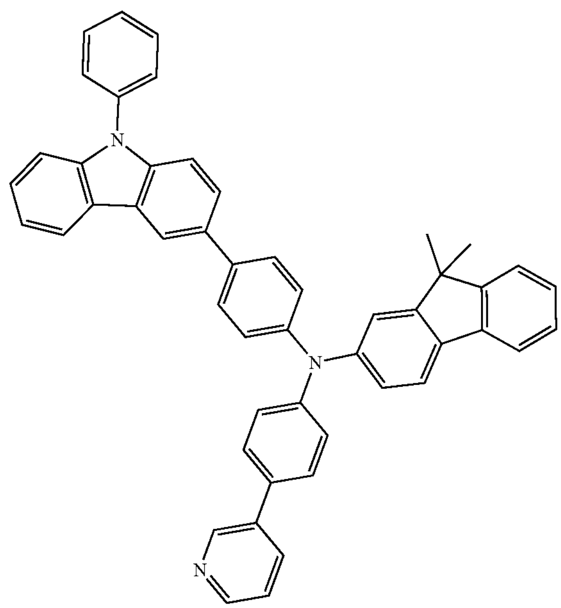
HT14
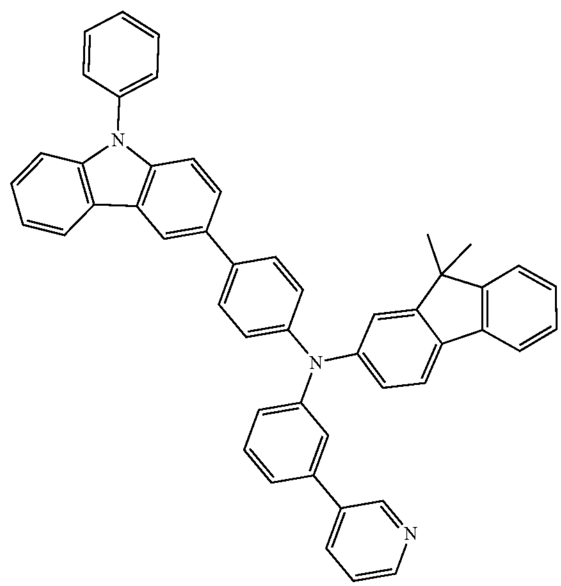
HT15
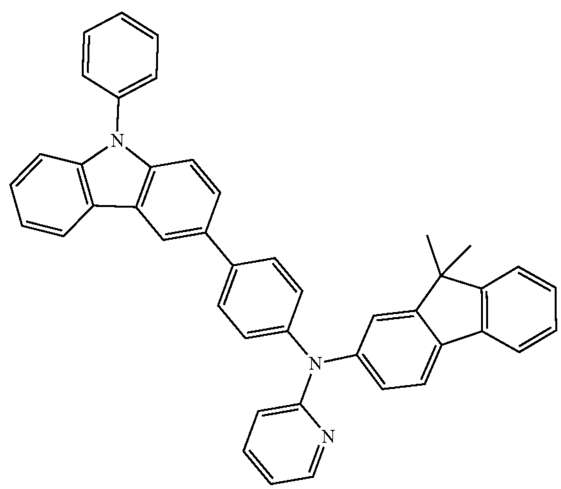
HT16
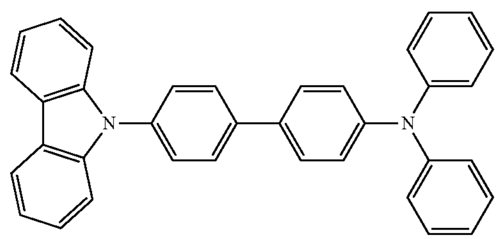
HT17
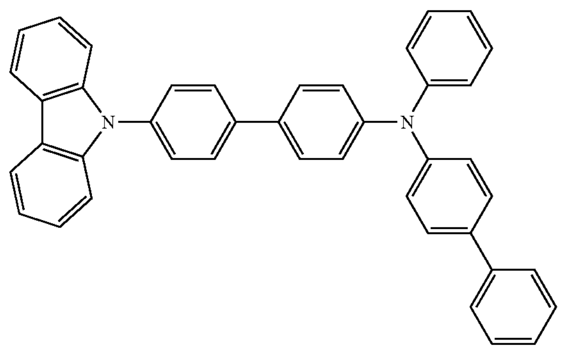
HT18
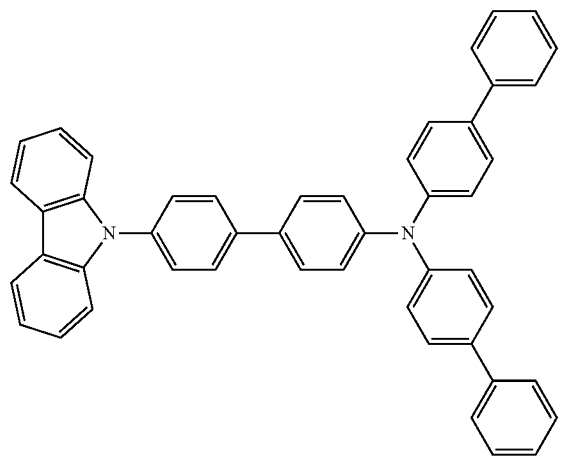

-continued
HT19
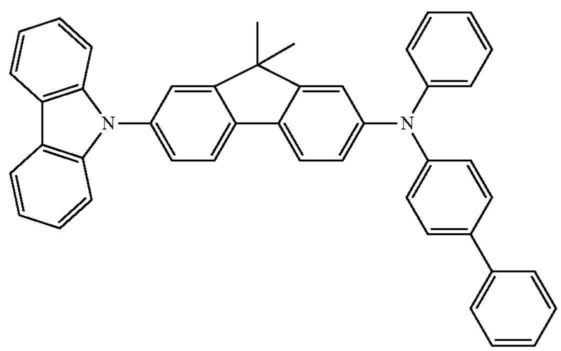
HT20
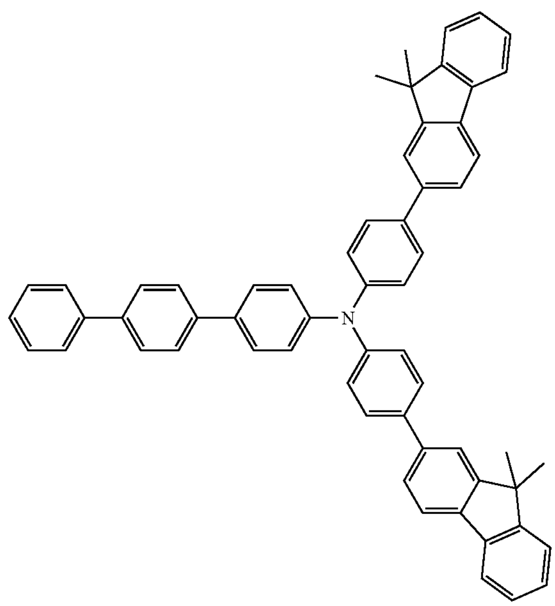
HT21
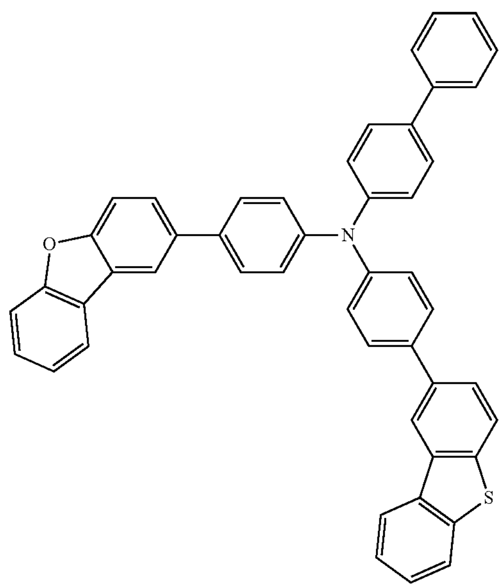
HT22
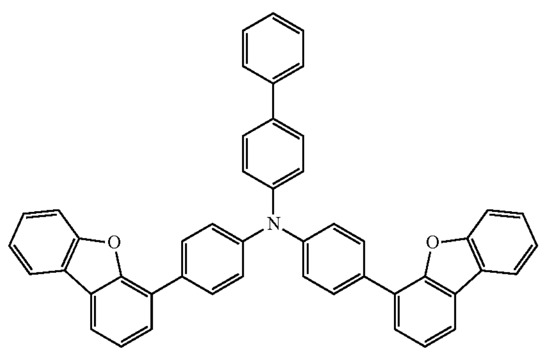

-continued
HT23
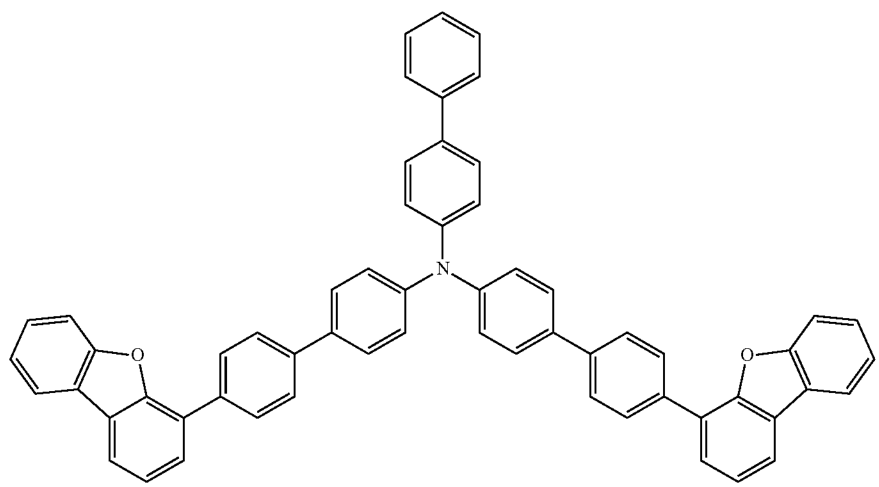
HT24
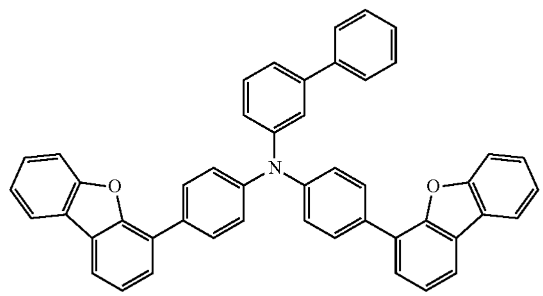
HT25
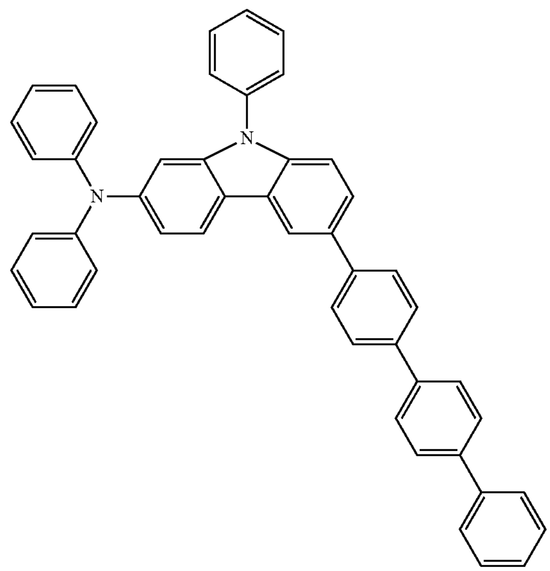
HT26
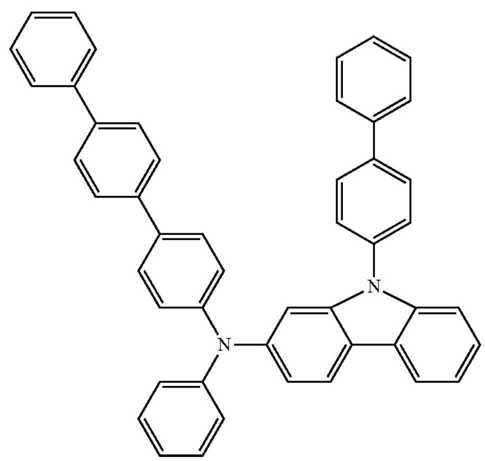
HT27
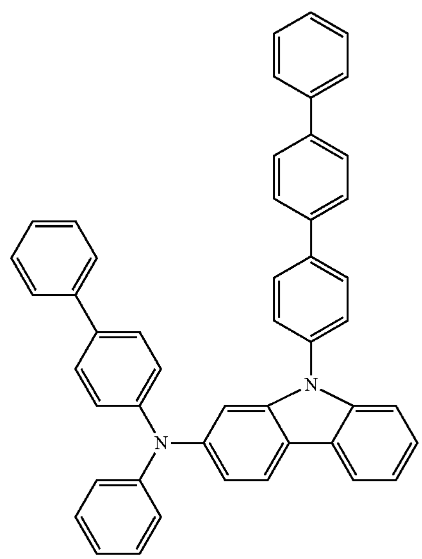

-continued
HT28
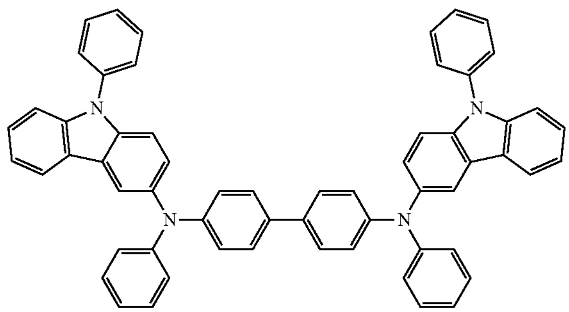
HT29
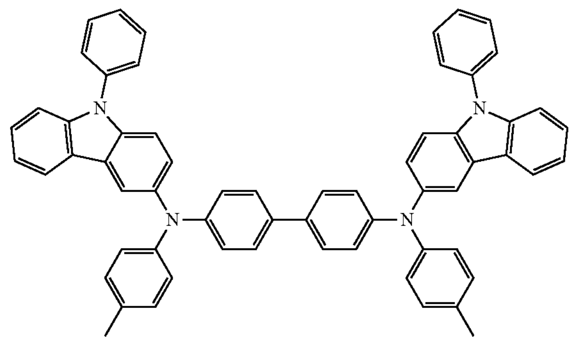
HT30
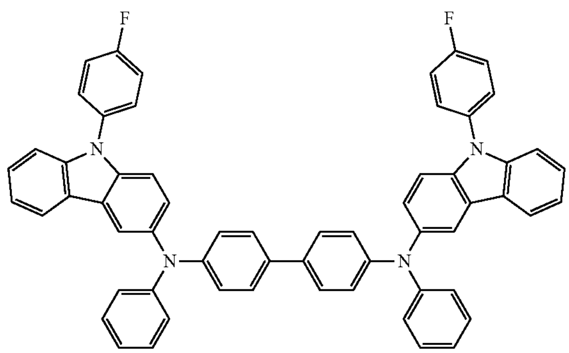
HT31
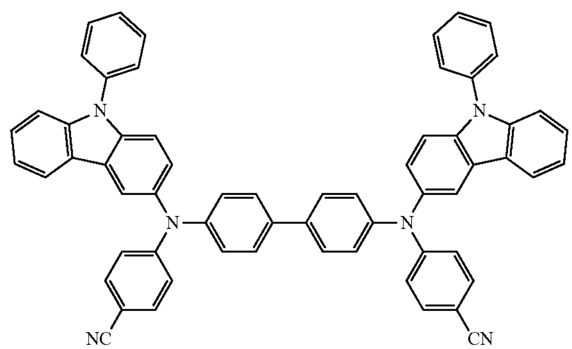
HT32
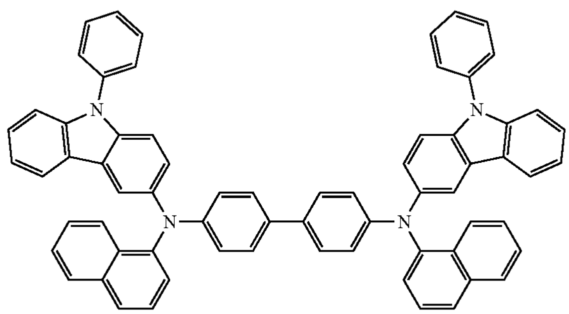
HT33
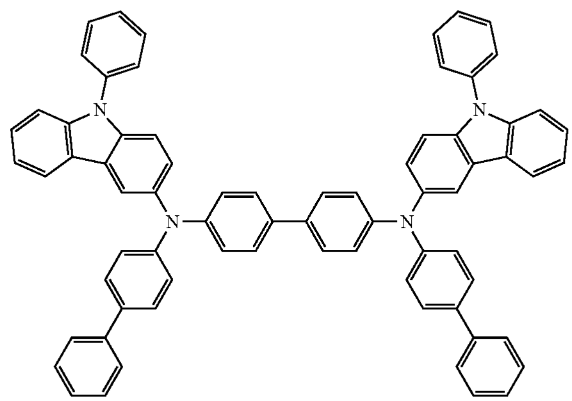
HT34
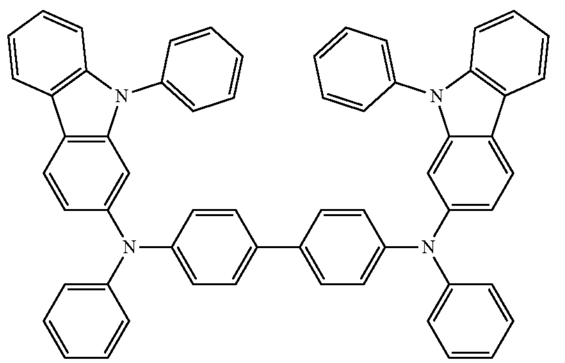
HT35
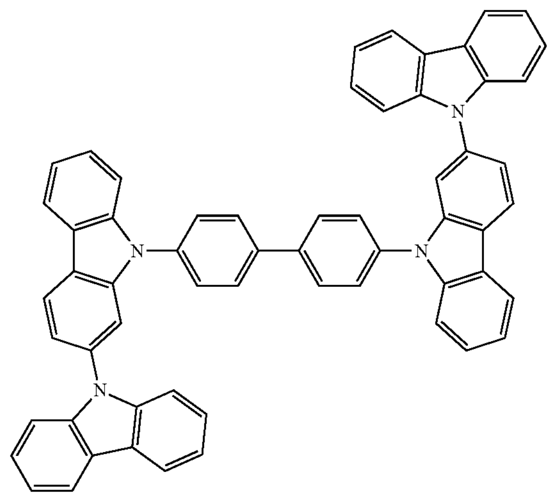

-continued
HT36
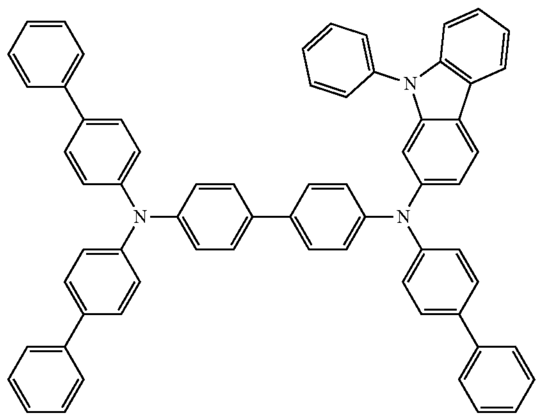
HT37
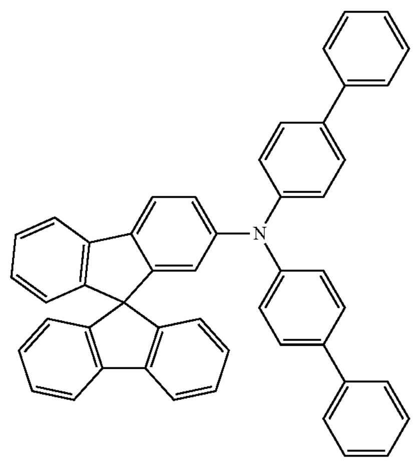
HT38
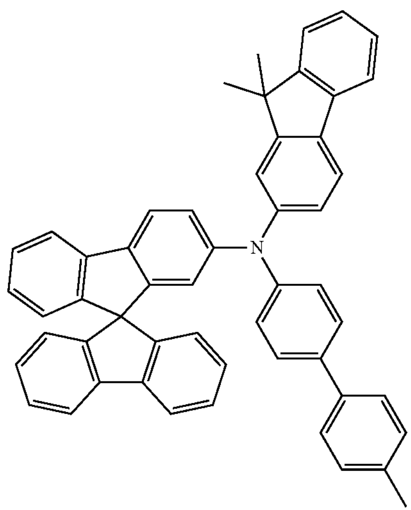
HT39
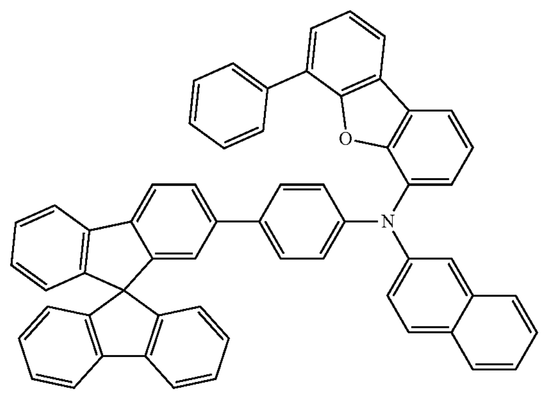
HT40
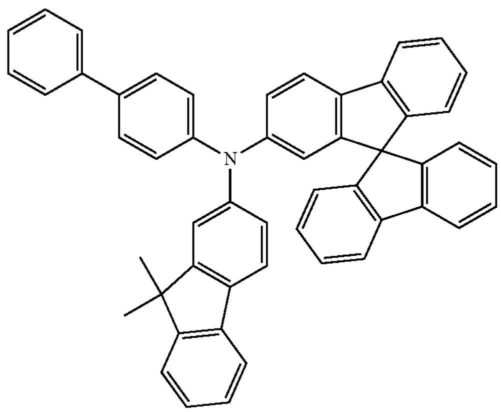
HT41
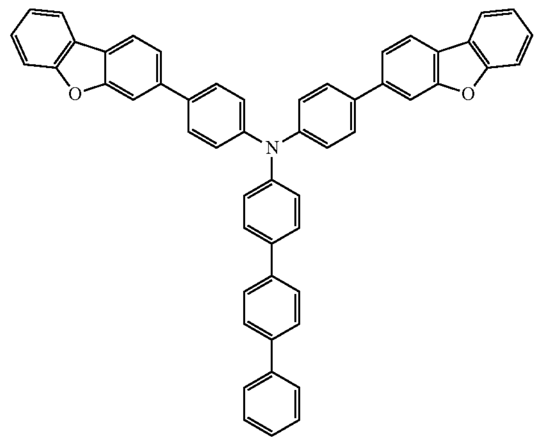

-continued
HT42
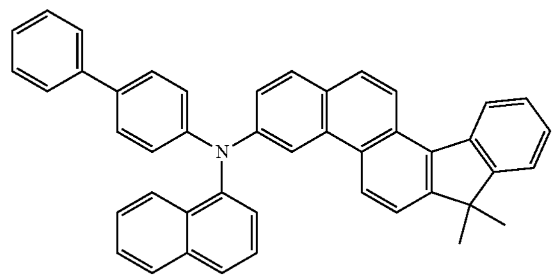
HT43
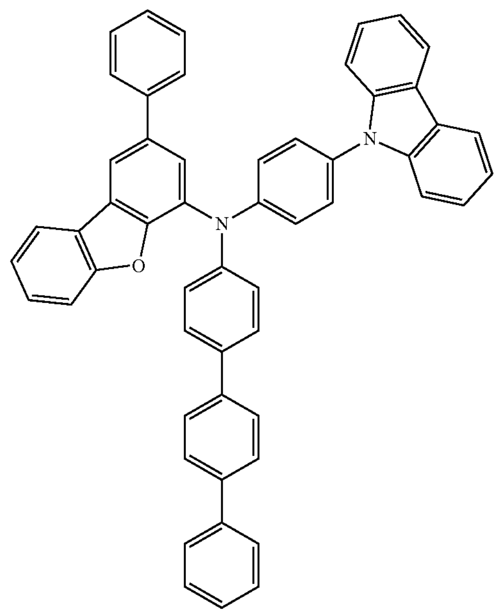
HT44
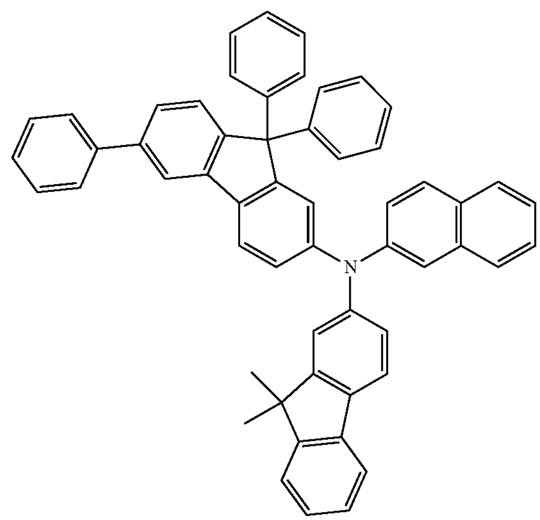
HT45
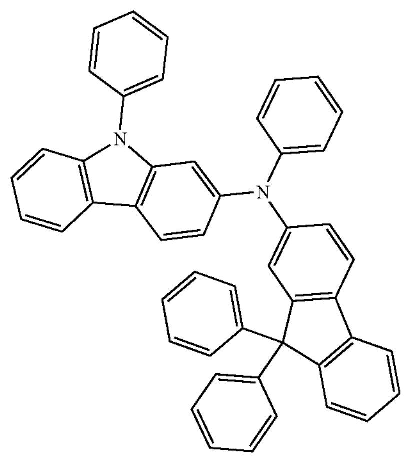

-continued
HT46
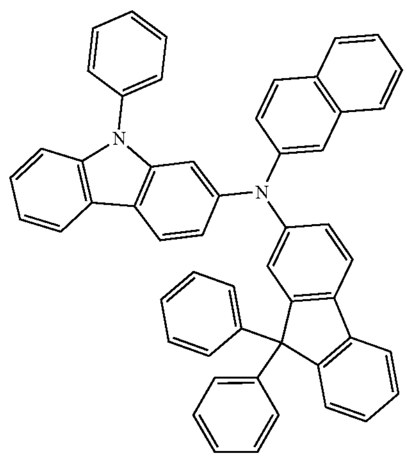
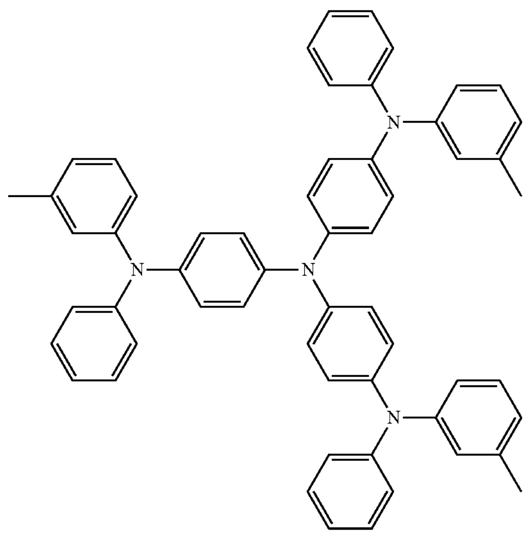
m-MTDATA
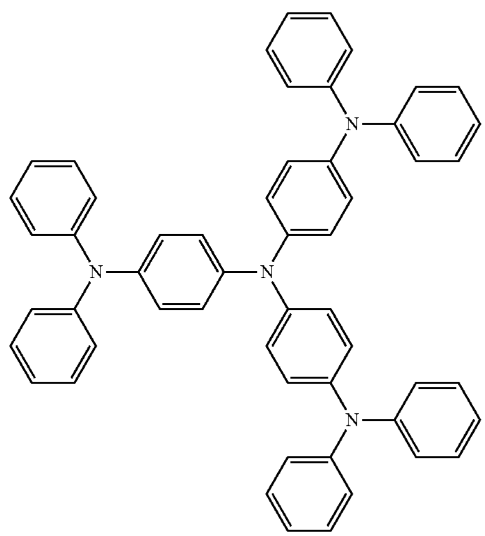
TDATA
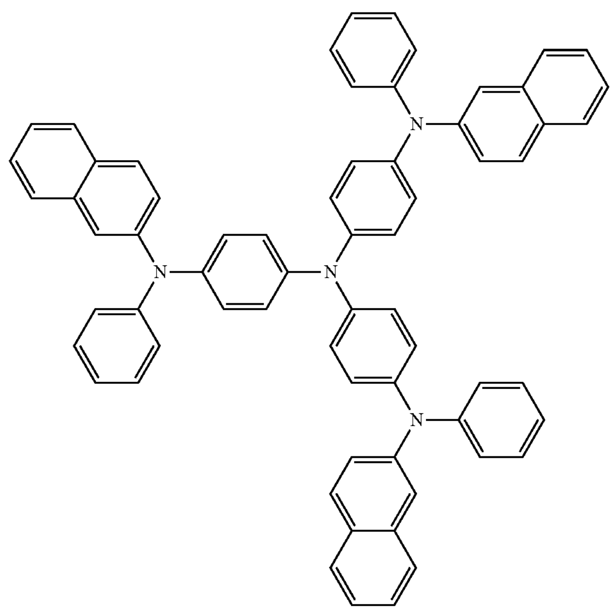
2-TNATA
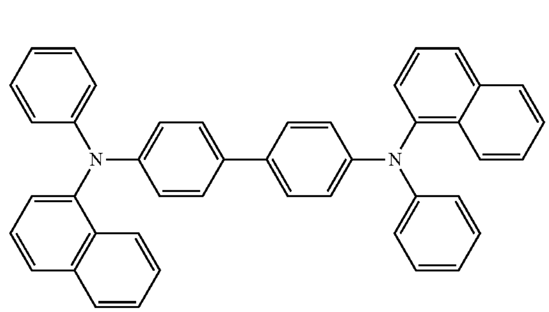
NPB
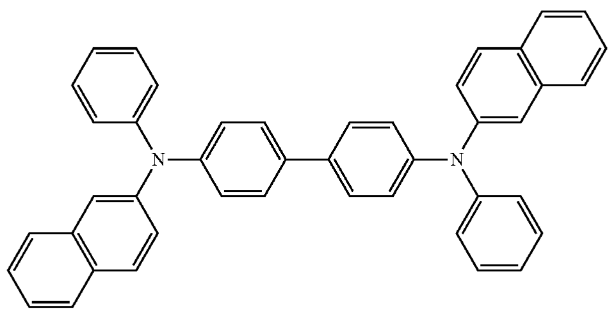
β-NPB -continued

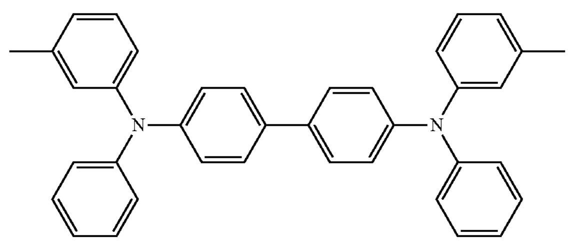

TPD

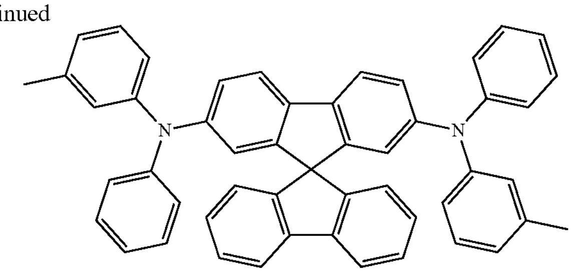

Spiro-TPD

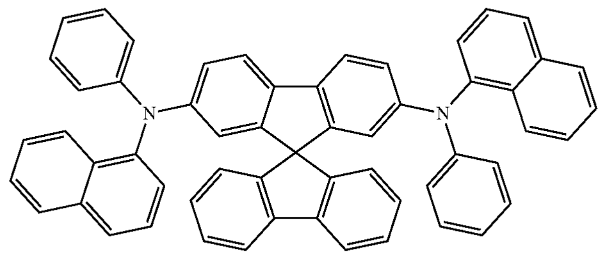

Spiro-NPB

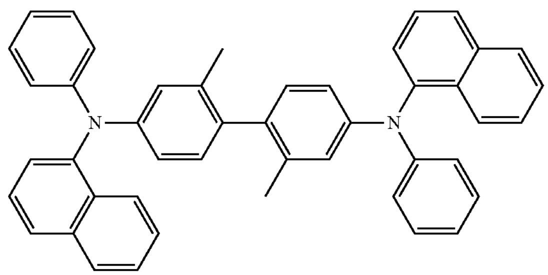

methylated-NPB

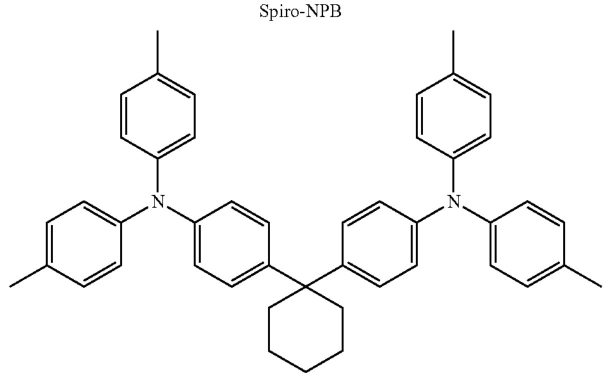

TAPC

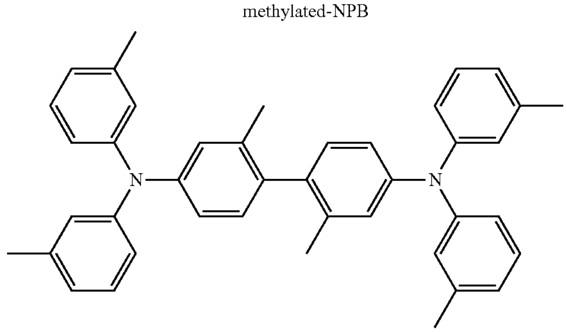

HMTPD

The thickness of the hole transport region may be in a range of about 50 angstrom (Å) to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer serves to increase light emission efficiency by compensating for an optical resonance distance according to the wavelength of light emitted from the emission layer. The electron blocking layer serves to prevent or reduce electron leakage from the emission layer to the hole transport region. Materials that may be included in the hole transport region may be included in the emission auxiliary layer and the electron blocking layer.

p-Dopant

The hole transport region 120 may include, in addition to the materials as described above, a charge generation material for the improvement of conductive properties. The charge generation material may be uniformly or non-uniformly dispersed in the hole transport region (for example, in the form of a single layer consisting of a charge generation material).

The charge generation material may be, for example, a p-dopant.

For example, the p-dopant may have a lowest unoccupied molecular orbital (LUMO) energy level of about −3.5 eV or less.

In one or more embodiments, the p-dopant may include a quinone derivative, a cyano group-containing compound, a compound including (e.g., containing) element EL1 and element EL2, or any combination thereof.

Examples of the quinone derivative may include TCNQ, F4-TCNQ, and/or the like.

Examples of the cyano group-containing compound may include HAT-CN, a compound represented by Formula 221, and/or the like:

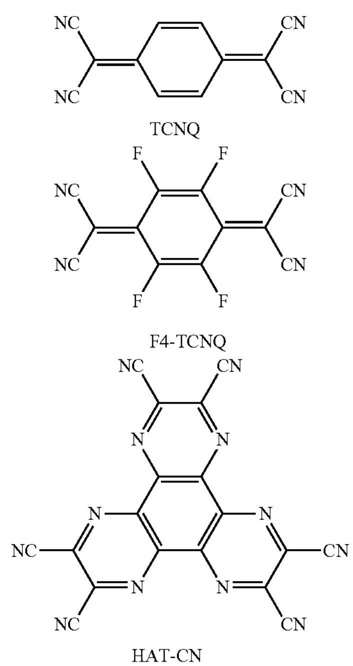

TCNQ

F4-TCNQ

HAT-CN

Formula 221

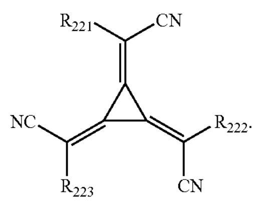

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one selected from among $R_{221}$ to $R_{223}$ may each independently be a $C_3$-$C_{60}$ carbocyclic group or a $C_1$-$C_{60}$ heterocyclic group, each of which is substituted with: a cyano group; —F; —Cl; —Br; —I; a $C_1$-$C_{20}$ alkyl group substituted with a cyano group, —F, —Cl, —Br, —I, or any combination thereof; or any combination thereof.

In the compound including (e.g., containing) element EL1 and element EL2, element EL1 may be metal, metalloid, or any combination thereof, and element EL2 may be non-metal, metalloid, or any combination thereof.

Examples of the metal may include: an alkali metal (for example, lithium (Li), sodium (Na), potassium (K), rubidium (Rb), cesium (Cs), and/or the like); an alkaline earth metal (for example, beryllium (Be), magnesium (Mg), calcium (Ca), strontium (Sr), barium (Ba), and/or the like); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), and/or the like); a post-transition metal (for example, zinc (Zn), indium (In), tin (Sn), and/or the like); a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), and/or the like); and/or the like.

Examples of the metalloid may include silicon (Si), antimony (Sb), tellurium (Te), and/or the like.

Examples of the non-metal may include oxygen (O), halogen (e.g., F, Cl, Br, I, and/or the like), and/or the like.

Examples of the compound including (e.g., containing) element EL1 and element EL2 may include a metal oxide, a metal halide (for example, metal fluoride, metal chloride, metal bromide, metal iodide, etc.), a metalloid halide (for example, metalloid fluoride, metalloid chloride, metalloid bromide, metalloid iodide, etc.), a metal telluride, or any combination thereof.

Examples of the metal oxide may include a tungsten oxide (for example, WO, $W_2O_3$, $WO_2$, $WO_3$, $W_2O_5$, etc.), a vanadium oxide (for example, VO, $V_2O_3$, $VO_2$, $V_2O_5$, etc.), a molybdenum oxide (for example, MoO, $Mo_2O_3$, $MoO_2$, $MoO_3$, $Mo_2O_5$, etc.), a rhenium oxide (for example, $ReO_3$, etc.), and/or the like.

Examples of the metal halide may include alkali metal halide, alkaline earth metal halide, transition metal halide, post-transition metal halide, lanthanide metal halide, and/or the like.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, CsI, and/or the like.

Examples of the alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, $BaI_2$, and/or the like.

Examples of the transition metal halide may include a titanium halide (for example, $TiF_4$, $TiCl_4$, $TiBr_4$, $TiI_4$, etc.), a zirconium halide (for example, $ZrF_4$, $ZrCl_4$, $ZrBr_4$, $ZrI_4$, etc.), a hafnium halide (for example, $HfF_4$, $HfCl_4$, $HfBr_4$, $HfI_4$, etc.), a vanadium halide (for example, $VF_3$, $VCl_3$, $VBr_3$, $VI_3$, etc.), a niobium halide (for example, $NbF_3$, $NbCl_3$, $NbBr_3$, $NbI_3$, etc.), a tantalum halide (for example, $TaF_3$, $TaCl_3$, $TaBr_3$, $TaI_3$, etc.), a chromium halide (for example, $CrF_3$, $CrCl_3$, $CrBr_3$, $CrI_3$, etc.), a molybdenum halide (for example, $MoF_3$, $MoCl_3$, $MoBr_3$, $MoI_3$, etc.), a tungsten halide (for example, $WF_3$, $WCl_3$, $WBr_3$, $WI_3$, etc.), a manganese halide (for example, $MnF_2$, $MnCl_2$, $MnBr_2$, $MnI_2$, etc.), a technetium halide (for example, $TcF_2$, $TcCl_2$, $TcBr_2$, $TcI_2$, etc.), a rhenium halide (for example, $ReF_2$, $ReCl_2$, $ReBr_2$, $ReI_2$, etc.), an iron halide (for example, $FeF_2$, $FeCl_2$, $FeBr_2$, $FeI_2$, etc.), a ruthenium halide (for example, $RuF_2$, $RuCl_2$, $RuBr_2$, $RuI_2$, etc.), an osmium halide (for example, $OsF_2$, $OsCl_2$, $OsBr_2$, $OsI_2$, etc.), a cobalt halide (for example, $CoF_2$, $CoCl_2$, $CoBr_2$, $CoI_2$, etc.), a rhodium halide (for example, $RhF_2$, $RhCl_2$, $RhBr_2$, $RhI_2$, etc.), an iridium halide (for example, $IrF_2$, $IrCl_2$, $IrBr_2$, $IrI_2$, etc.), a nickel halide (for example, $NiF_2$, $NiCl_2$, $NiBr_2$, $NiI_2$, etc.), a palladium halide (for example, $PdF_2$, $PdCl_2$, $PdBr_2$, $PdI_2$, etc.), a platinum halide (for example, $PtF_2$, $PtCl_2$, $PtBr_2$, $PtI_2$, etc.), a copper halide (for example, CuF, CuCl, CuBr, CuI, etc.), a silver halide (for example, AgF, AgCI, AgBr, AgI, etc.), a gold halide (for example, AuF, AuCl, AuBr, AuI, etc.), and/or the like.

Examples of the post-transition metal halide may include a zinc halide (for example, $ZnF_2$, $ZnCl_2$, $ZnBr_2$, $ZnI_2$, etc.), an indium halide (for example, $InI_3$, etc.), a tin halide (for example, $SnI_2$, etc.), and/or the like.

Examples of the lanthanide metal halide may include YbF, $YbF_2$, $YbF_3$, $SmF_3$, YbCl, $YbCl_2$, $YbCl_3$ $SmCl_3$, YbBr, $YbBr_2$, $YbBr_3$, $SmBr_3$, YbI, $YbI_2$, $YbI_3$, $SmI_3$, and/or the like.

Examples of the metalloid halide may include an antimony halide (for example, $SbCl_5$, etc.) and/or the like.

Examples of the metal telluride may include an alkali metal telluride (for example, $Li_2Te$, $Na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, CuzTe, CuTe, $Ag_2Te$, AgTe, $Au_2Te$, etc.), a post-transition metal telluride (for example, ZnTe, etc.), and a Lanthanide Metal Telluride (for Example, LaTe, CeTe, PrTe, NdTe, PmTe, EuTe, GdTe, TbTe, DyTe, HoTe, ErTe, TmTe, YbTe, LuTe, Etc.).

Emission Layer 130

When the light-emitting device 10 is a full-color light-emitting device, the emission layer may be patterned into a red emission layer, a green emission layer, and/or a blue emission layer, according to a sub-pixel. In one or more embodiments, the emission layer may have a stacked structure of two or more layers of a red emission layer, a green emission layer, and a blue emission layer, in which the two or more layers contact each other or are separated from each other, to emit white light. In one or more embodiments, the emission layer may include two or more materials of a red light-emitting material, a green light-emitting material, and a blue light-emitting material, in which the two or more materials are mixed with each other in a single layer, to emit white light.

The emission layer may include a host and a dopant. The dopant may include a phosphorescent dopant, a fluorescent dopant, or any combination thereof.

The amount of the dopant in the emission layer may be in a range of about 0.01 parts by weight to about 15 parts by weight with respect to 100 parts by weight of the host.

In one or more embodiments, the emission layer may include a quantum dot.

In one or more embodiments, the emission layer may include a delayed fluorescence material. The delayed fluorescence material may act as a host or a dopant in the emission layer.

The thickness of the emission layer may be in a range of about 100 Å to about 1,000 Å, for example, about 200 Å to about 600 Å. When the thickness of the emission layer is within these ranges, excellent or suitable luminescence characteristics may be obtained without a substantial increase in driving voltage.

Host

In one or more embodiments, the host may include a compound represented by Formula 301:

Formula 301

$$[Ar_{301}]_{xb11}—[(L_{301})_{xb1}—R_{301}]_{xb21}$$

wherein, in Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(═O)($Q_{301}$), —S(═O)$_2$($Q_{301}$), or —P(═O)($Q_{301}$)($Q_{302}$), xb21 may be an integer from 1 to 5, and $Q_{301}$ to $Q_{303}$ may each be the same as described in connection with $Q_1$.

For example, when xb11 in Formula 301 is 2 or more, two or more of $Ar_{301}$ may be linked to each other via a single bond.

In one or more embodiments, the host may include a compound represented by Formula 301-1, a compound represented by Formula 301-2, or any combination thereof:

Formula 301-1

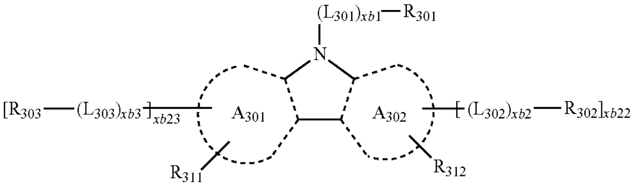

Formula 301-2

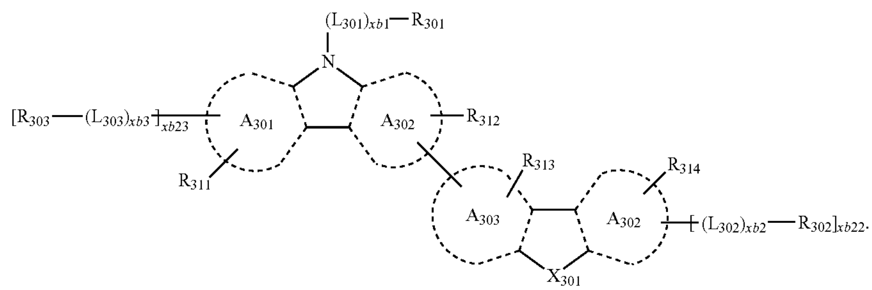

In Formula 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ may each be the same as described herein, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may each be the same as described in connection with $R_{301}$.

In one or more embodiments, the host may include an alkali earth metal complex, a post-transition metal complex, or any combination thereof. For example, the host may include a Be complex (for example, Compound H55), an Mg complex, a Zn complex, or any combination thereof.

In one or more embodiments, the host may include: one selected from among Compounds H1 to H128; 9,10-di(2-naphthyl)anthracene (ADN); 2-methyl-9,10-bis(naphthalen-2-yl)anthracene (MADN); 9,10-di-(2-naphthyl)-2-t-butyl-anthracene (TBADN); 4,4'-bis(N-carbazolyl)-1,1'-biphenyl (CBP); 1,3-di(carbazol-9-yl)benzene (mCP); 1,3,5-tri(carbazol-9-yl)benzene (TCP); and/or any combination thereof:

H1

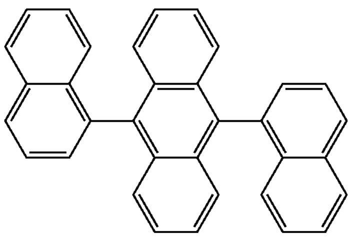

H2

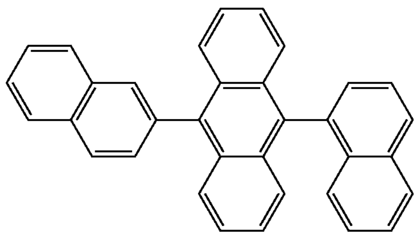

H3

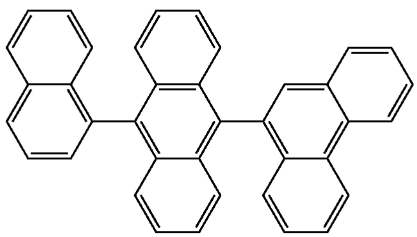

-continued

H4

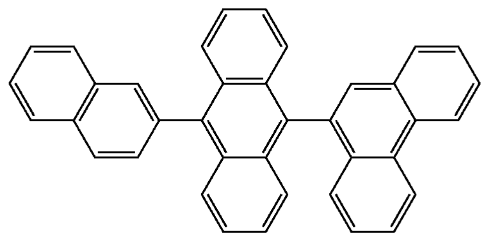

H5

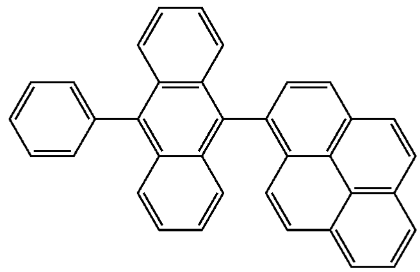

H6

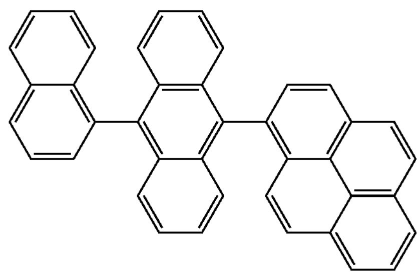

H7

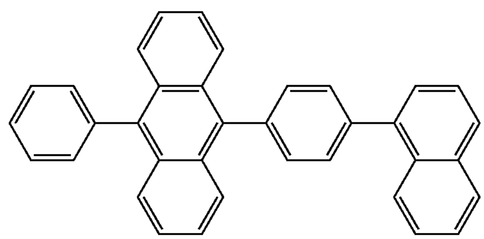

H8

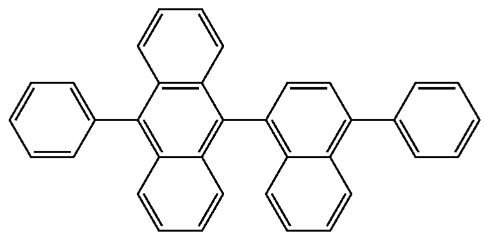

H9

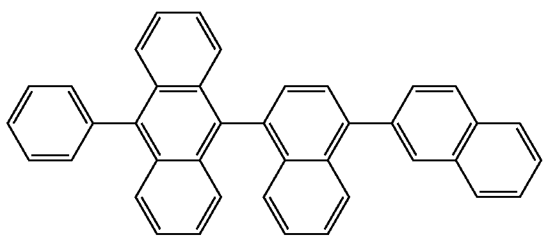

-continued
H10
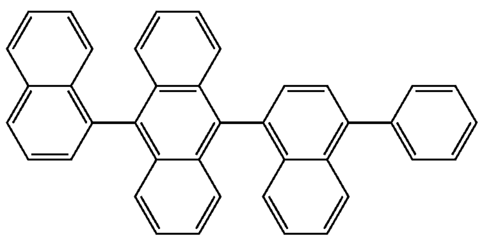
H11
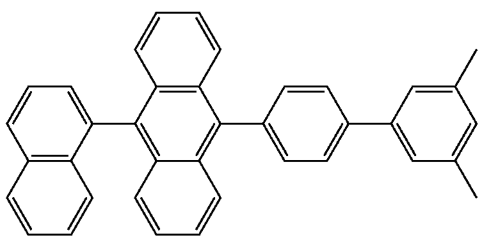
H12
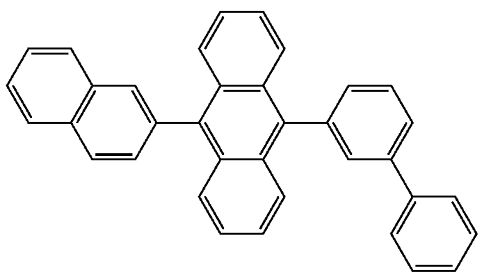
H13
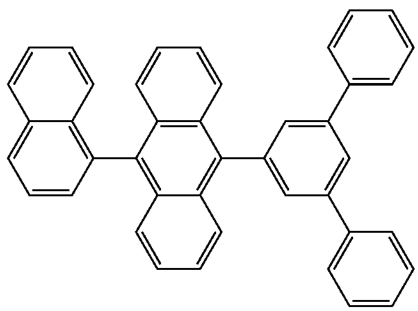
H14
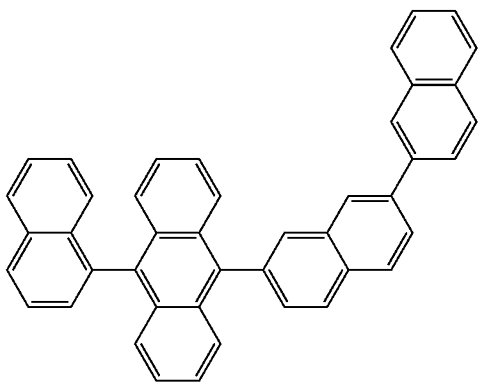
-continued
H15
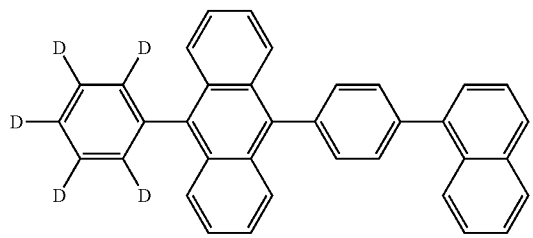
H16
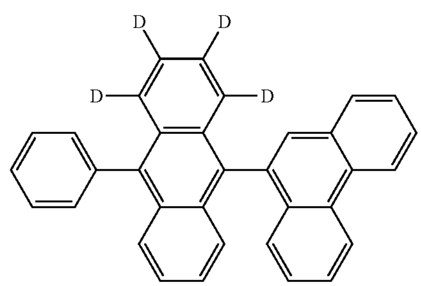
H17
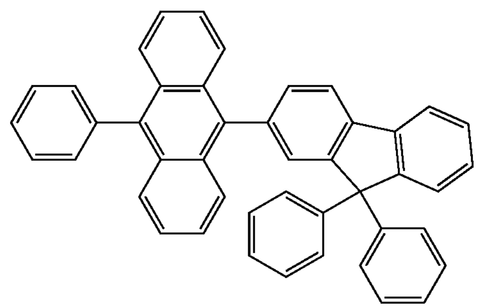
H18
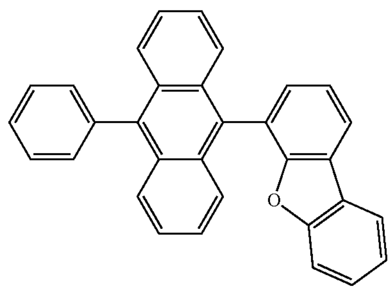
H19
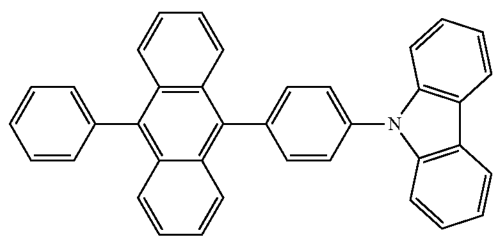

-continued
H20
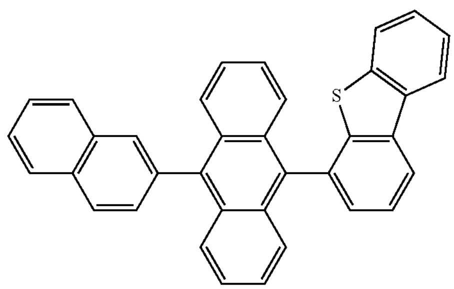
H21
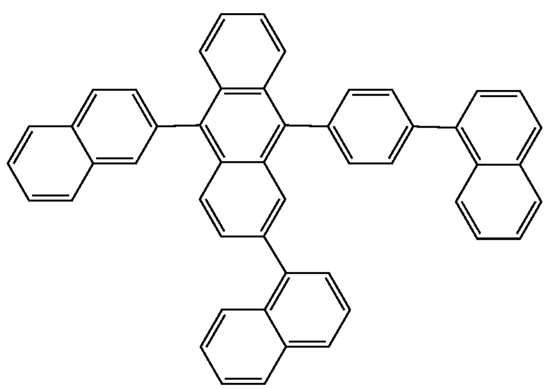
H22
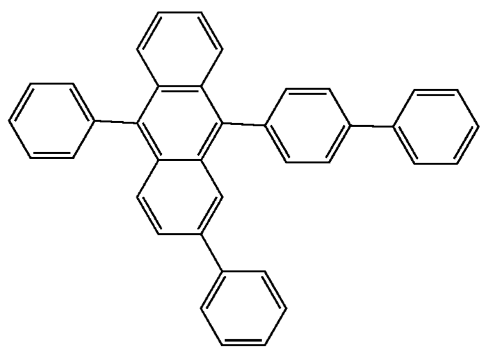
H23
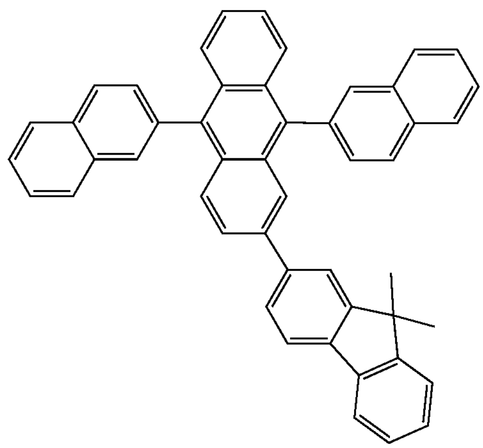
-continued
H24
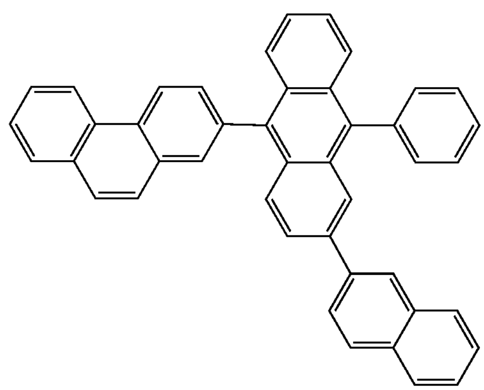
H25
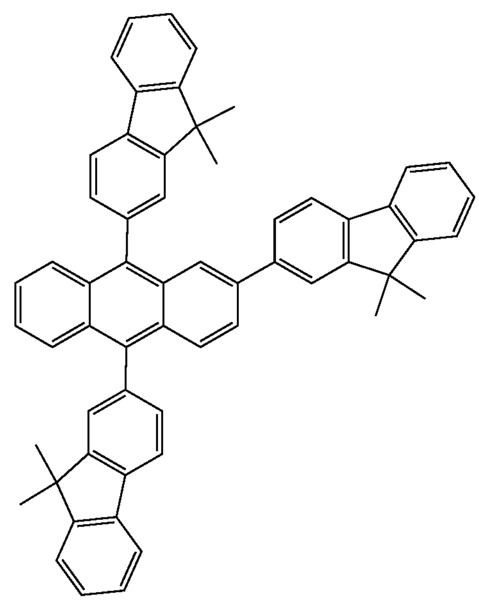
H26
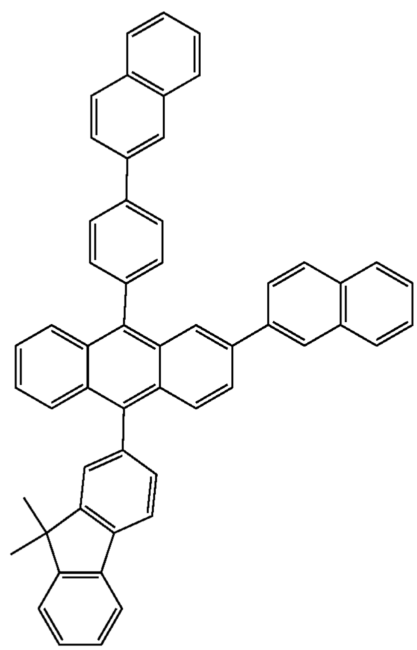

-continued
H27
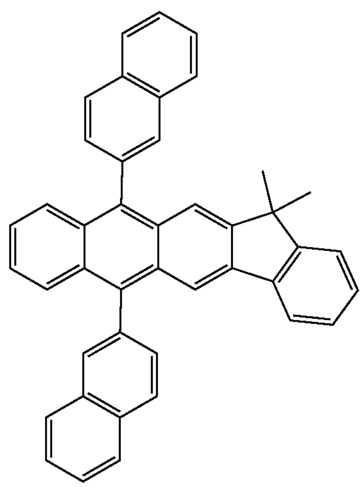
H28
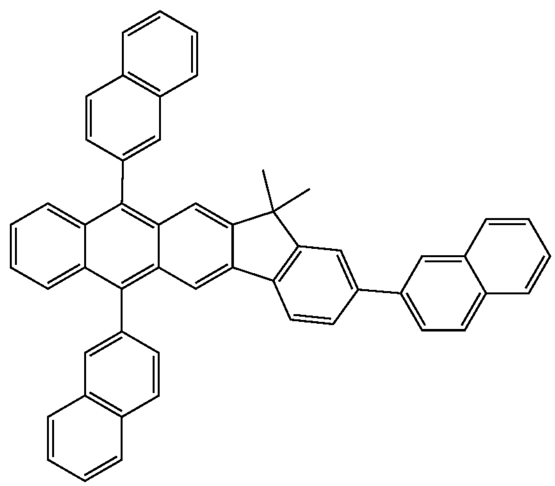
H29
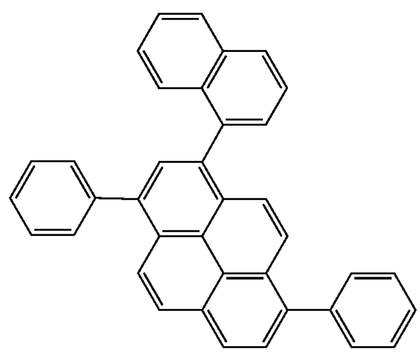
-continued
H30
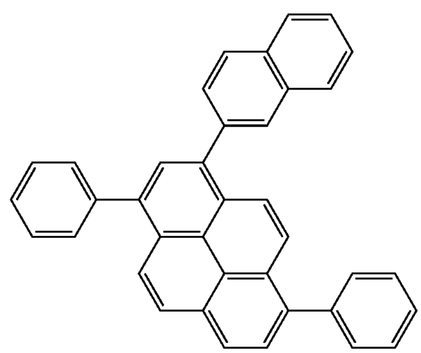
H31
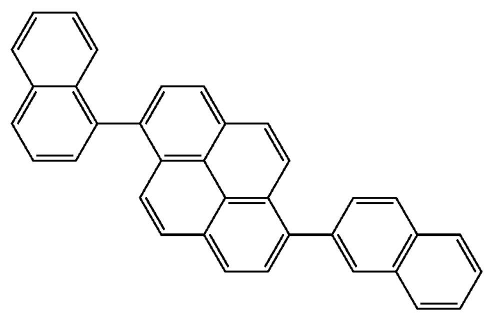
H32
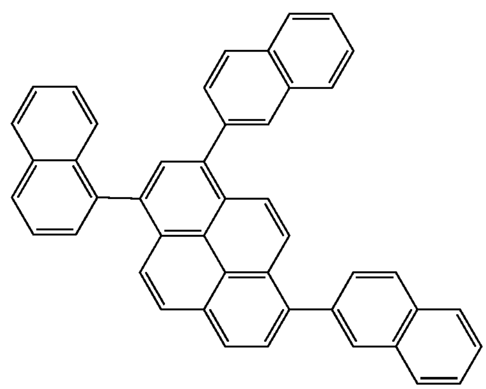
H33
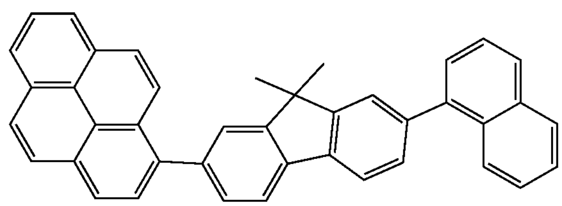
H34
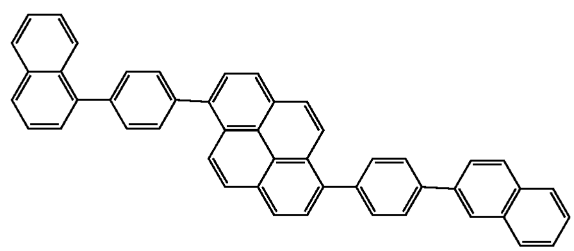

-continued
H35
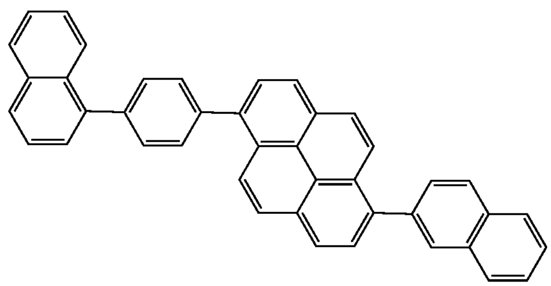
H36
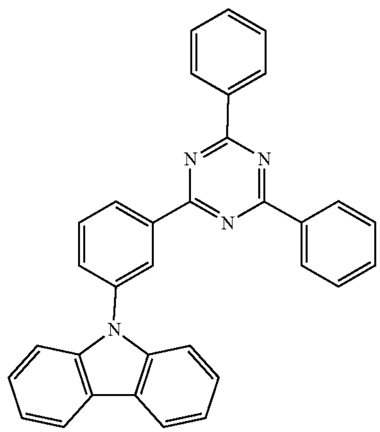
H37
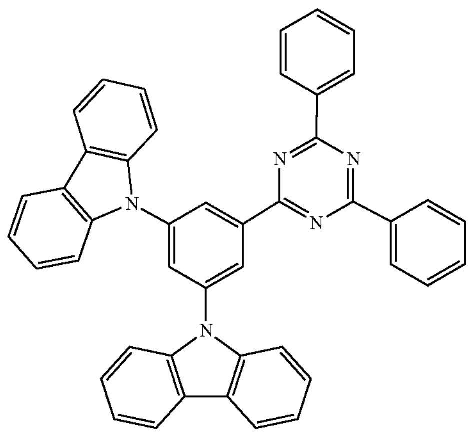
H38
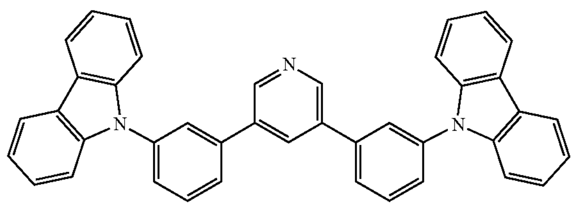
-continued
H39
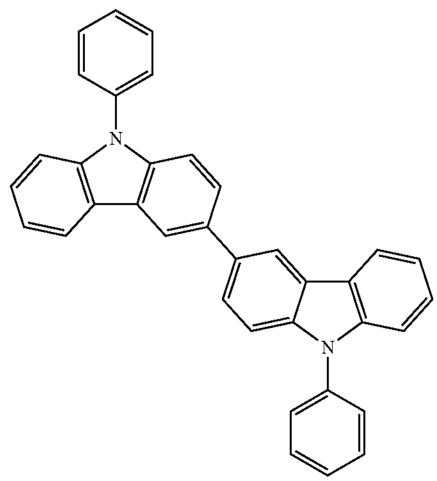
H40
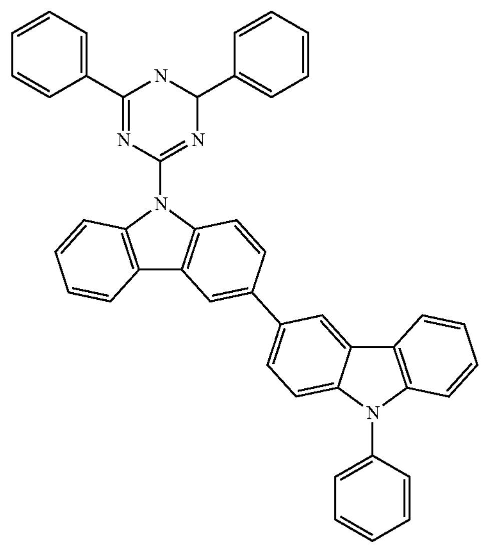
H41
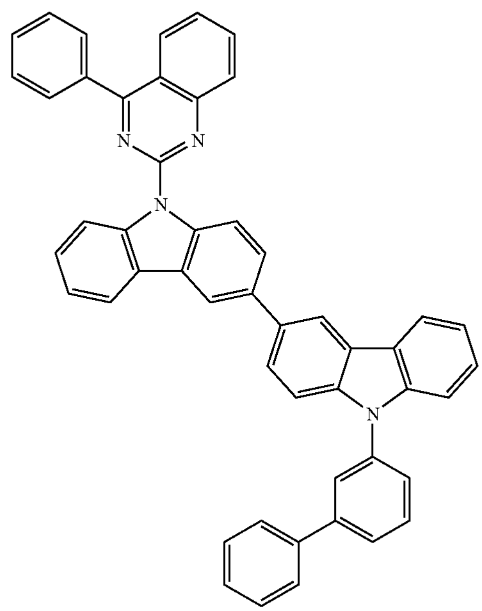

-continued
H42
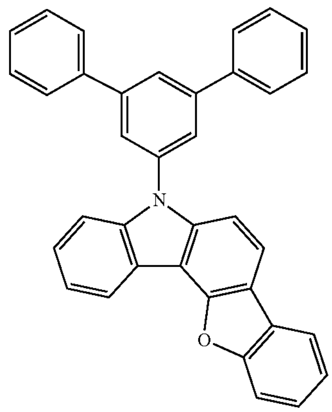
H43
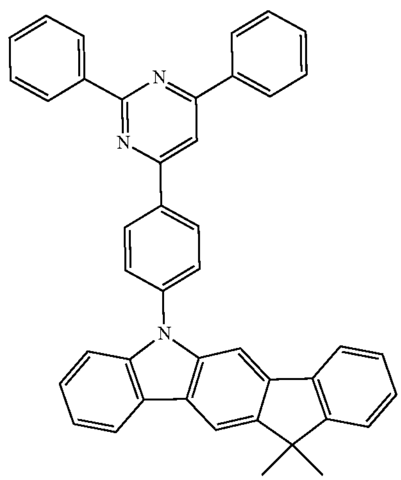
H44
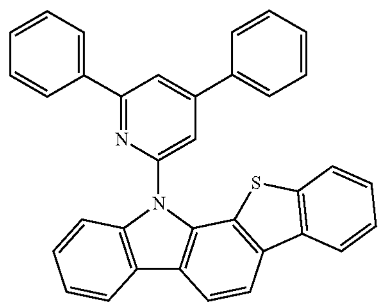
H45
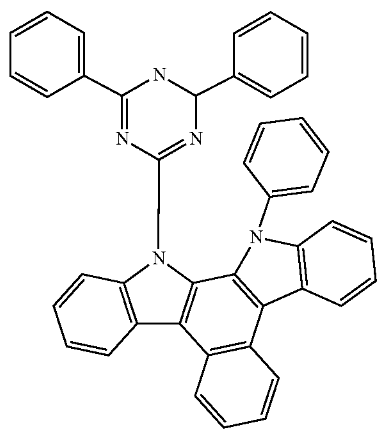
-continued
H46
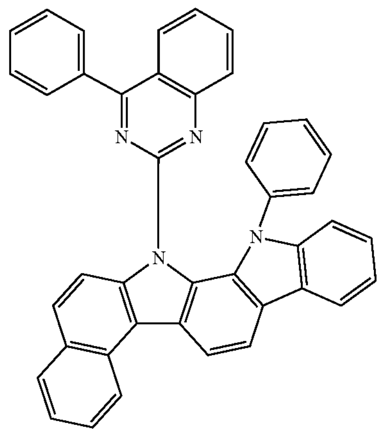
H47
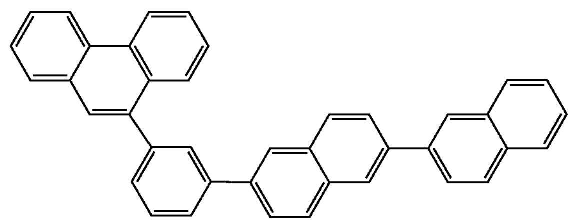
H48
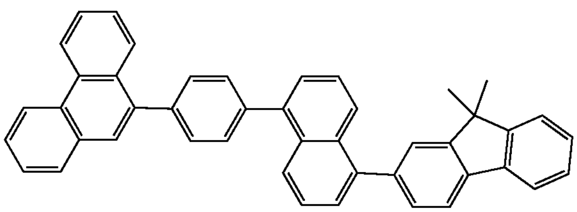
H49
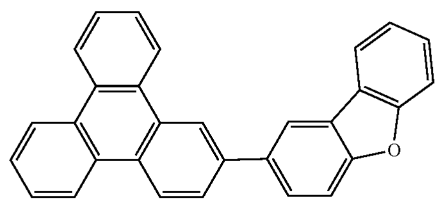
H50
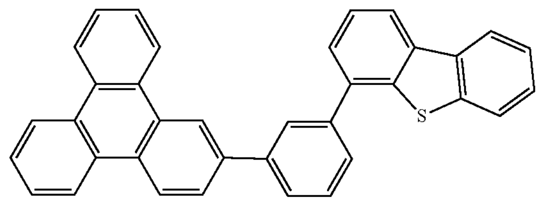
H51
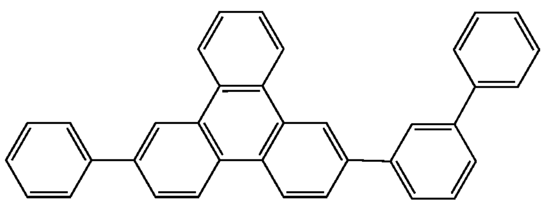

-continued
H52
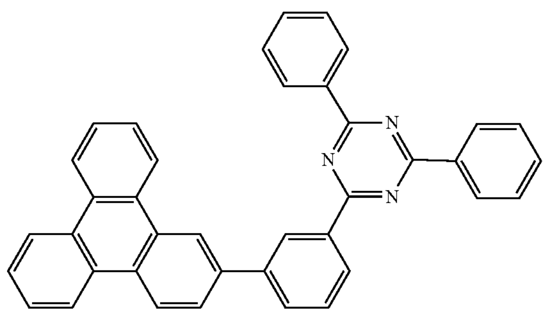
H53
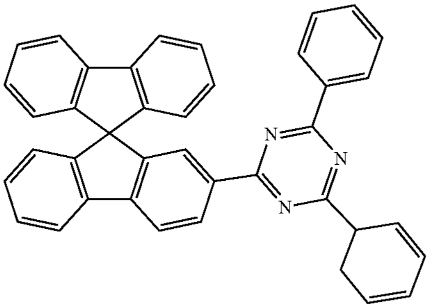
H54
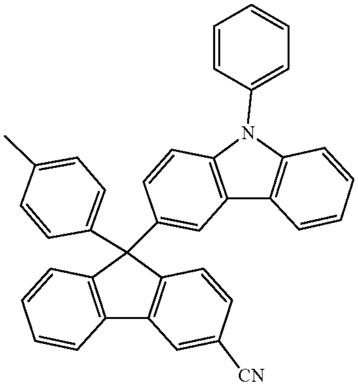
H55
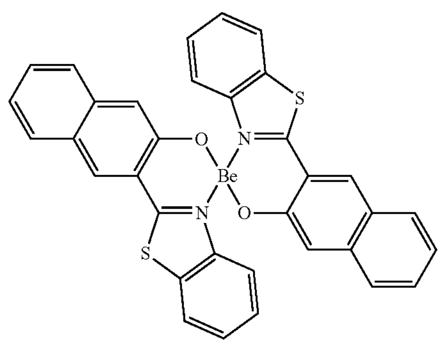
-continued
H56
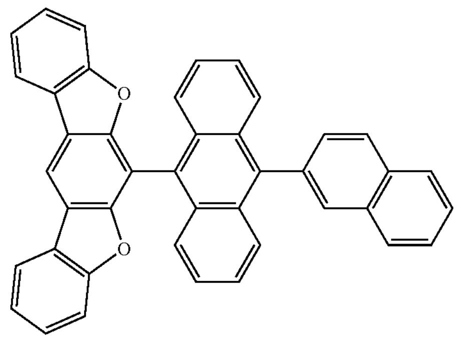
H57
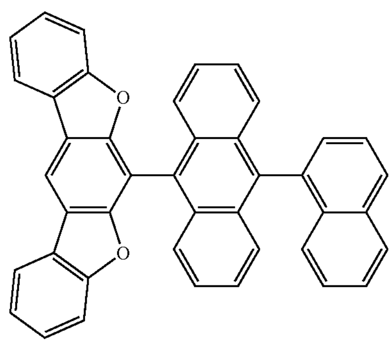
H58
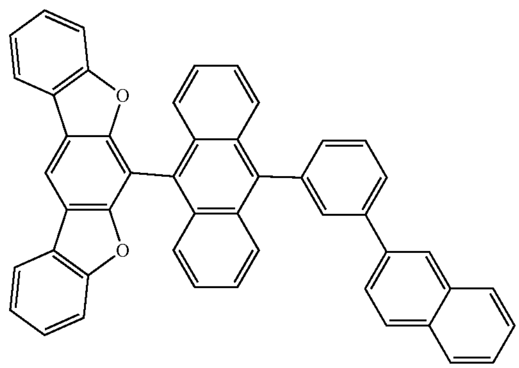
H59
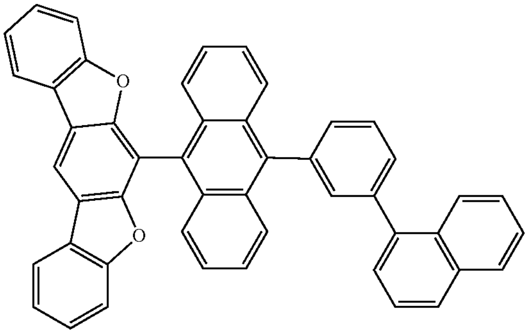

-continued
H60
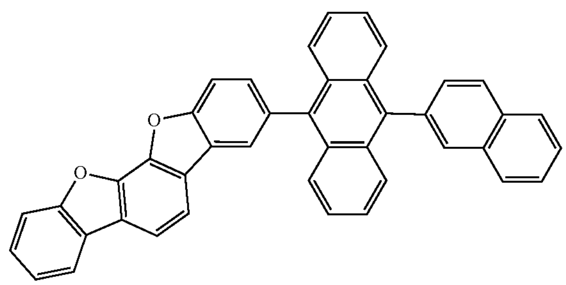
H61
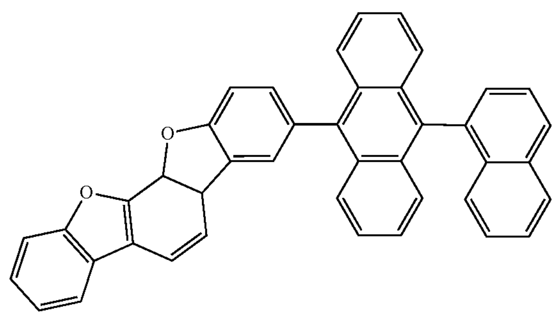
H62
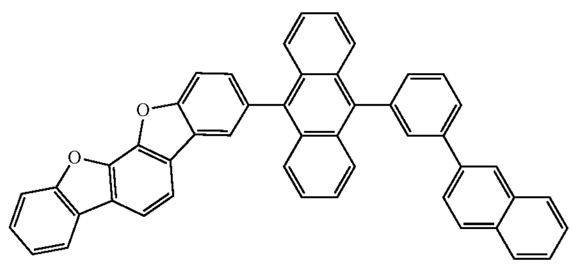
H63
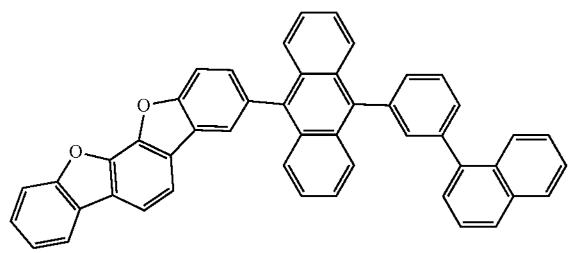
H64
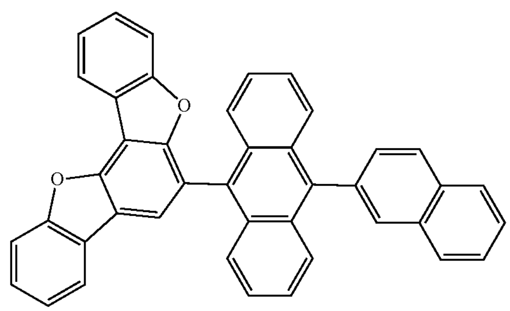
-continued
H65
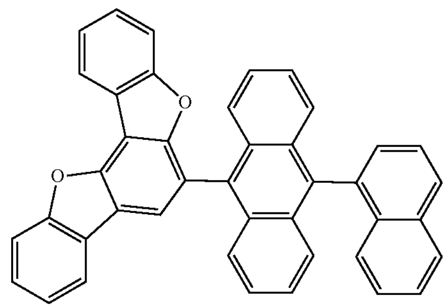
H66
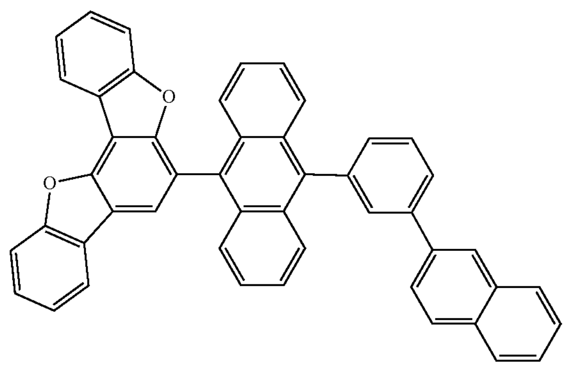
H67
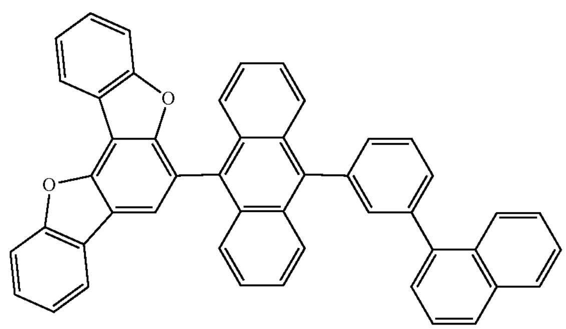
H68
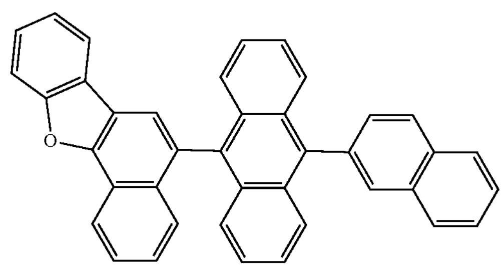
H69
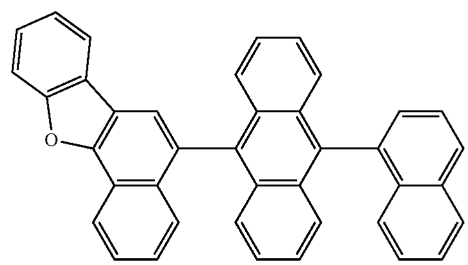

-continued
H70
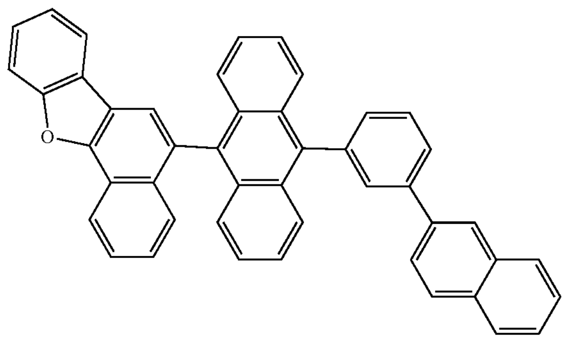
H71
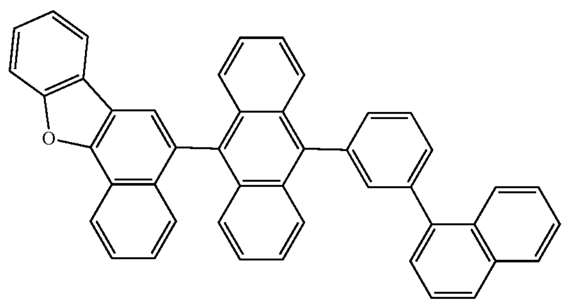
H72
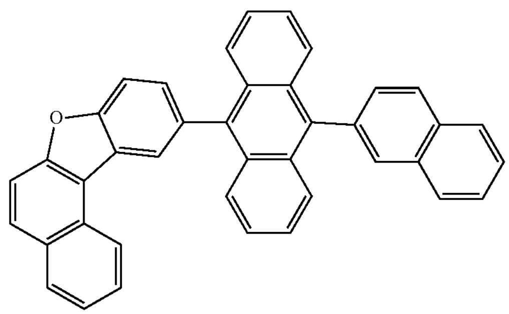
H73
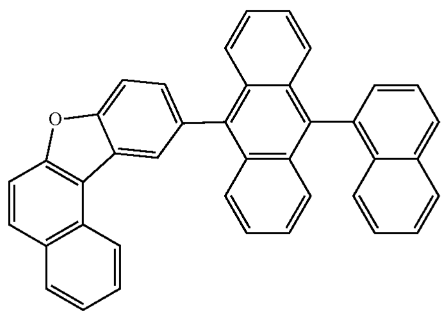
H74
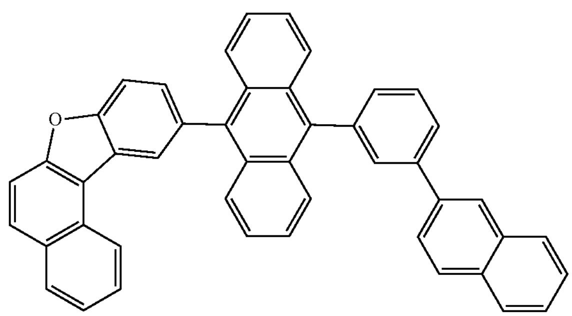
-continued
H75
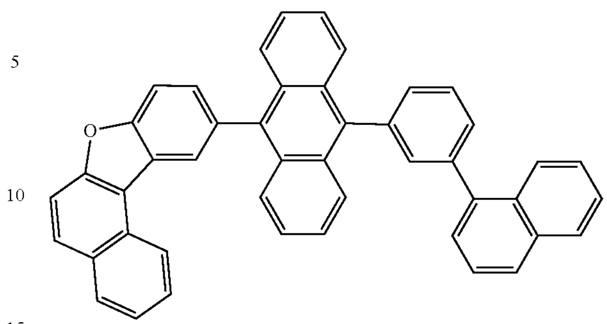
H76
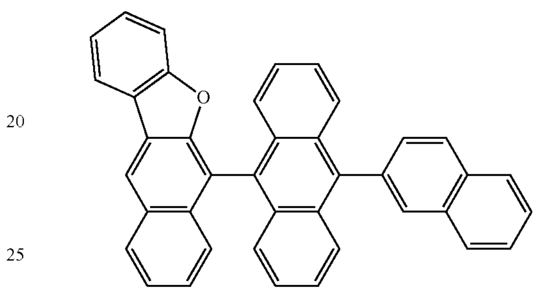
H77
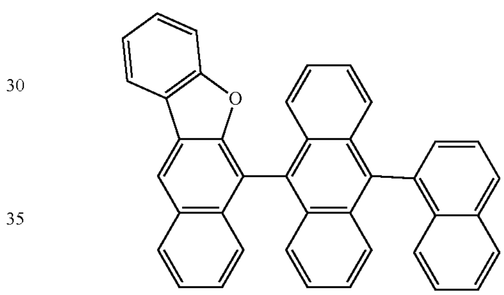
H78
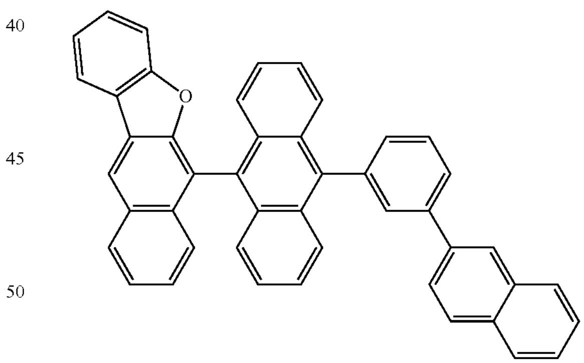
H79
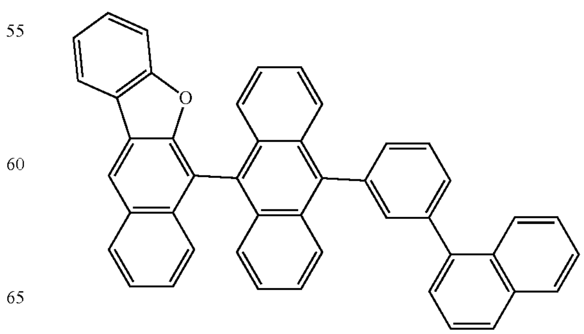

-continued
H80
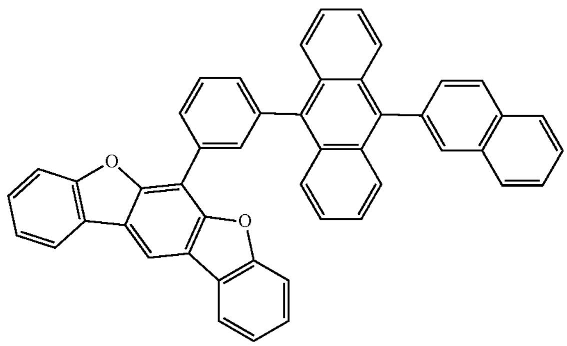
H81
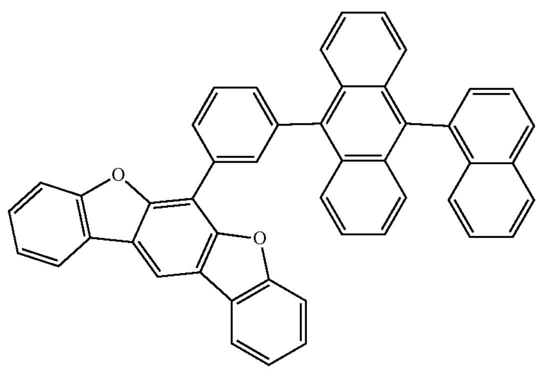
H82
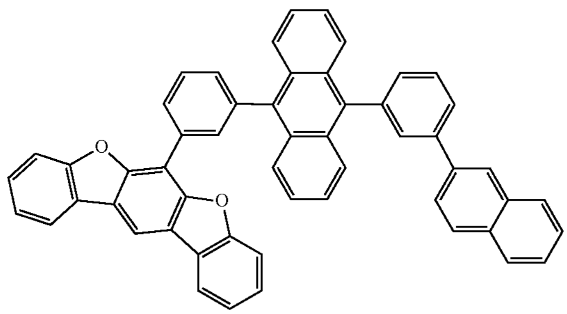
H83
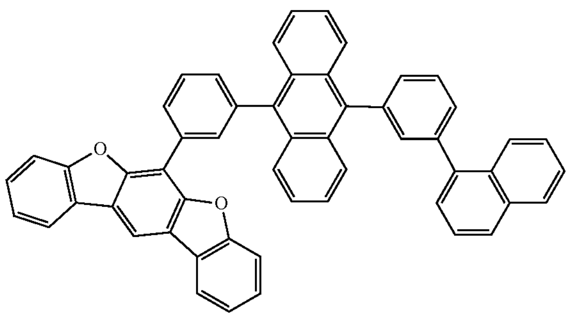
-continued
H84
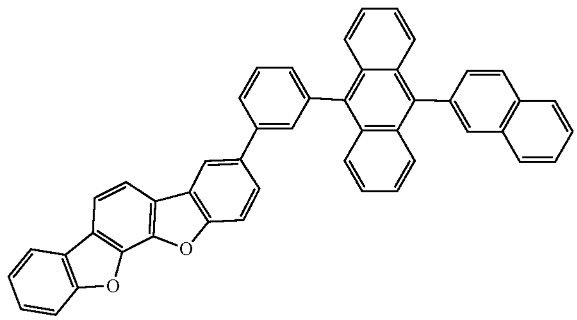
H85
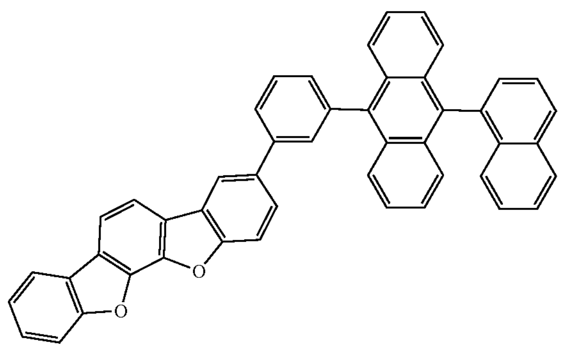
H86
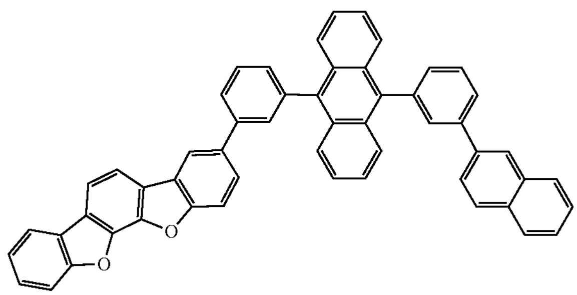
H87
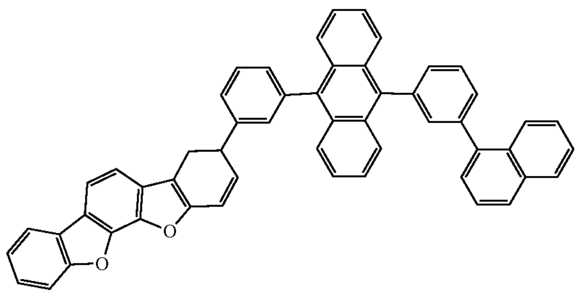

-continued
H88
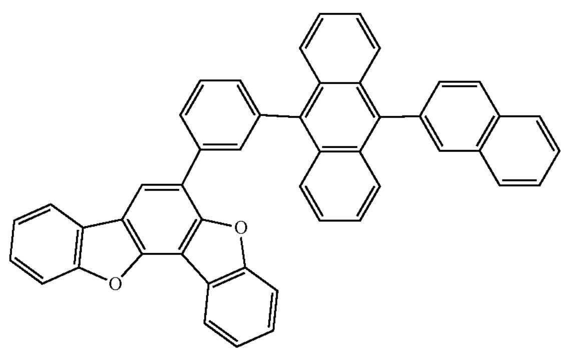
H89
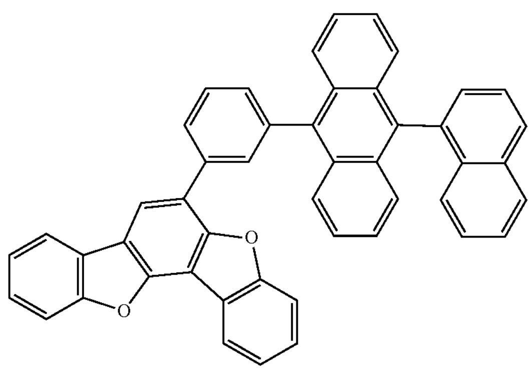
H90
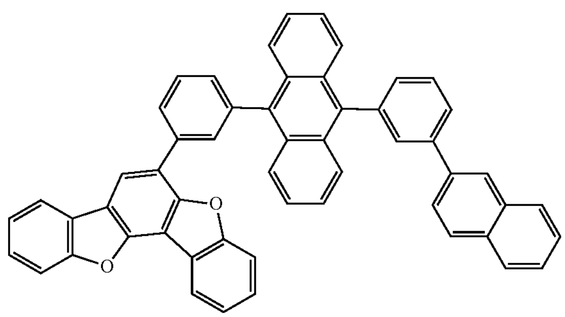
H91
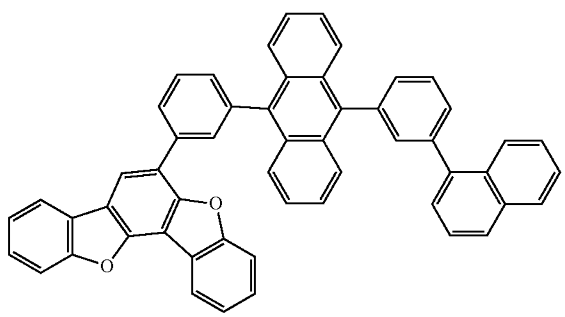
-continued
H92
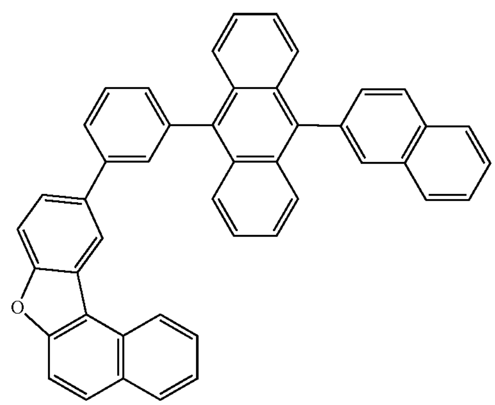
H93
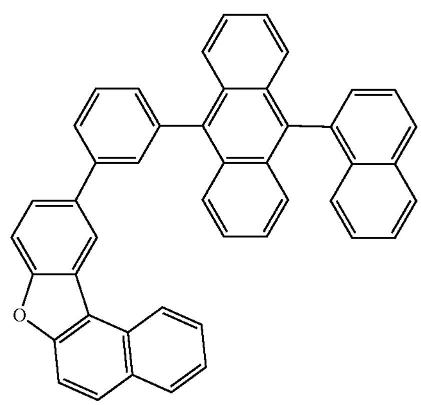
H94
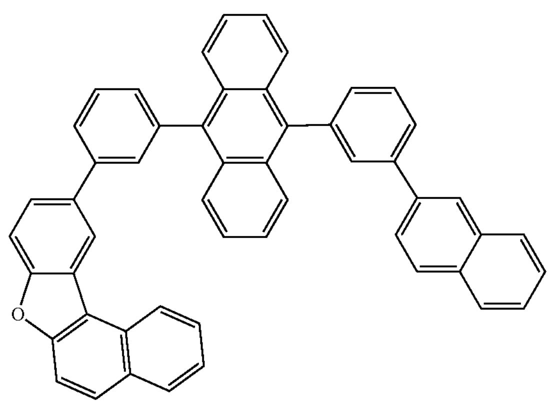
H95
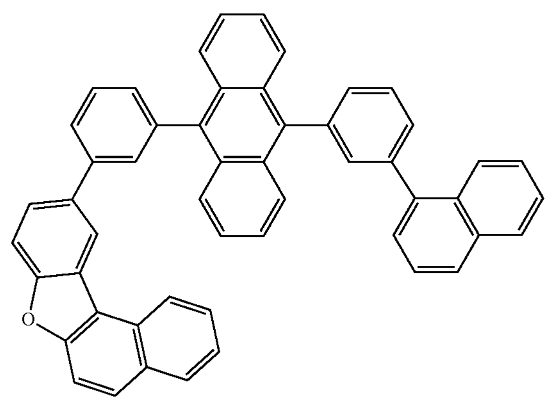

-continued
H96
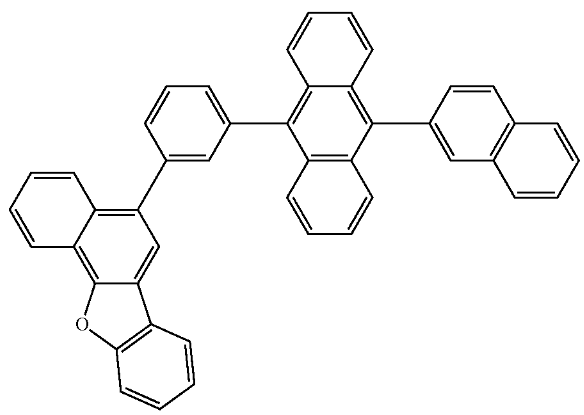
H97
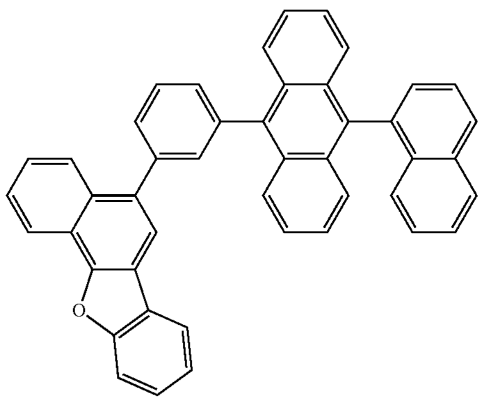
H98
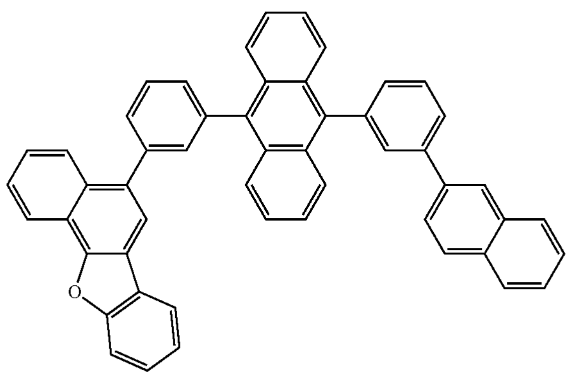
H99
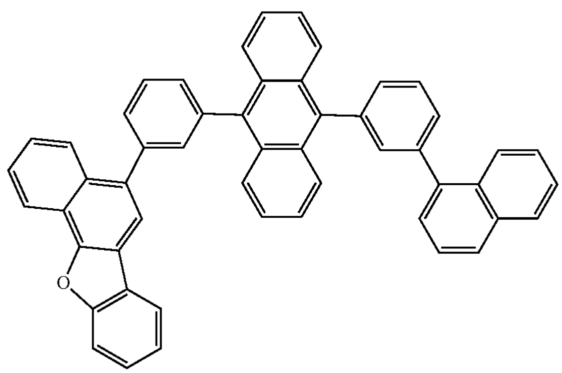
-continued
H100
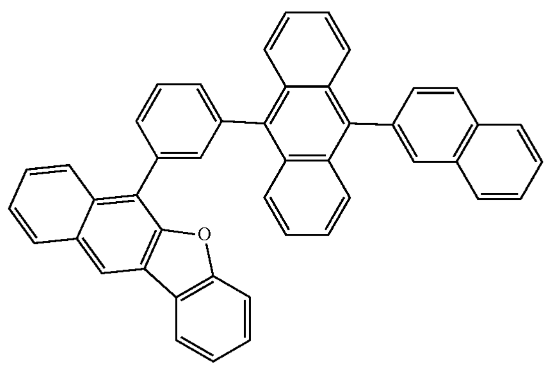
H101
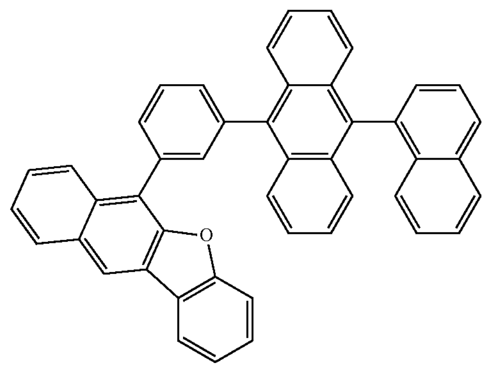
H102
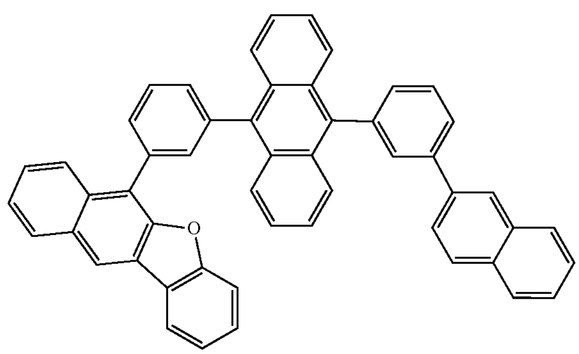
H103
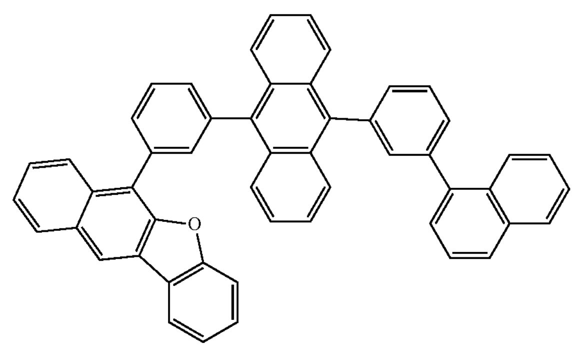

-continued
H104
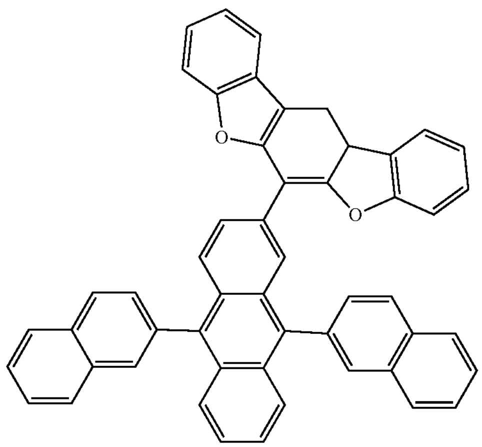
H105
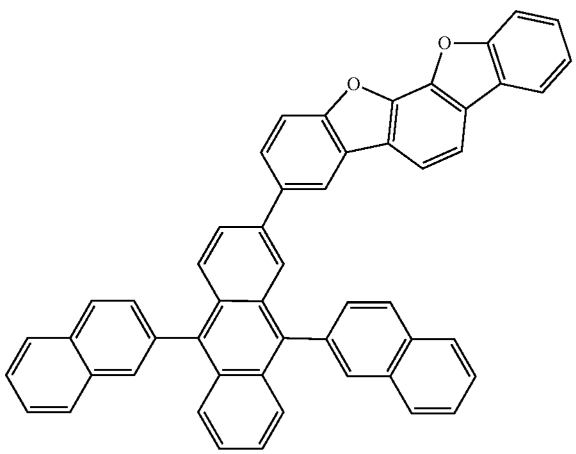
H106
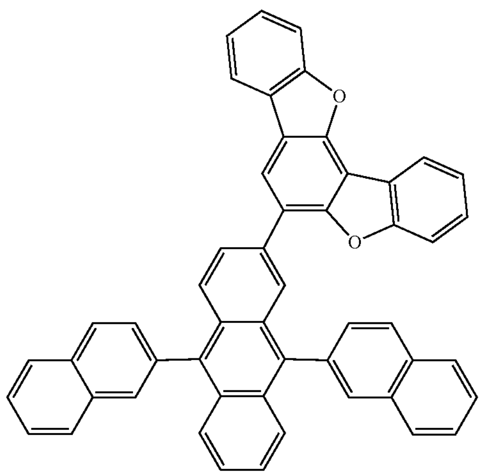
-continued
H107
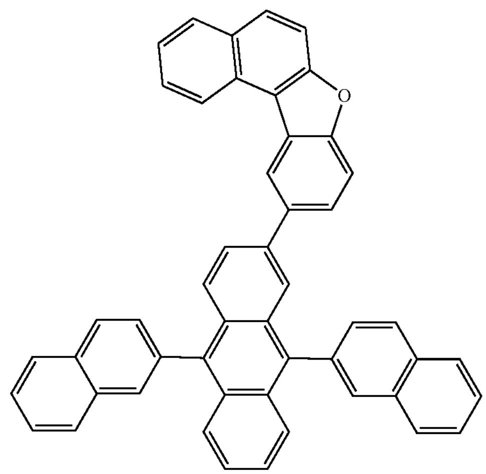
H108
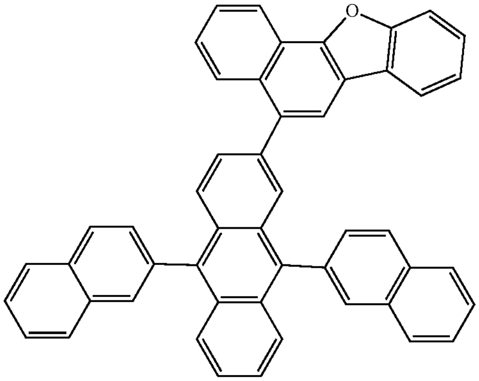
H109
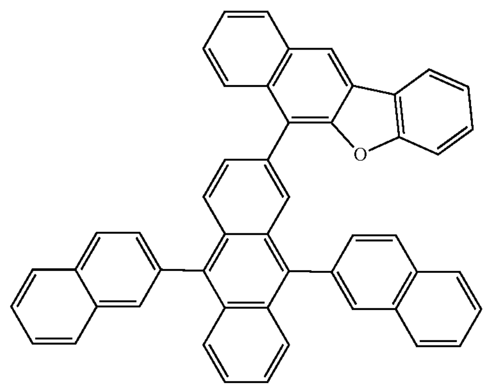
H110
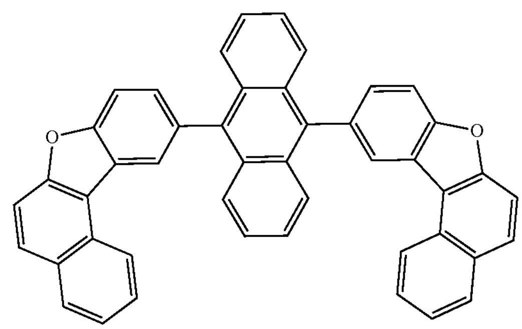

-continued
H111
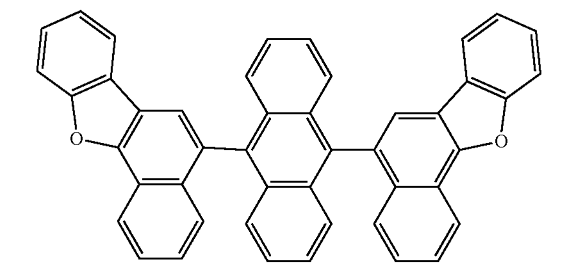
H112
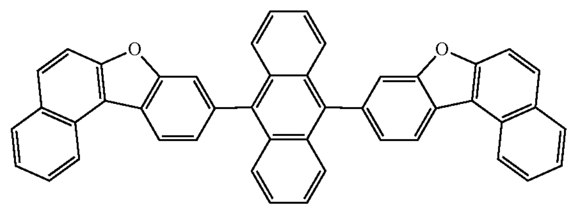
H113
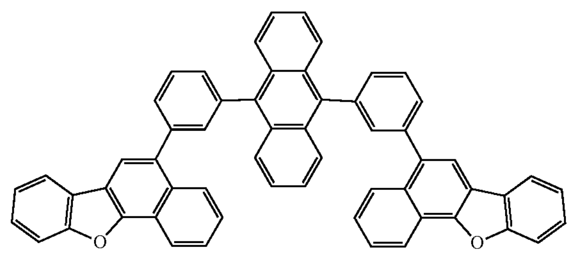
H114
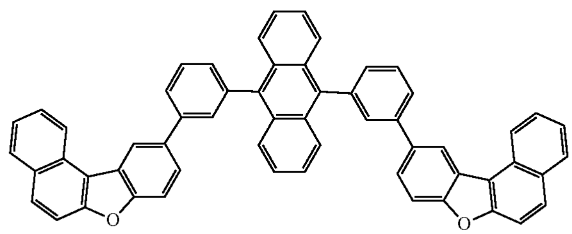
H115
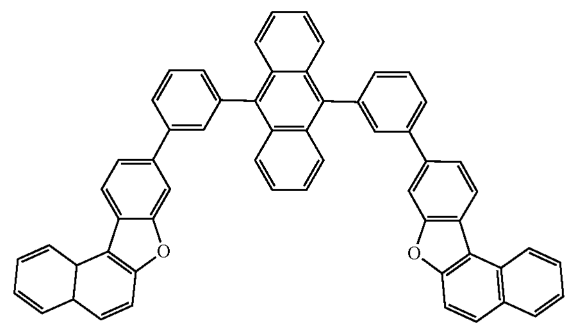
-continued
H116
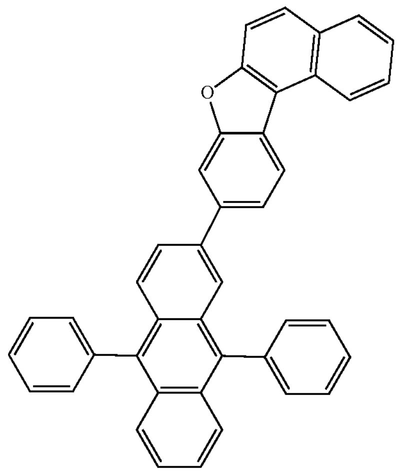
H117
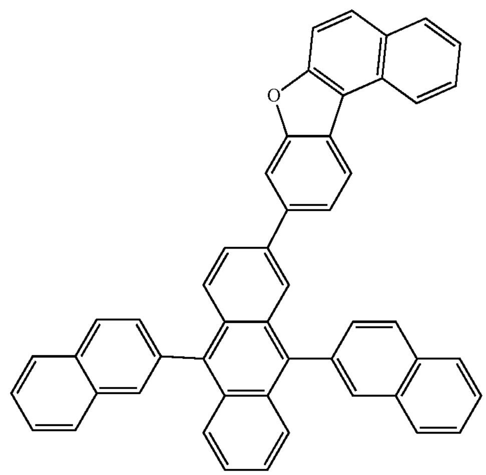
H118
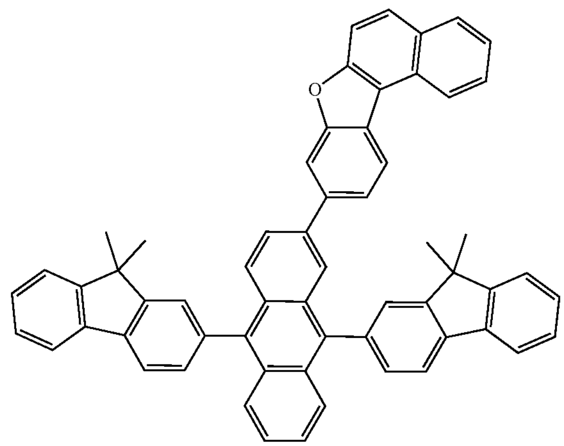

-continued
H119
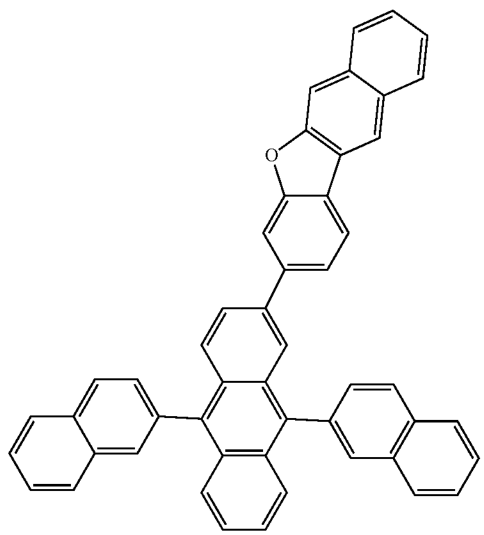
H120
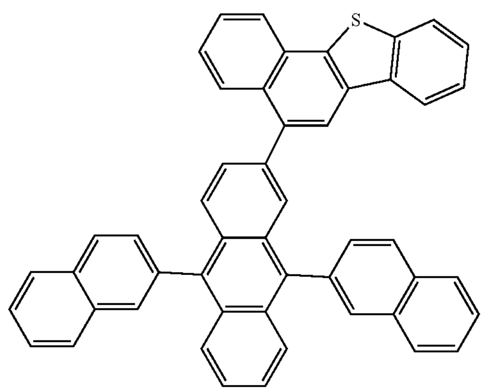
H121
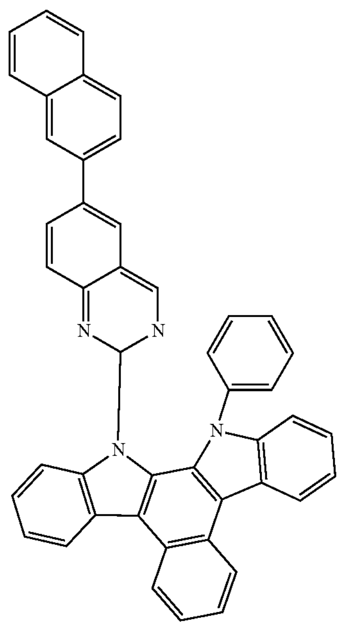
-continued
H122
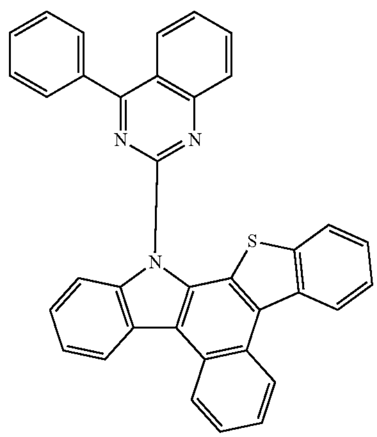
H123
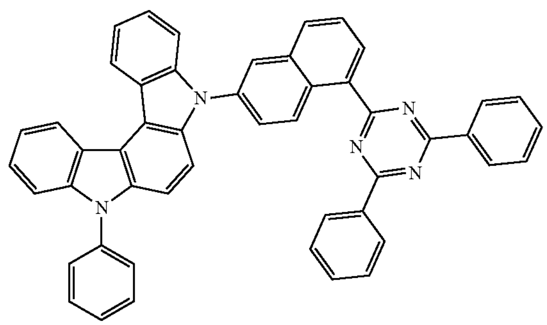
H124
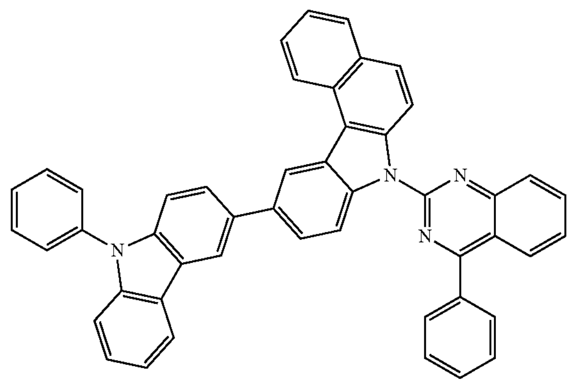
H125
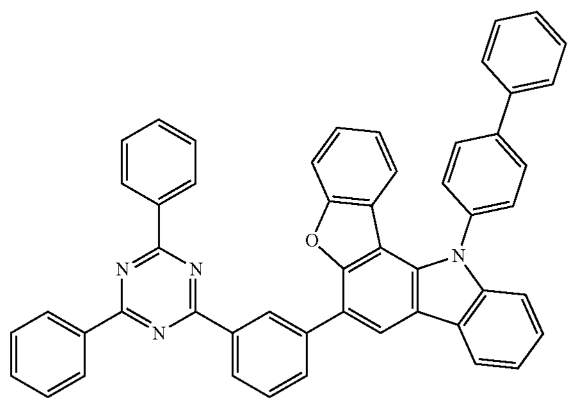

-continued

H126

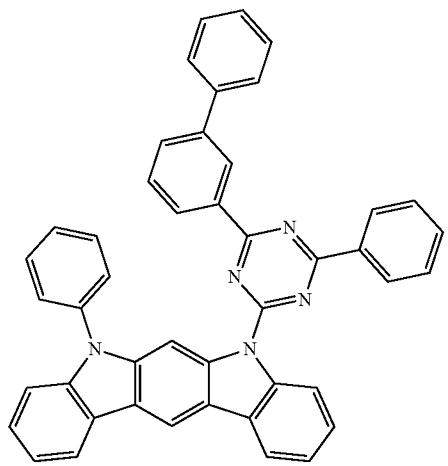

H127

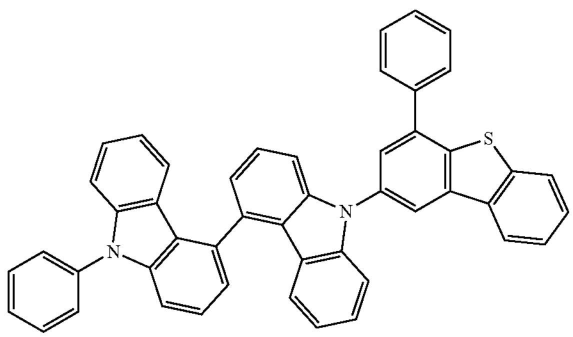

H128

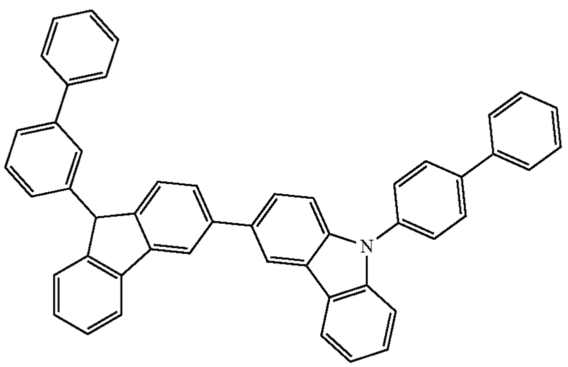

Phosphorescent Dopant

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

For example, the phosphorescent dopant may include an organometallic compound represented by Formula 401:

Formula 401

$M(L_{401})_{xc1}(L_{402})_{xc2}$

Formula 402

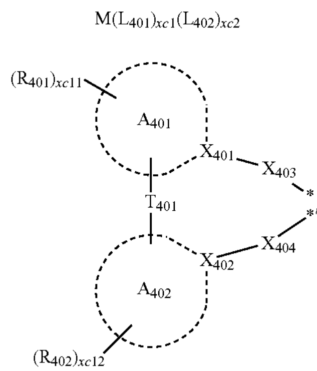

In Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 is 1, 2, or 3, wherein, when xc1 is 2 or more, two or more of $L_{401}$ may be identical to or different from each other, $L_{402}$ may be an organic ligand, and xc2 may be 0, 1, 2, 3, or 4, wherein, when xc2 is 2 or more, two or more of $L_{402}$ may be identical to or different from each other, $X_{401}$ and $X_{402}$ may each independently be N or C, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*, *—S—*, *—C(=O)—*, *—N($Q_{411}$)—*, *—C($Q_{411}$)($Q_{412}$)—*, *—C($Q_{411}$)=C($Q_{412}$)—**, *—C($Q_{411}$)=*, or *=C=*, $X_{403}$ and $X_{404}$ may each independently be a chemical bond (for example, a covalent bond or a coordination bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each be the same as described in connection with $Q_1$, xc11 and xc12 may each independently be an integer from 0 to 10, and

* and *' in Formula 402 each indicate a binding site to M in Formula 401.

For example, in Formula 402, i) $X_{401}$ may be nitrogen and $X_{402}$ may be carbon, or ii) each of $X_{401}$ and $X_{402}$ may be nitrogen.

In one or more embodiments, when xc1 in Formula 401 is 2 or more, two ring $A_{401}$(s) among two or more of $L_{401}$ may optionally be linked to each other via $T_{402}$, which is a linking group, and two ring $A_{402}$(s) among two or more of $L_{401}$ may optionally be linked to each other via $T_{403}$, which is a linking group (see Compounds PD1 to PD4 and PD7). $T_{402}$ and $T_{403}$ may each independently be as defined in $T_{401}$.

In Formula 401, $L_{402}$ may be an organic ligand. For example, $L_{402}$ may include a halogen group, a diketone group (for example, an acetylacetonate group), a carboxylic acid group (for example, a picolinate group), —C(═O), an isonitrile group, a —CN group, a phosphorus group (for example, a phosphine group, a phosphite group, etc.), or any combination thereof.

The phosphorescent dopant may include, for example, at least one selected from among Compounds PD1 to PD39, and/or any combination thereof:

PD1

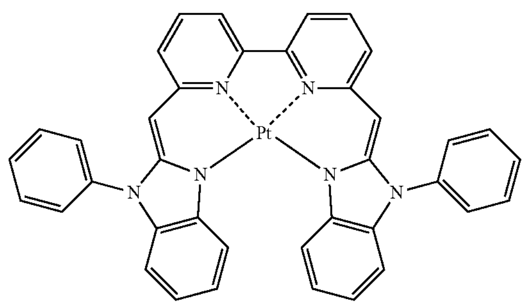

PD2

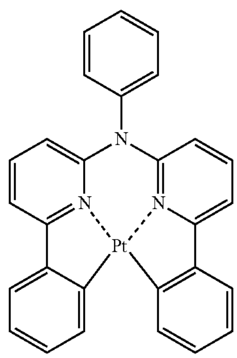

PD3

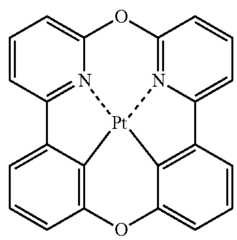

-continued

PD4

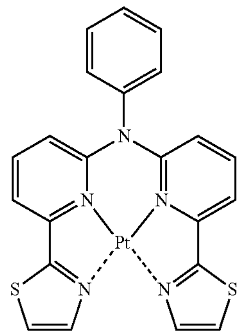

PD5

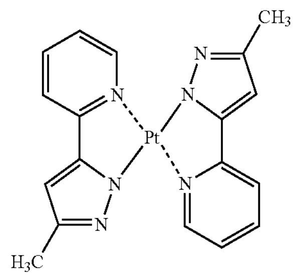

PD6

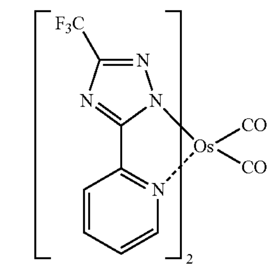

PD7

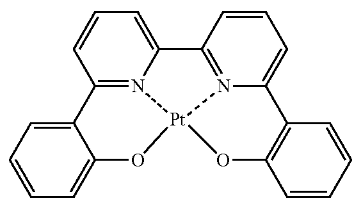

PD8

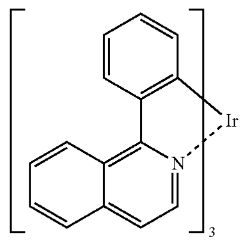

PD9

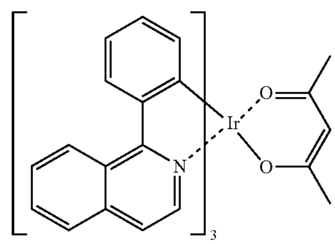

-continued
PD10
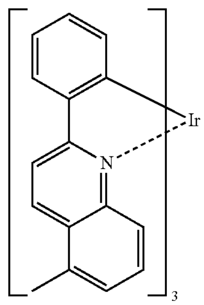
PD11
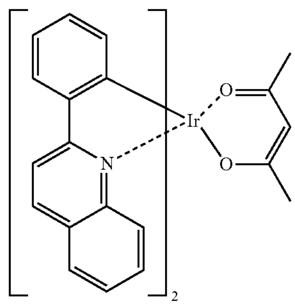
PD12
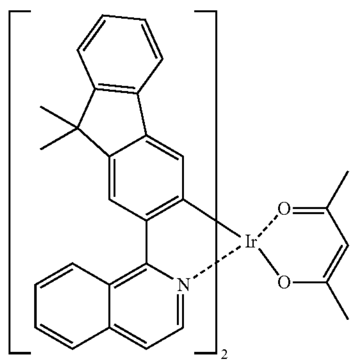
PD13
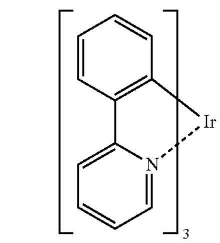
PD14
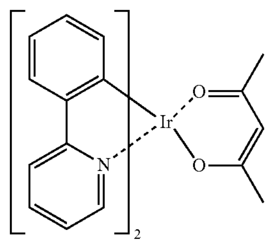
-continued
PD15
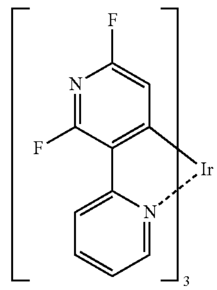
PD16
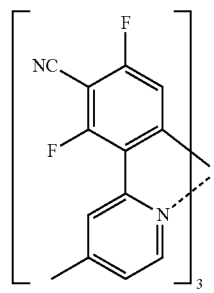
PD17
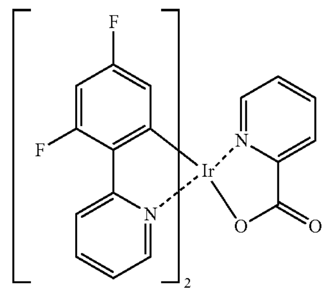
PD18
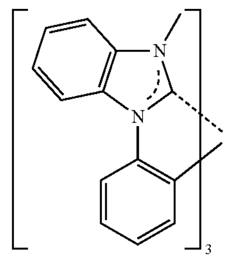
PD19
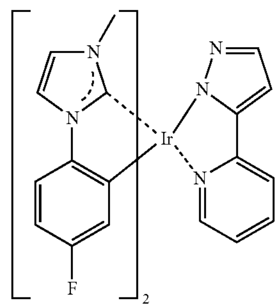

-continued
PD20
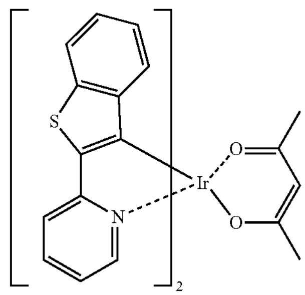
PD21
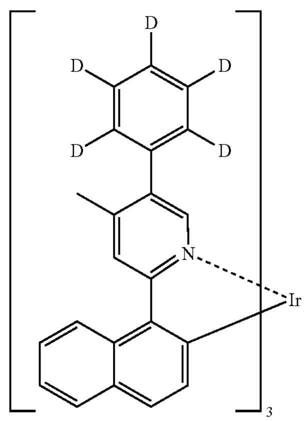
PD22
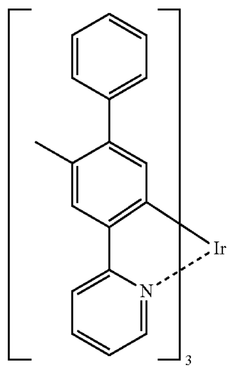
PD23
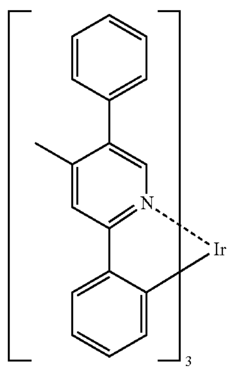
-continued
PD24
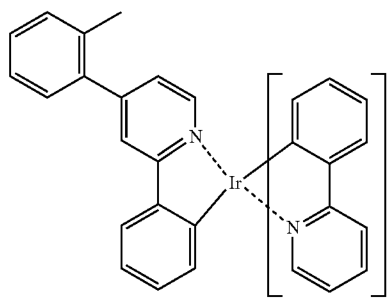
PD25
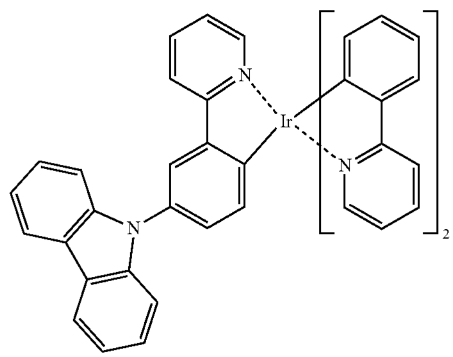
PD26
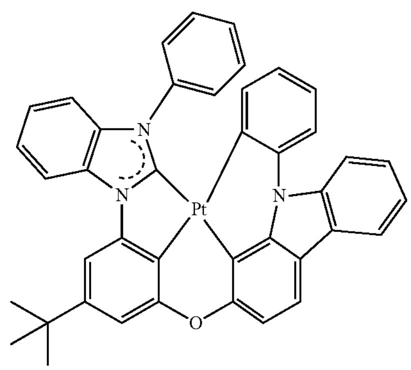
PD27
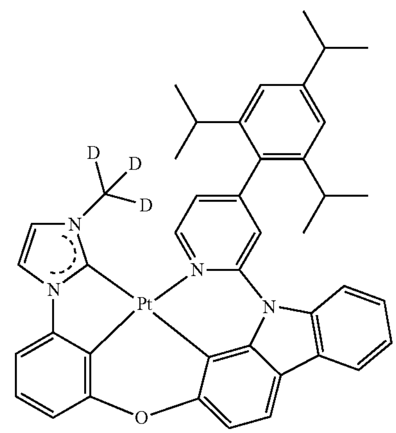

-continued
PD28
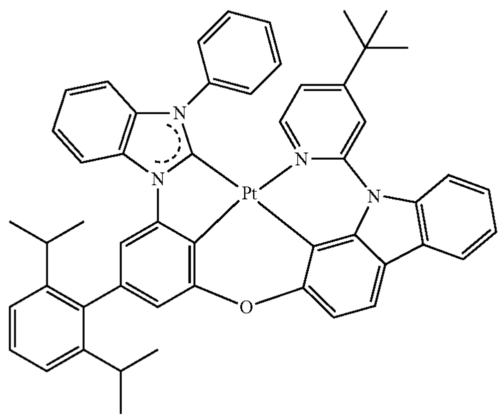
PD29
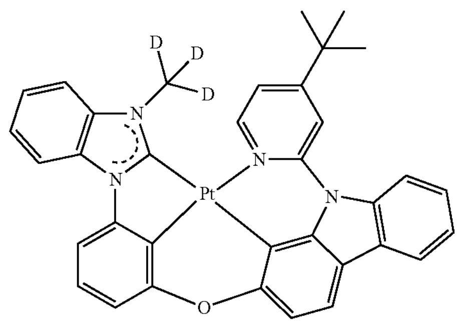
PD30
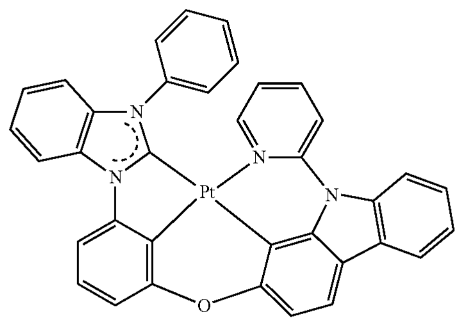
PD31
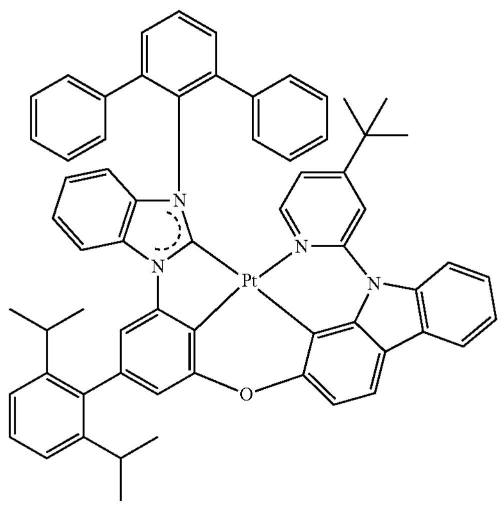
-continued
PD32
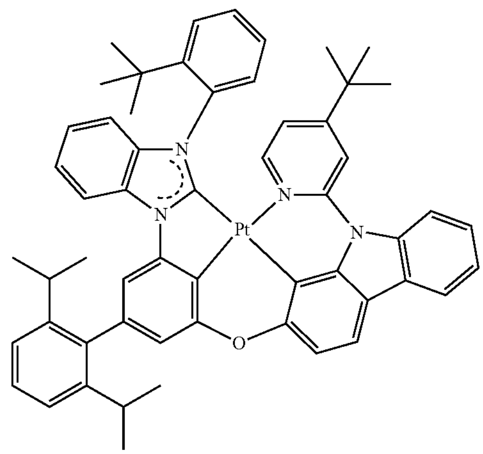
PD33
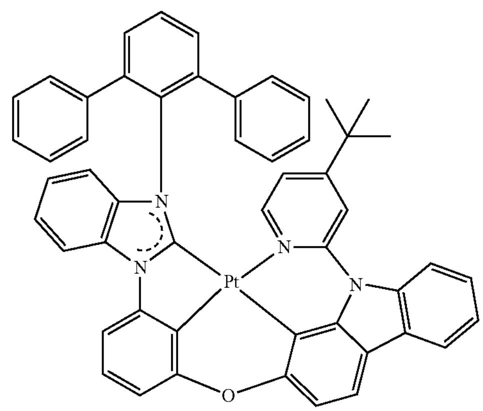
PD34
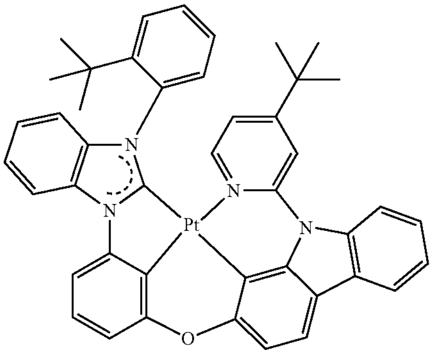

-continued

PD35

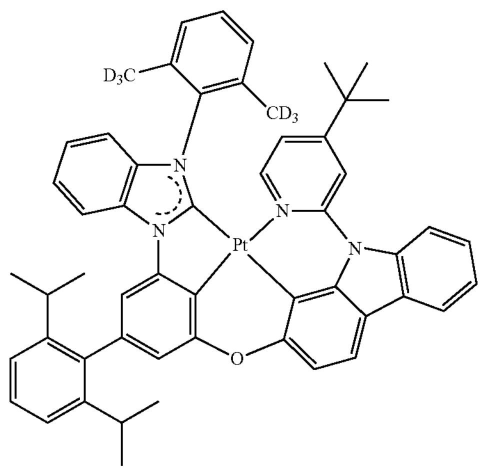

PD36

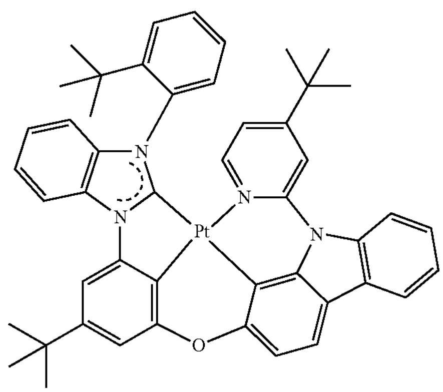

PD37

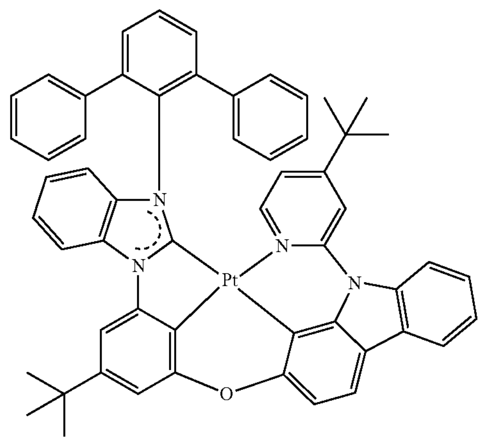

-continued

PD38

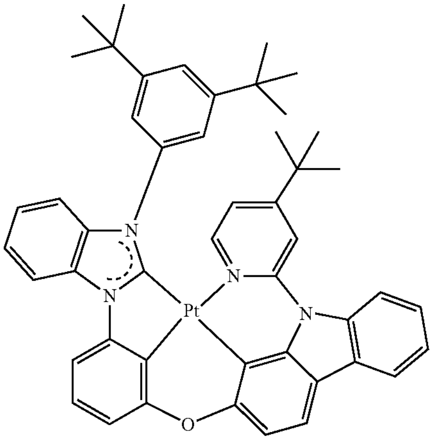

PD39

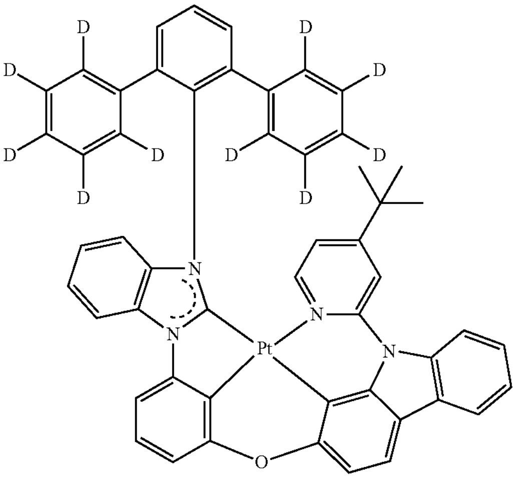

Fluorescent Dopant

The fluorescent dopant may include an amine group-containing compound, a styryl group-containing compound, or any combination thereof.

For example, the fluorescent dopant may include a compound represented by Formula 501:

Formula 501

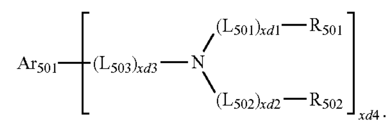

In Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

For example, $Ar_{501}$ in Formula 501 may be a condensed cyclic group (for example, an anthracene group, a chrysene group, a pyrene group, etc.) in which three or more monocyclic groups are condensed together.

In one or more embodiments, xd4 in Formula 501 may be 2.

For example, the fluorescent dopant may include: at least one selected from among Compounds FD1 to FD37; DPVBi; DPAVBi; and/or any combination thereof:
FD1
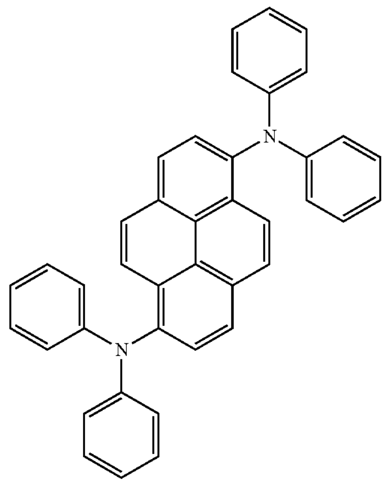
FD2
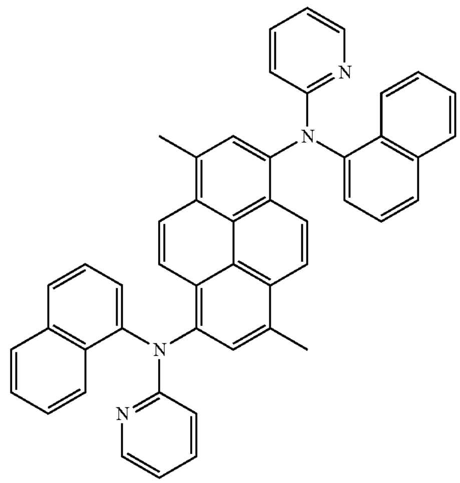
FD3
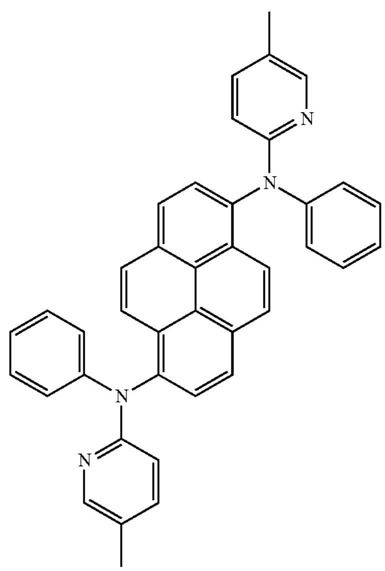
FD4
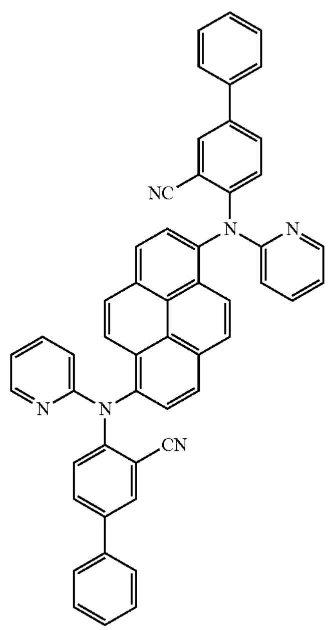

-continued
FD5
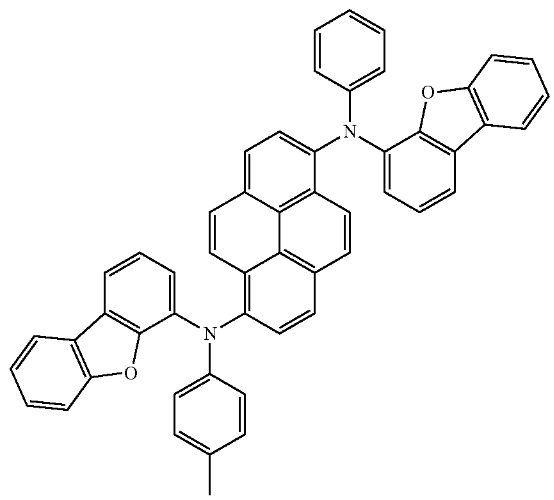
FD6
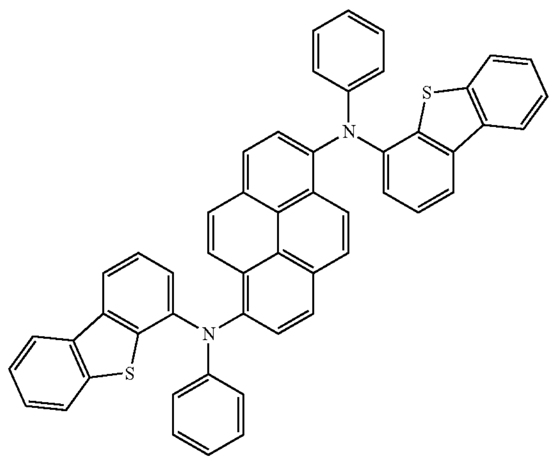
FD7
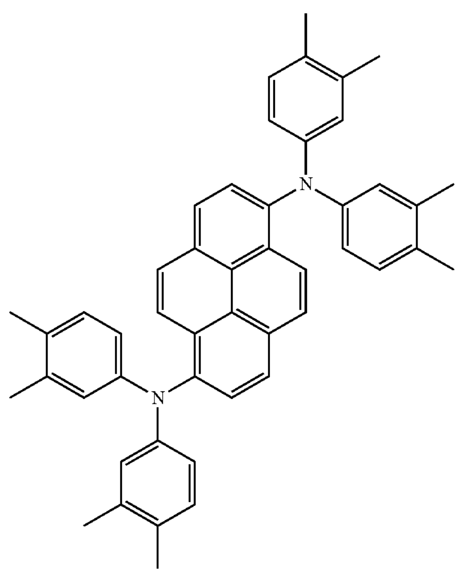
FD8
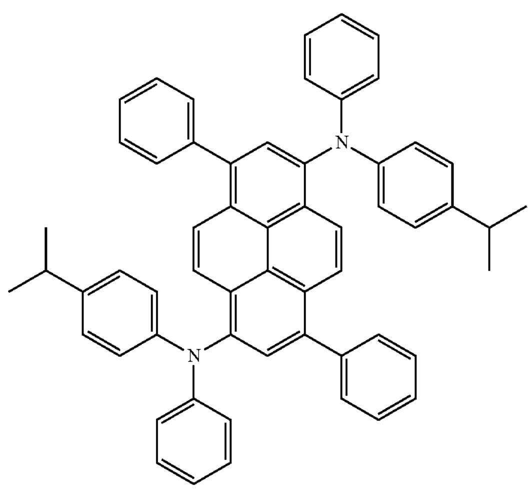
FD9
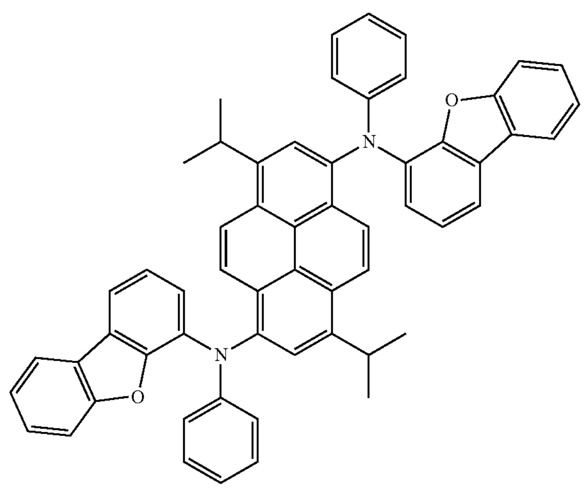

-continued
FD10
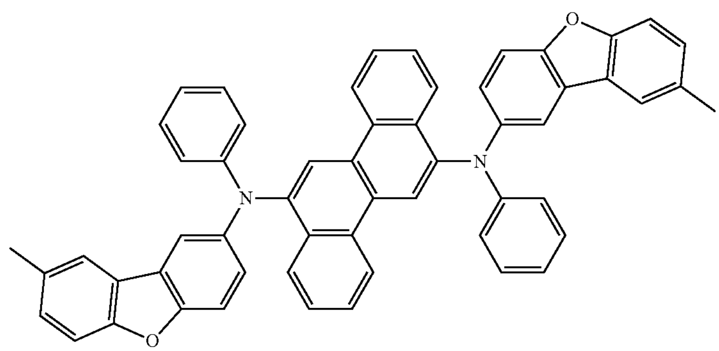
FD11
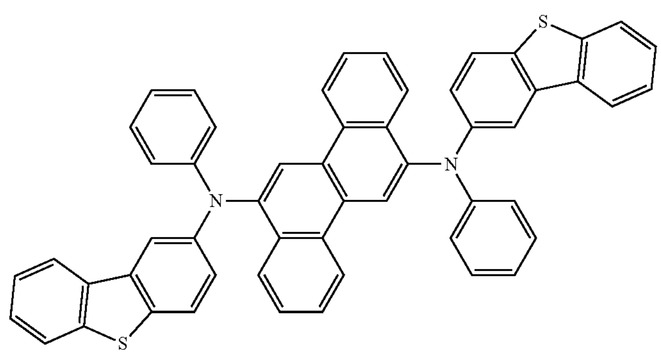
FD12
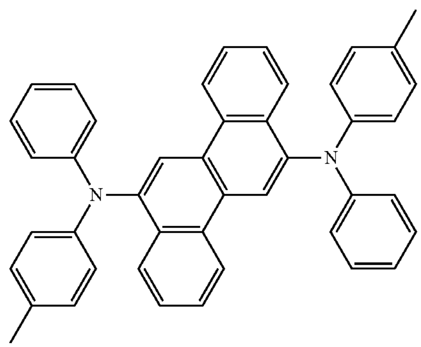
FD13
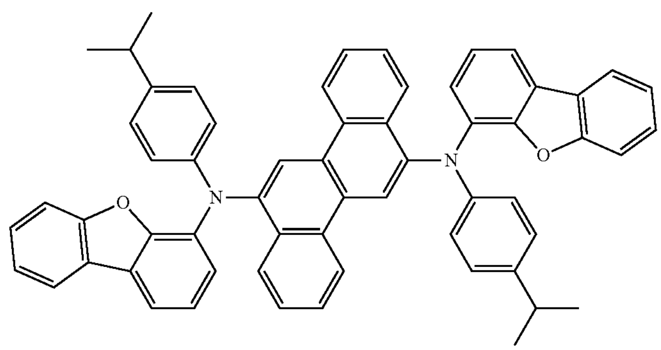

-continued
FD14
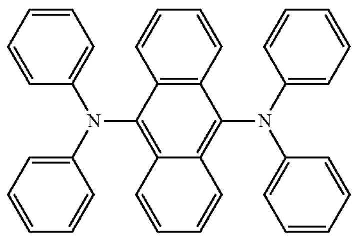
FD15
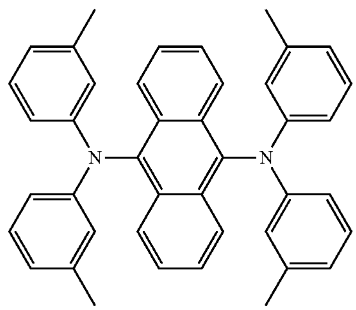
FD16
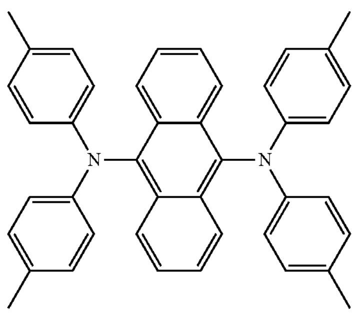
FD17
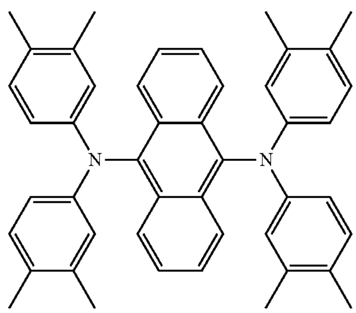
FD18
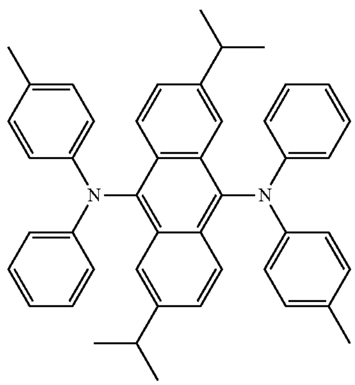
FD19
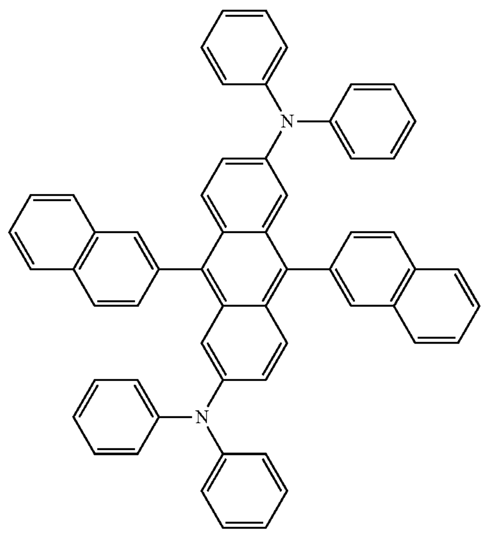
FD20
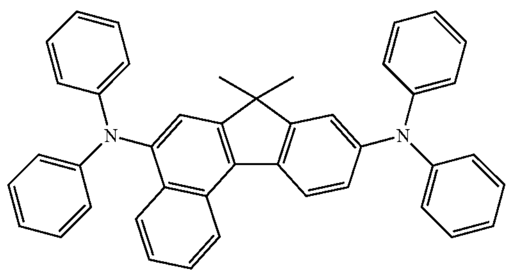
FD21
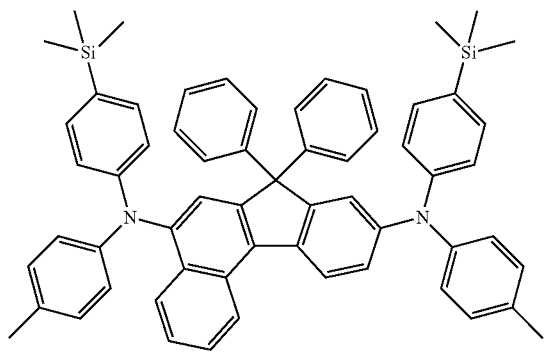

-continued
FD22
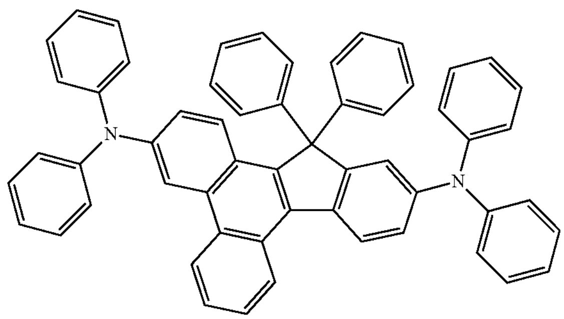
FD23
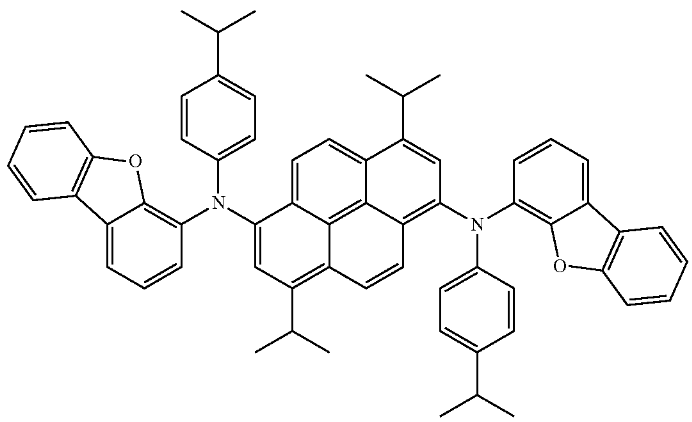
FD24
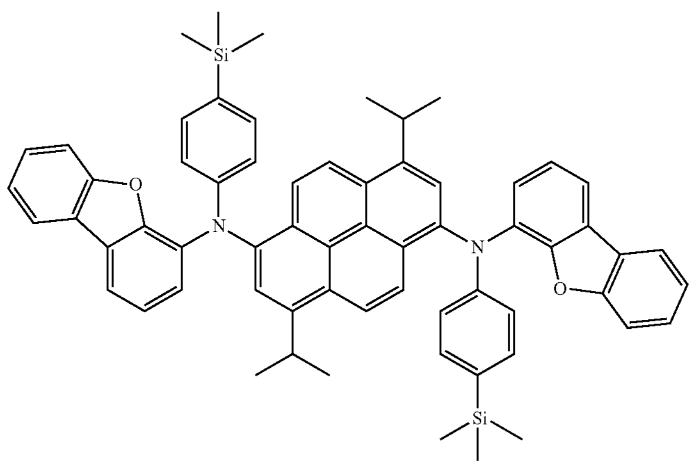
FD25
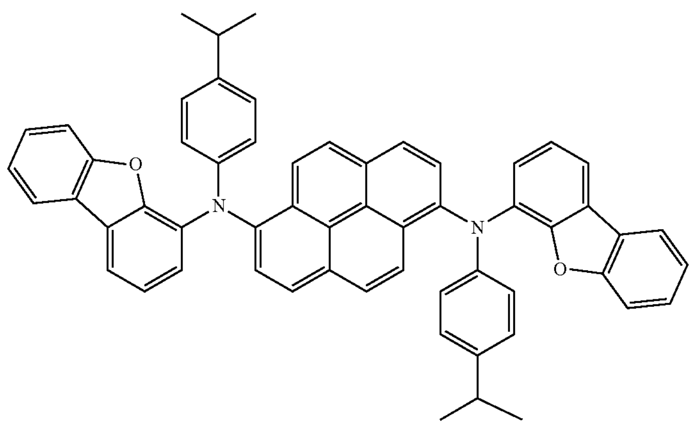

-continued
FD26
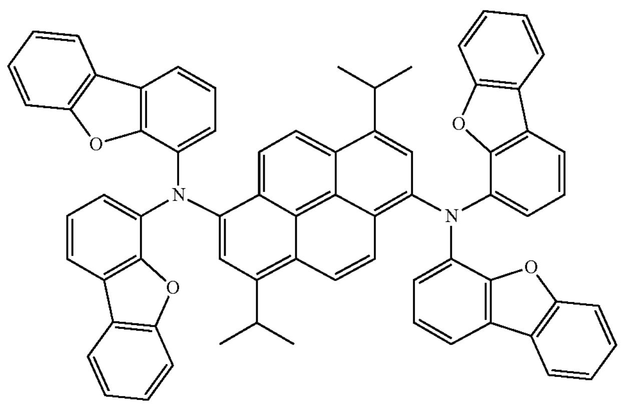
FD27
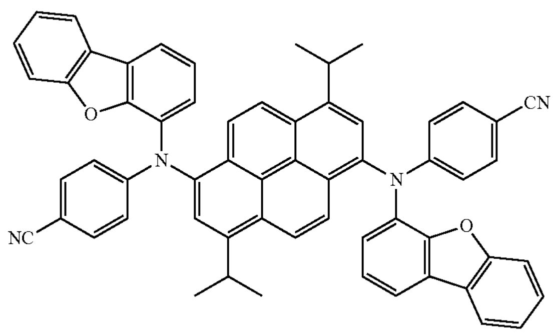
FD28
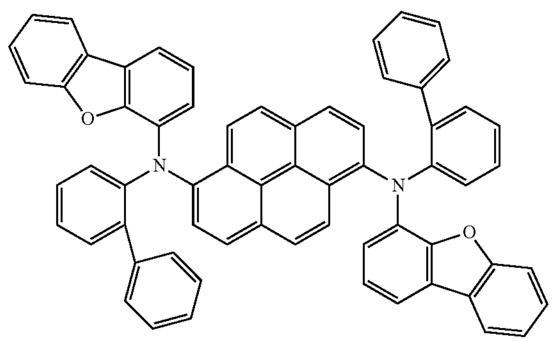
FD29
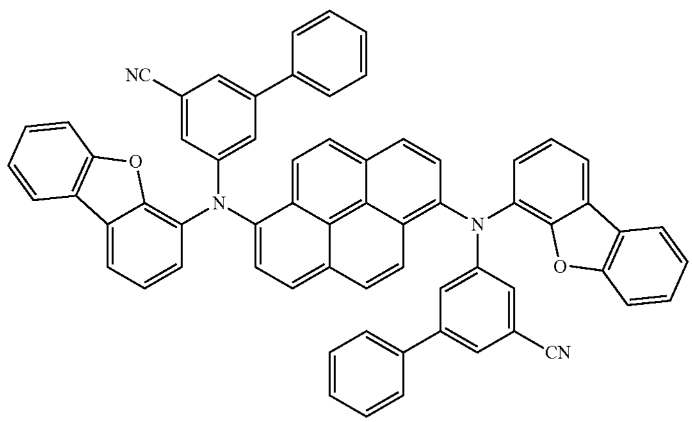
FD30
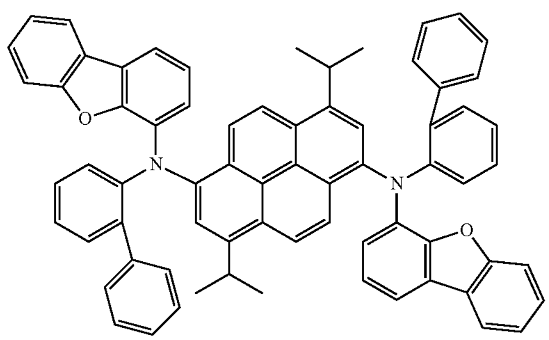
FD31
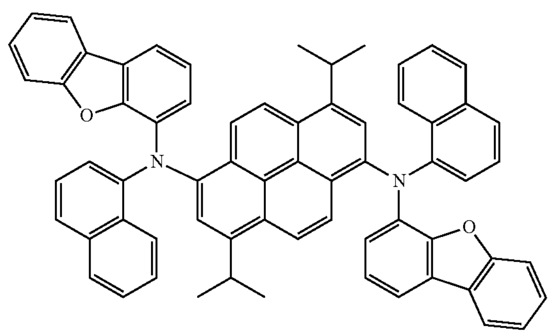

-continued
FD32
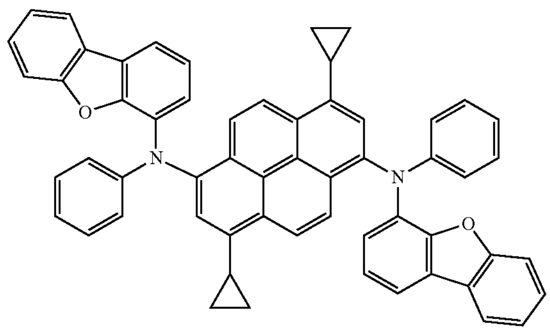
FD33
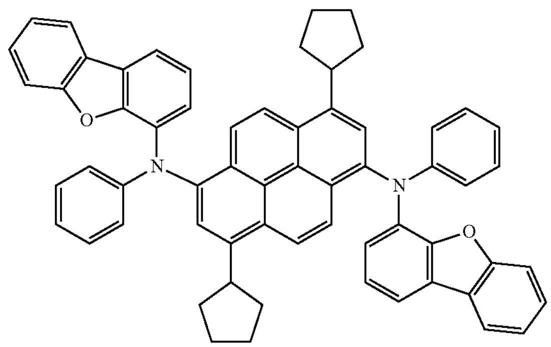
FD34
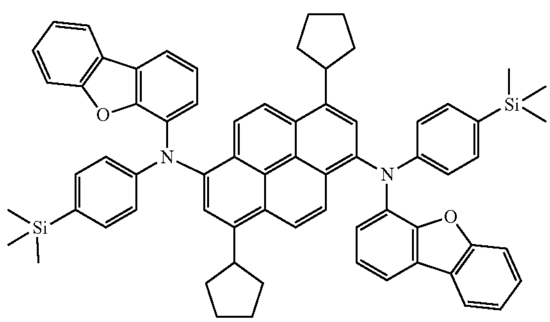
FD35
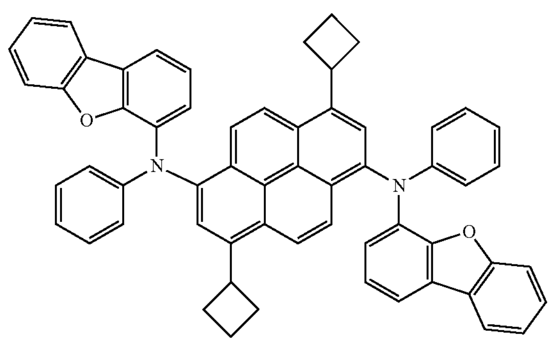
FD36
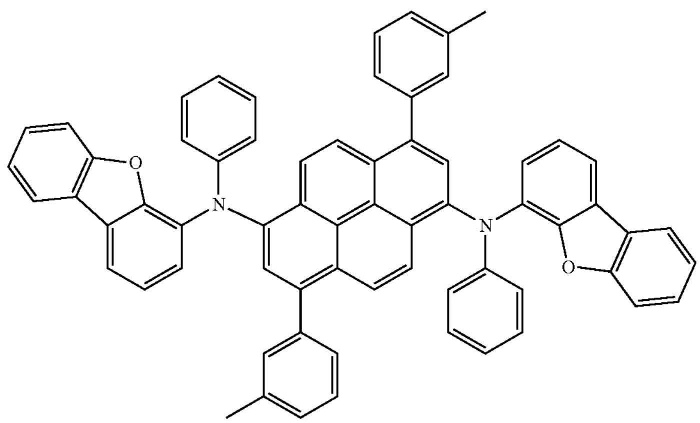
FD37
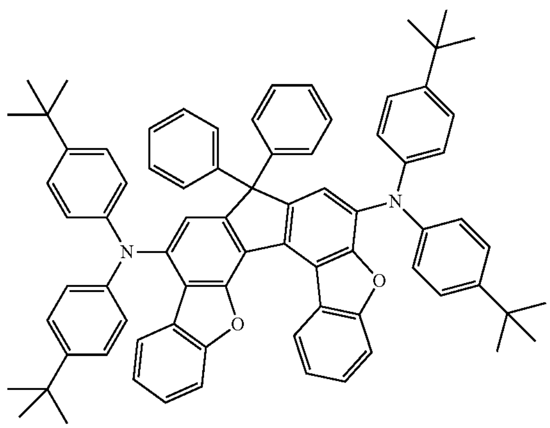
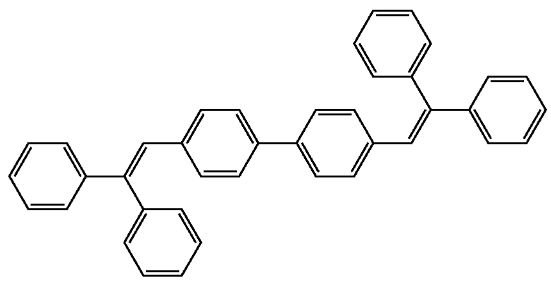
DPVBi -continued

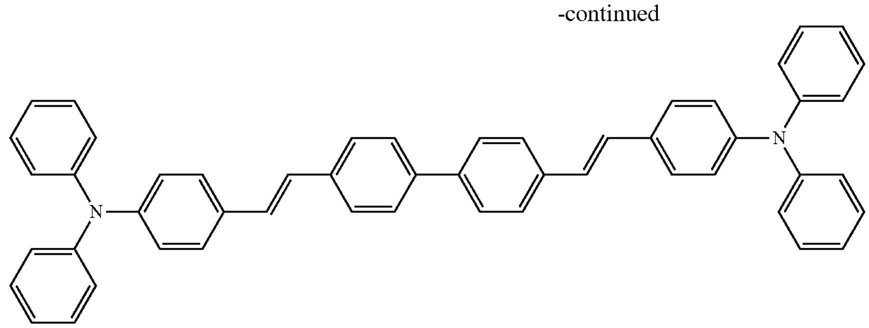

DPAVBi

Delayed Fluorescence Material

The emission layer may include a delayed fluorescence material.

In the present specification, the delayed fluorescence material may be selected from among compounds capable of emitting delayed fluorescence based on a delayed fluorescence emission mechanism.

The delayed fluorescence material included in the emission layer may act as a host or a dopant depending on the types (or kinds) of other materials included in the emission layer.

In one or more embodiments, a difference between the triplet energy level (eV) of the delayed fluorescence material and the singlet energy level (eV) of the delayed fluorescence material may be in a range of about 0 eV to about 0.5 eV. When the difference between the triplet energy level (eV) of the delayed fluorescence material and the singlet energy level (eV) of the delayed fluorescence material is within the above range, up-conversion from the triplet state to the singlet state of the delayed fluorescence materials may effectively occur, and thus, the light-emitting device 10 may have enhanced or improved luminescence efficiency.

For example, the delayed fluorescence material may include: i) a material including at least one electron donor (for example, a π electron-rich $C_3$-$C_{60}$ cyclic group and/or the like, such as a carbazole group) and at least one electron acceptor (for example, a sulfoxide group, a cyano group, a π electron-deficient nitrogen-containing $C_1$-$C_{60}$ cyclic group, and/or the like), ii) a material including a $C_8$-$C_{60}$ polycyclic group including at least two cyclic groups condensed to each other while sharing boron (B), and/or the like.

Examples of the delayed fluorescence material may include at least one selected from among Compounds DF1 to DF14:

DF1

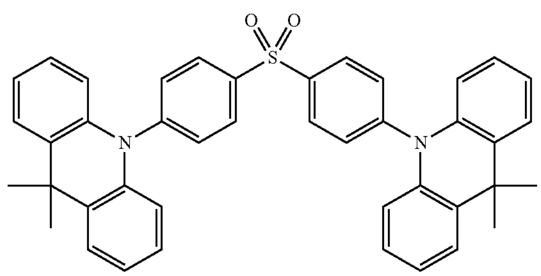

(DMAC-DPS)

-continued

DF2

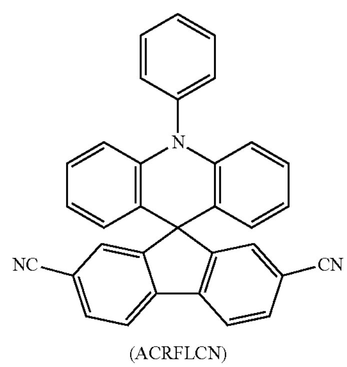

(ACRFLCN)

DF3

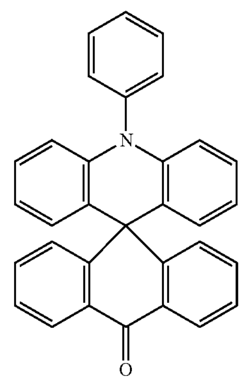

(ACRSA)

-continued
DF4
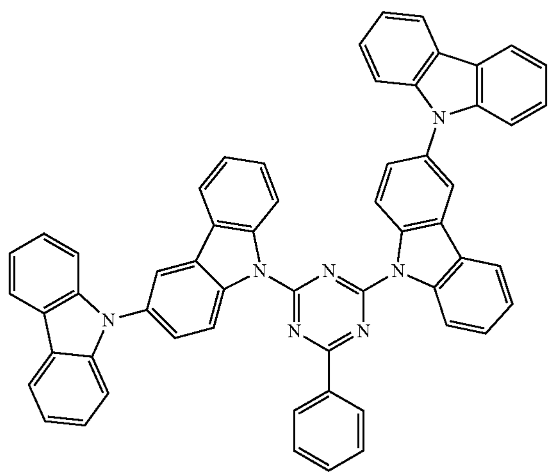
(CC2TA)
DF5
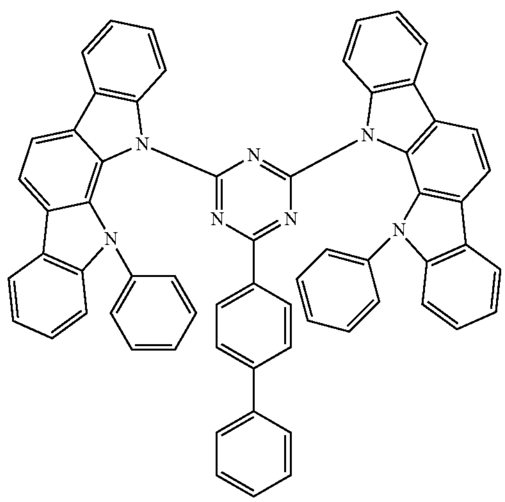
(PIC-TRZ)
DF6
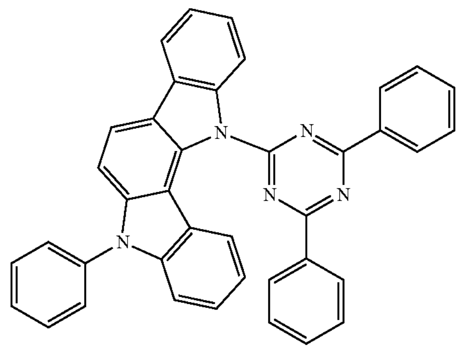
(PIC-TRZ2)
-continued
DF7
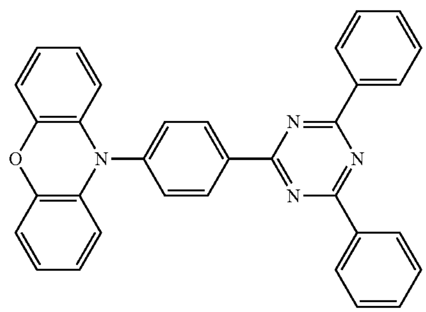
(PXZ-TRZ)
DF8
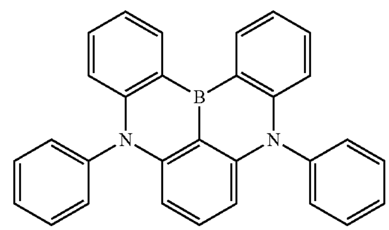
(DABNA-1)
DF9
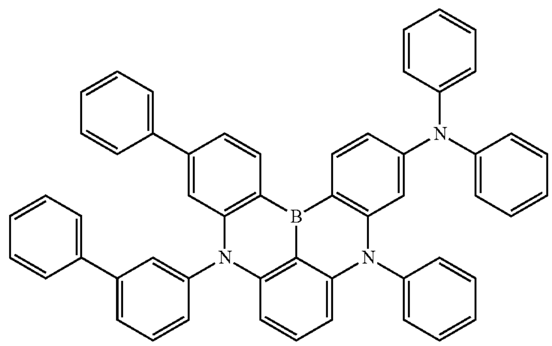
(DABNA-2)
DF10
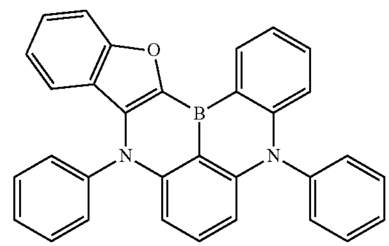
DF11
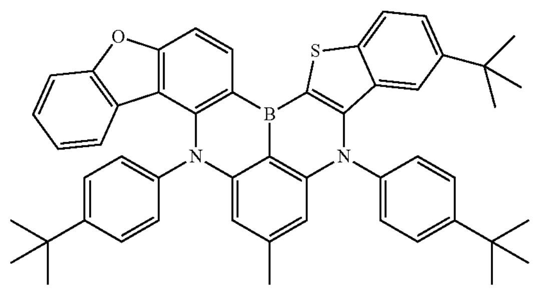

-continued

DF12

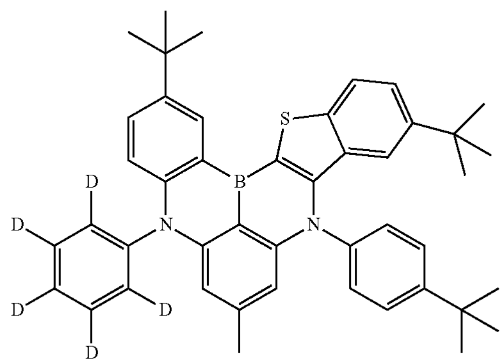

DF13

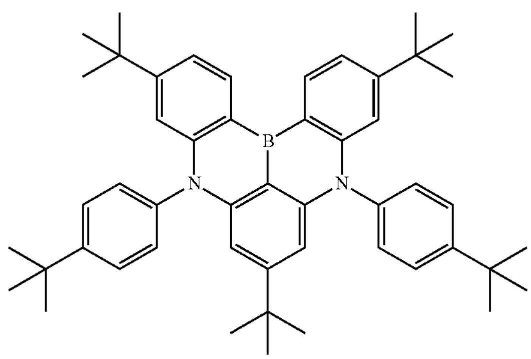

DF14

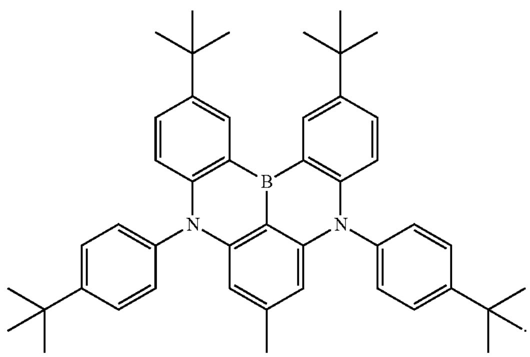

Quantum Dots

The emission layer may include quantum dots.

The term "quantum dot" as utilized herein refers to a crystal of a semiconductor compound. Quantum dots are capable of emitting light of one or more suitable emission wavelengths according to the size of the crystal. Quantum dots may also emit light of one or more suitable emission wavelengths by adjusting a ratio of atoms constituting the quantum dots.

The diameter of the quantum dot may be in a range of, for example, about 1 nm to about 10 nm.

The quantum dots may be synthesized by a wet chemical process, an organic metal chemical vapor deposition process, a molecular beam epitaxy process, or any similar process.

The wet chemical process is a method of growing a quantum dot particle crystal by mixing a precursor material with an organic solvent. When the crystal grows, the organic solvent may naturally serve as a dispersant coordinated on the surface of the quantum dot crystal and may control the growth of the crystal. Thus, the wet chemical method may be easier to perform than the vapor deposition process such as metal organic chemical vapor deposition (MOCVD) or molecular beam epitaxy (MBE)), and the growth of quantum dot particles may be controlled or selected through a low-cost process.

The quantum dot may include: a group III-VI semiconductor compound; a group II-VI semiconductor compound; a group III-V semiconductor compound; a group III-VI semiconductor compound; a group I-III-VI semiconductor compound; a group IV-VI semiconductor compound; a group IV element or compound; or any combination thereof.

Examples of the group II-VI semiconductor compound may include: a binary compound, such as CdS, CdSe, CdTe, ZnS, ZnSe, ZnTe, ZnO, HgS, HgSe, HgTe, MgSe, MgS, and/or the like; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and/or the like; a quaternary compound, such as CdZnSeS, CdZnSeTe, CdZnSTe, CdHgSeS, CdHgSeTe, CdHgSTe, HgZnSeS, HgZnSeTe, HgZnSTe, and/or the like; or any combination thereof.

Examples of the group III-V semiconductor compound may include: a binary compound, such as GaN, GaP, GaAs, GaSb, AlN, AlP, AIAs, AISb, InN, InP, InAs, InSb, and/or the like; a ternary compound, such as GaNP, GaNAs, GaNSb, GaPAs, GaPSb, AlNP, AlNAs, AlNSb, AIPAS, AIPSb, InGaP, InNP, InAlP, InNAs, InNSb, InPAs, InPSb, GaAlNP, and/or the like; a quaternary compound, such as GaAlNAs, GaAlNSb, GaAlPAs, GaAlPSb, GalnNP, GalnNAs, GalnNSb, GalnPAs, GalnPSb, InAlNP, InAlNAs, InAlNSb, InAlPAs, InAlPSb, and/or the like; or any combination thereof. In one or more embodiments, the group III-V semiconductor compound may further include a group II element. Examples of the group III-V semiconductor compound further including the group II element may include InZnP, InGaZnP, InAlZnP, and/or the like.

Examples of the group III-VI semiconductor compound may include: a binary compound, such as GaS, $Ga_2S_3$, GaSe, $Ga_2Se_3$, GaTe, InS, InSe, $In_2Se_3$, InTe, and/or the like; a ternary compound, such as $InGaS_3$, $InGaSe_3$, and/or the like; or any combination thereof.

Examples of the group I-III-VI semiconductor compound may include: a ternary compound, such as AgInS, $AgInS_2$, $AgInSe_2$, AgGaS, $AgGaS_2$, $AgGaSe_2$, CuInS, $CuInS_2$, $CuInSe_2$, $CuGaS_2$, $CuGASe_2$, $CuGaO_2$, $AgGaO_2$, $AgAlO_2$, and/or the like; a quaternary compound such as $AgInGaS_2$, $AgInGaSe_2$, and/or the like; or any combination thereof.

Examples of the group IV-VI semiconductor compound may include: a binary compound, such as SnS, SnSe, SnTe, PbS, PbSe, PbTe, and/or the like; a ternary compound, such as SnSeS, SnSeTe, SnSTe, PbSeS, PbSeTe, PbSTe, SnPbS, SnPbSe, SnPbTe, and/or the like; a quaternary compound, such as SnPbSSe, SnPbSeTe, SnPbSTe, and/or the like; or any combination thereof.

Examples of the group IV element or compound may include: a single element compound, such as Si, Ge, and/or the like; a binary compound, such as SiC, SiGe, and/or the like; or any combination thereof.

Each element included in a multi-element compound, such as the binary compound, the ternary compound, and the quaternary compound, may be present at a substantially uniform concentration or non-substantially uniform concentration in a particle. In other words, the formula represents the types (kinds) of elements included in a compound, and an atomic ratio in the compound may be different. For example, $AgInGaS_2$ may indicate $AgIn_xGa_{1-x}S_2$ (x refers to a real number from 0 to 1).

In one or more embodiments, the quantum dot may have a single structure in which the concentration of each element in the quantum dot is substantially uniform, or may have a core-shell dual structure. For example, a material included in the core and a material included in the shell may be different from each other.

The shell of the quantum dot may act as a protective layer that prevents chemical denaturation of the core to maintain semiconductor characteristics, and/or as a charging layer that imparts electrophoretic characteristics to the quantum dot. The shell may be a single layer or a multilayer structure. The interface between a core and a shell may have a concentration gradient in which the concentration of elements present in the shell decreases toward the core.

Examples of the shell of the quantum dot may include a metal oxide, a nonmetal oxide, a semiconductor compound, or a combination thereof. Examples of the metal oxide or the nonmetal oxide may include: a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound such as $MgAl_2O_4$, $CoFe_2O_4$, $NiFe_2O_4$, or $CoMn_2O_4$; or any combination thereof. As described above, examples of the semiconductor compound may include: a group III-VI semiconductor compound; a group II-VI semiconductor compound; a group III-V semiconductor compound; a group III-VI semiconductor compound; a group I-III-VI semiconductor compound; a group IV-VI semiconductor compound; or any combination thereof. Examples of the semiconductor compound may include CdS, CdSe, CdTe, ZnS, ZnSe, ZnTe, ZnSeS, ZnTeS, GaAs, GaP, GaS, GaSe, AgGaS, $AgGaS_2$, GaSb, HgS, HgSe, HgTe, InAs, InP, InGaP, InSb, AlAs, AIP, AlSb, or any combination thereof.

Each element included in a multi-element compound, such as the binary compound and the ternary compound, may be present at a substantially uniform concentration or non-substantially uniform concentration in a particle. In other words, the formula represents the types (kinds) of elements included in a compound, and an atomic ratio in the compound may be different.

The quantum dot may have a full width at half maximum (FWHM) of an emission wavelength spectrum of about 45 nm or less, for example, about 40 nm or less, for example, about 30 nm or less. When the FWHM of the quantum dot is within these ranges, color purity or color reproducibility may be enhanced or improved. In some embodiments, because light emitted through the quantum dot is emitted in all directions, the wide viewing angle may be improved, (e.g., the viewing angle of the light-emitting device may be enhanced or improved).

In some embodiments, the quantum dot(s) may be, for example, a spherical, pyramidal, multi-arm, or cubic nanoparticles, a nanotube, a nanowire, a nanofiber, or a nanoplate particle.

By adjusting the size of the quantum dot or an atomic ratio in a compound of the quantum dot, the energy band gap may be adjusted, and thus, light of one or more suitable wavelengths may be obtained in the quantum dot emission layer. Thus, by utilizing the above-described quantum dots (by utilizing quantum dots with difference sizes or varying an atomic ratio in a compound of the quantum dot), a light-emitting device that emits light of one or more suitable wavelengths may be realized. For example, the size of the quantum dot or the adjustment of the atomic ratio in a compound of the quantum dot may be selected so that red light, green light, and/or blue light can be emitted. In some embodiments, the quantum dots may be configured to emit white light by combining one or more suitable colors of light.

Electron Transport Region 140

The electron transport region may have: i) a single-layered structure including (e.g., consisting of) a single layer including (e.g., consisting of) a single material, ii) a single-layered structure consisting of a single layer including (e.g., consisting of) a plurality of different materials, or iii) a multi-layered structure including a plurality of layers including a plurality of different materials.

The electron transport region may include a buffer layer, a hole blocking layer, an electron control layer, an electron transport layer, an electron injection layer, or any combination thereof.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, in which constituent layers of each structure are sequentially stacked from the emission layer.

The electron transport region (e.g., a buffer layer, a hole blocking layer, an electron control layer, or an electron transport layer in the electron transport region) may include a metal-free compound including at least one π electron-deficient nitrogen-containing $C_1$-$C_{60}$ cyclic group.

For example, the electron transport region may include a compound represented by Formula 601:

Formula 601

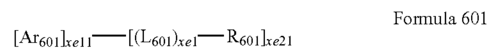

$$[Ar_{601}]_{xe11}—[(L_{601})_{xe1}—R_{601}]_{xe21}$$

wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$) ($Q_{602}$)($Q_{603}$), —C(=O)($Q_{601}$), —S(=O)$_2$($Q_{601}$), or —P(=O)($Q_{601}$)($Q_{602}$), $Q_{601}$ to $Q_{603}$ may each be the same as described in connection with $Q_1$, xe21 may be 1, 2, 3, 4, or 5, and at least one selected from among $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

For example, when xe11 in Formula 601 is 2 or more, two or more of $Ar_{601}$ may be linked to each other via a single bond.

In one or more embodiments, $Ar_{601}$ in Formula 601 may be an anthracene group unsubstituted or substituted with at least one $R_{10a}$.

In one or more embodiments, the electron transport region may include a compound represented by Formula 601-1:

Formula 601-1

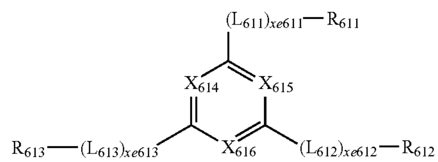

wherein, in Formula 601-1, $X_{614}$ may be N or $C(R_{614})$, $X_{615}$ may be N or $C(R_{615})$, $X_{616}$ may be N or $C(R_{616})$, and at least one selected from among $X_{614}$ to $X_{616}$ may be N, $L_{611}$ to $L_{613}$ may each be the same as described in connection with $L_{601}$, xe611 to xe613 may each be the same as described in connection with xe1, $R_{611}$ to $R_{613}$ may each be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, xe1 and xe611 to xe613 in Formulae 601 and 601-1 may each independently be 0, 1, or 2.

The electron transport region may include: at least one selected from among Compounds ET1 to ET45; 2,9-dimethyl-4,7-diphenyl-1,10-phenanthroline (BCP); 4,7-diphenyl-1,10-phenanthroline (Bphen); $Alq_3$; BAlq; TAZ; NTAZ; and/or any combination thereof:

ET1

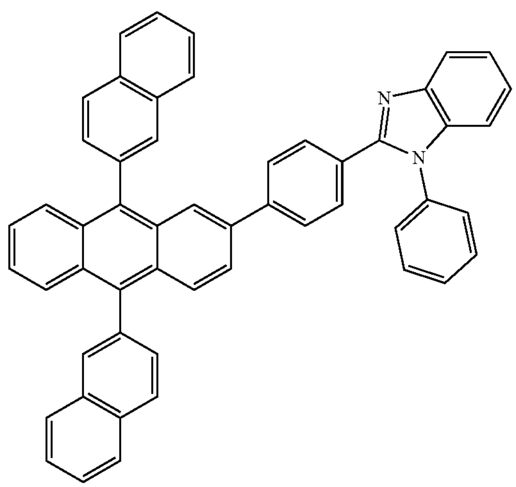

-continued

ET2

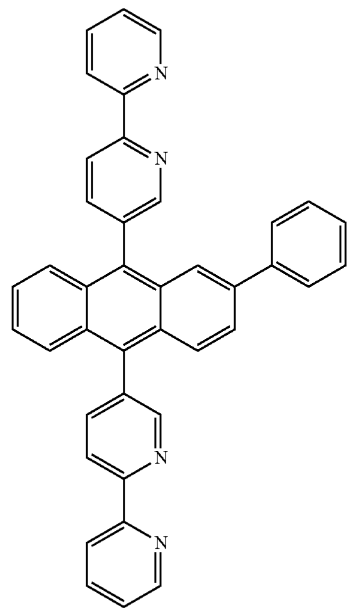

ET3

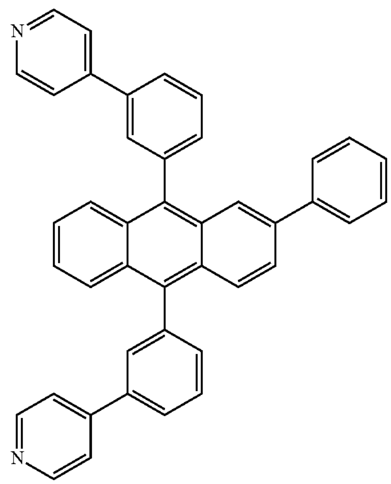

ET4

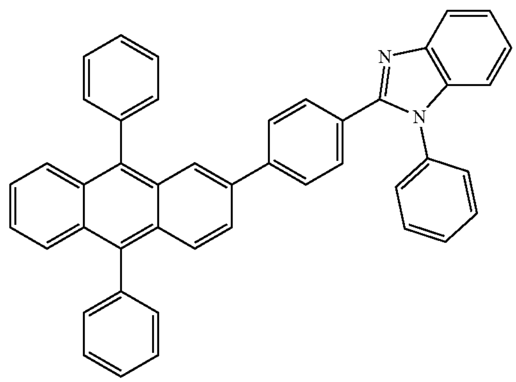

-continued
ET5
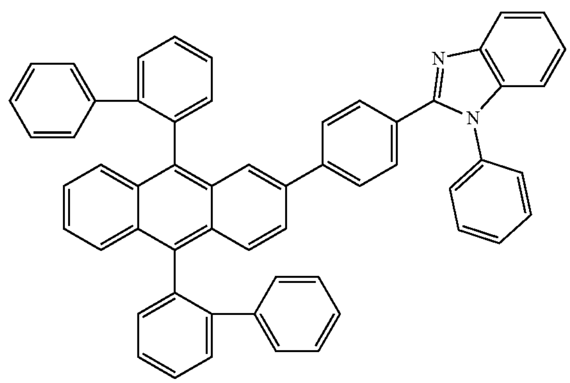
ET6
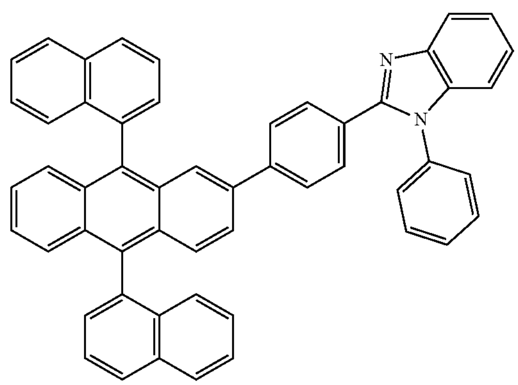
ET7
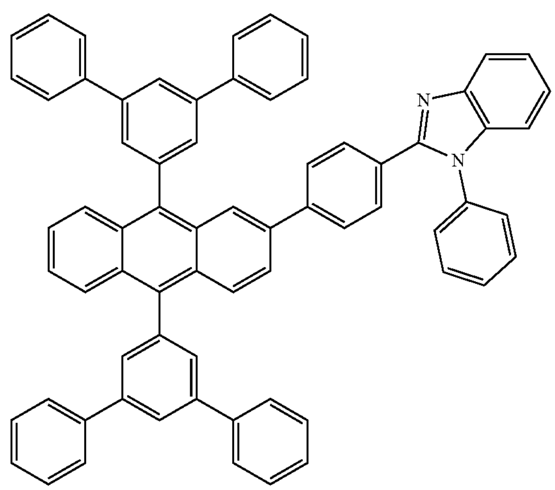
-continued
ET8
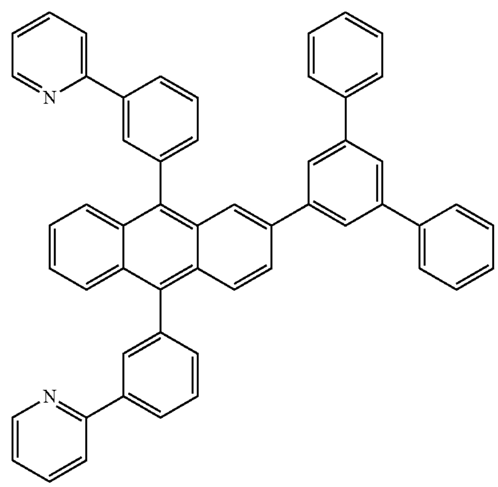
ET9
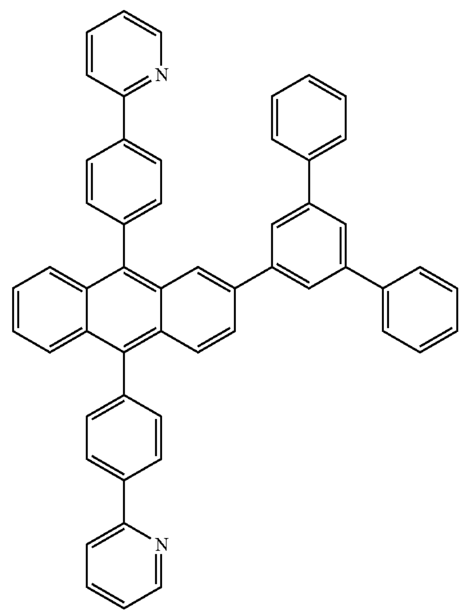

-continued
ET10
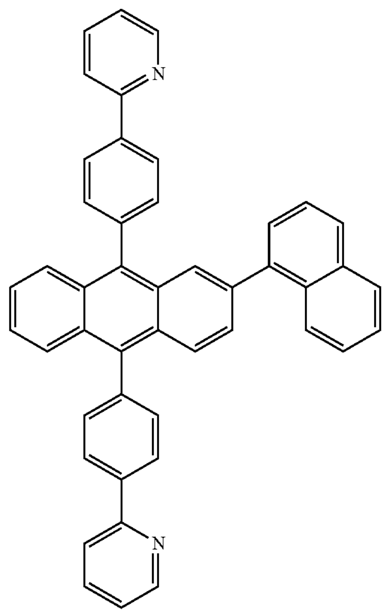
ET11
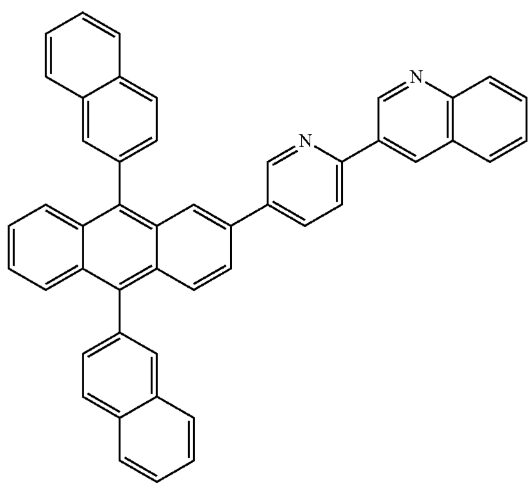
ET12
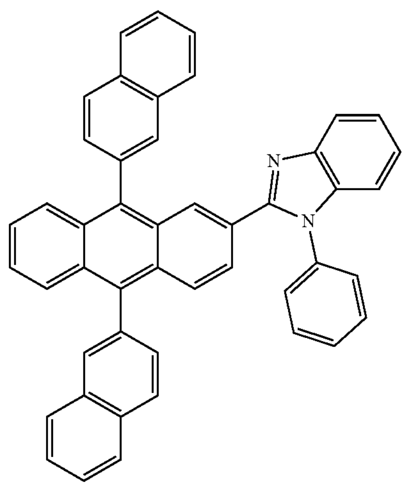
-continued
ET13
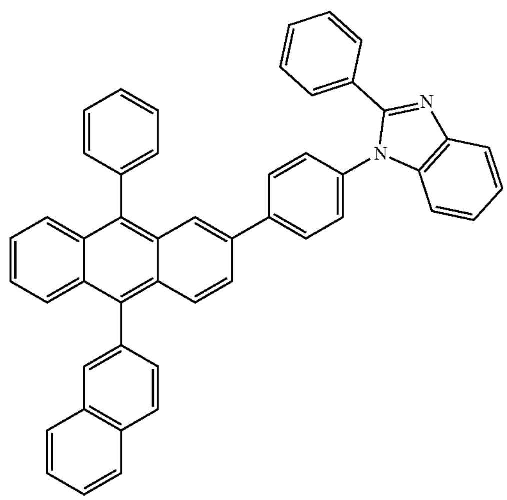
ET14
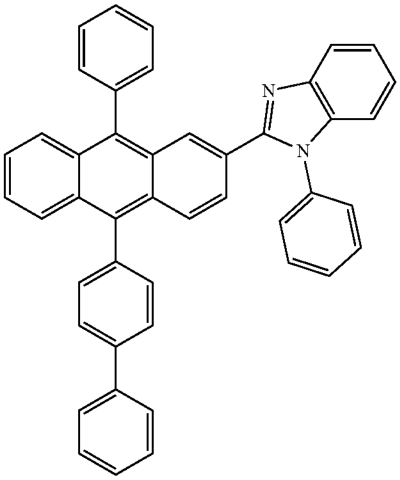
ET15
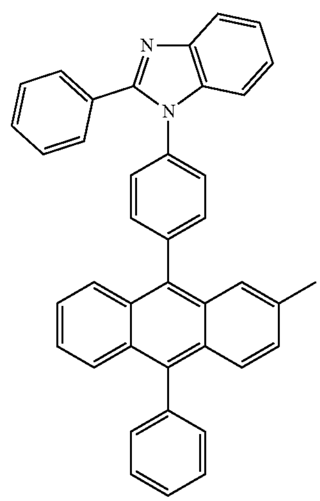

-continued
ET16
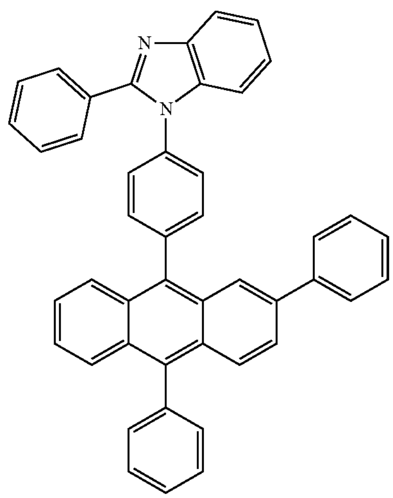
ET17
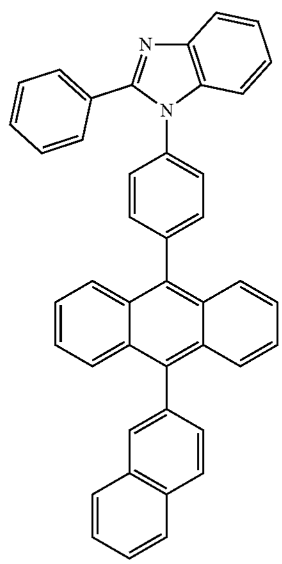
ET18
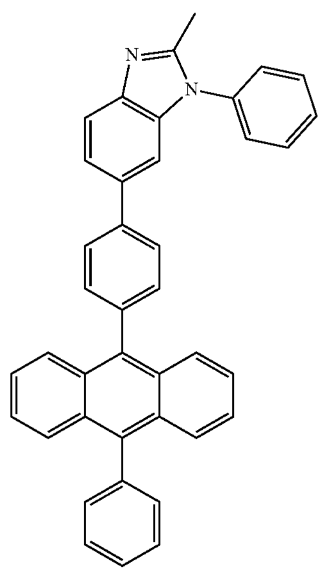
-continued
ET19
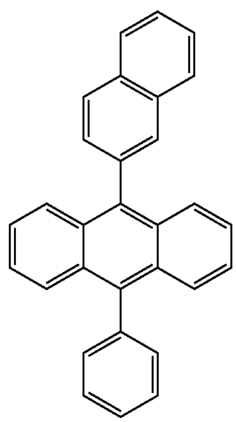
ET20
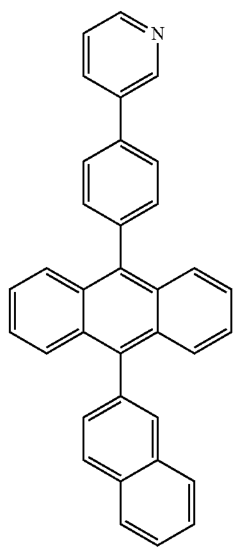
ET21
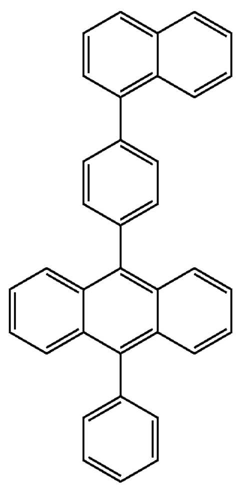

ET22
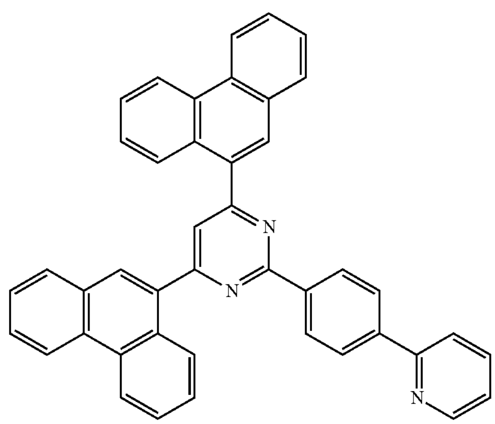
ET23
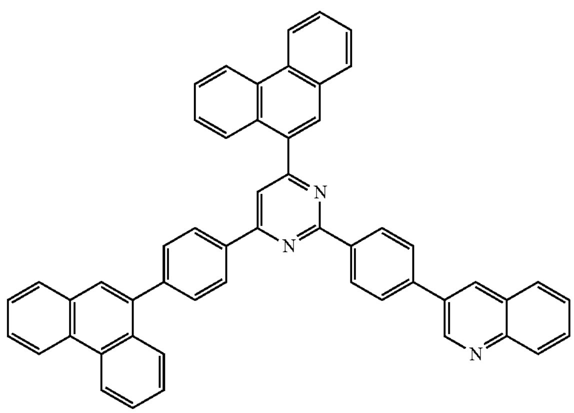
ET24
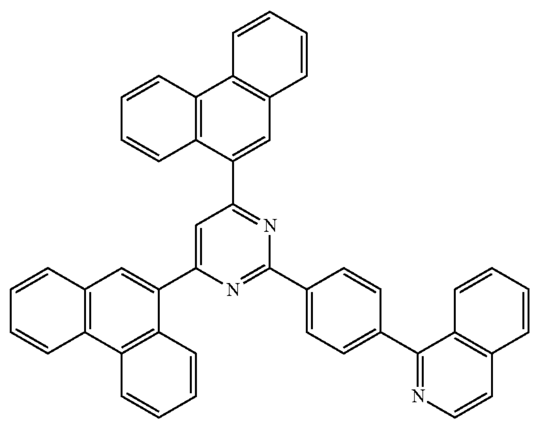
ET25
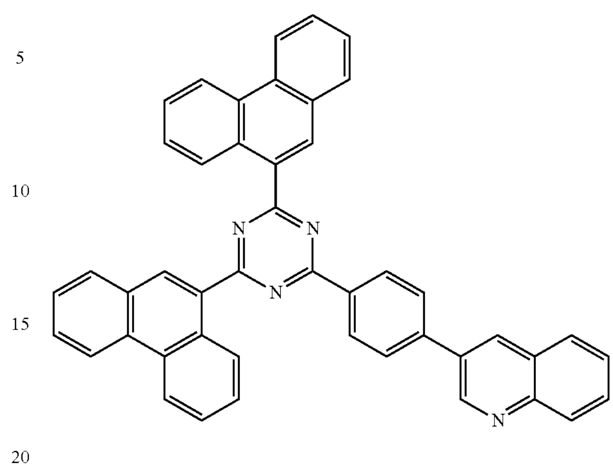
ET26
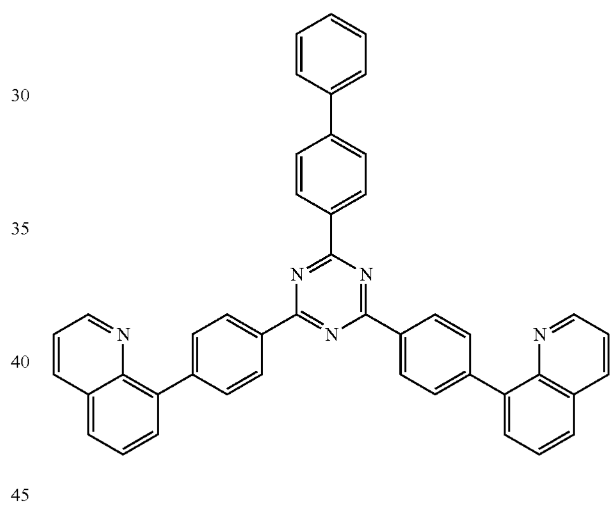
ET27
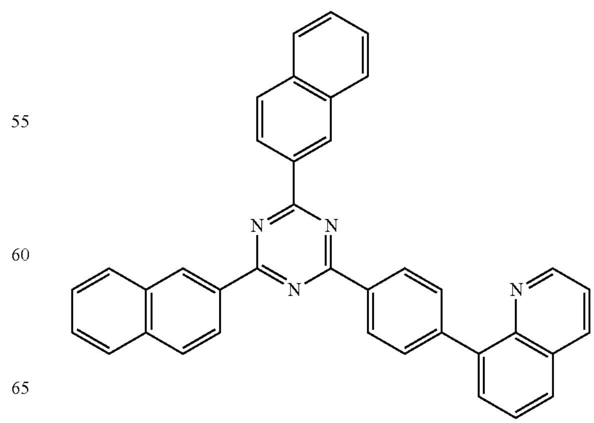

ET28
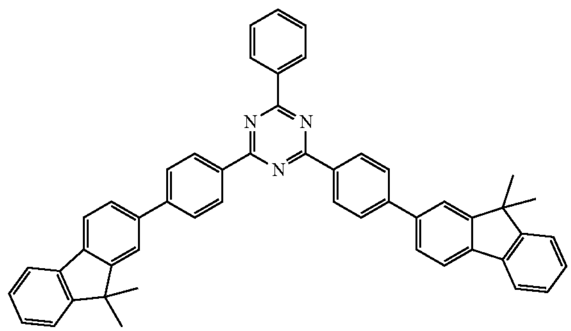
ET29
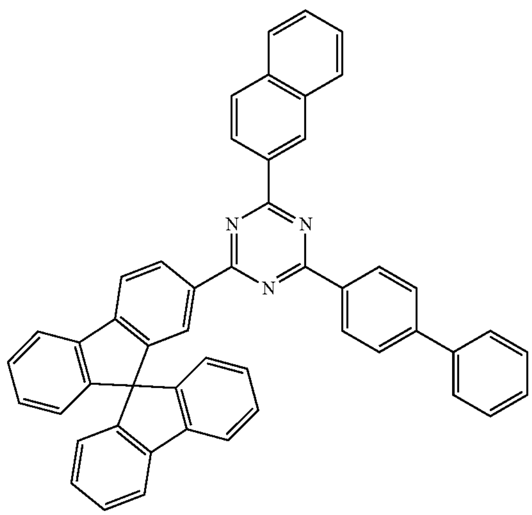
ET30
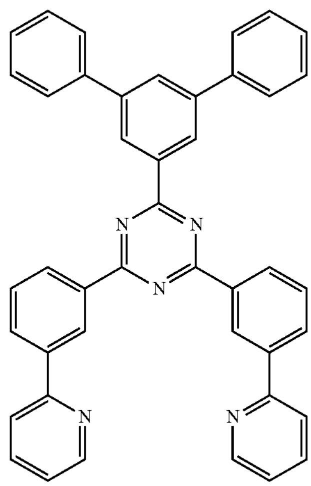
ET31
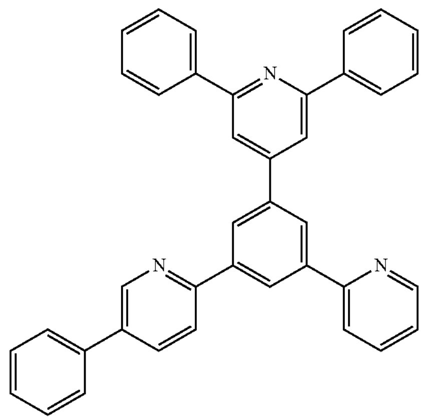
ET32
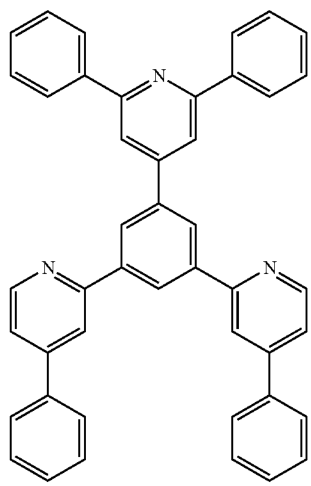
ET33
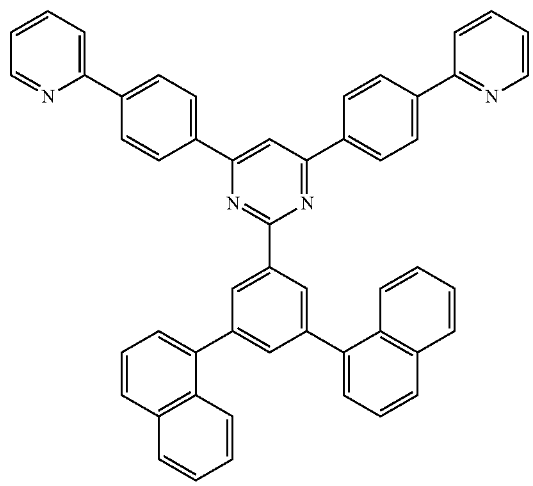

-continued
ET34
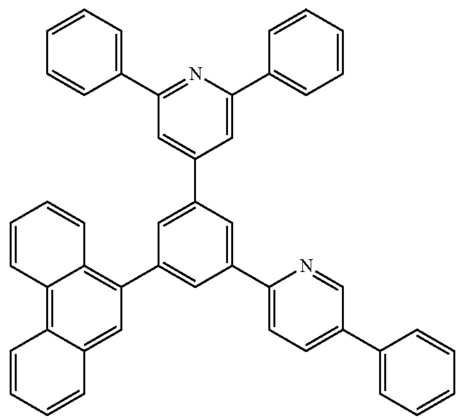
ET35
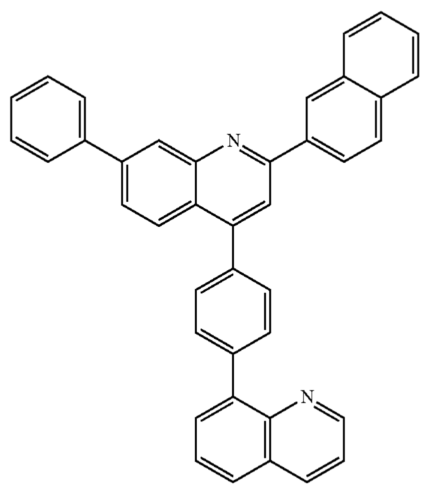
ET36
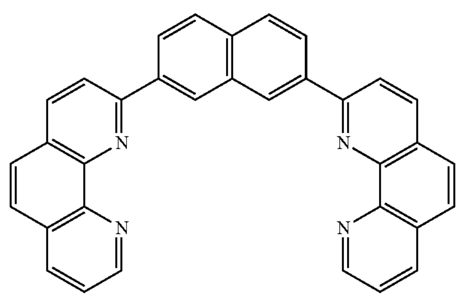
ET37
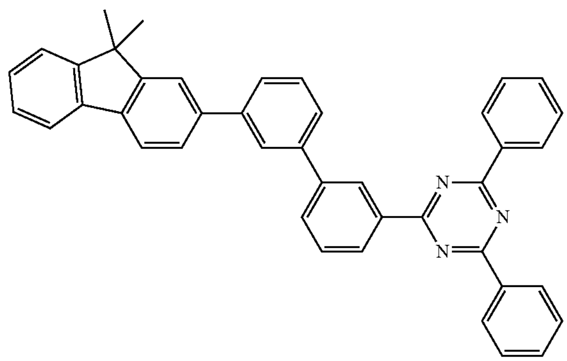
-continued
ET38
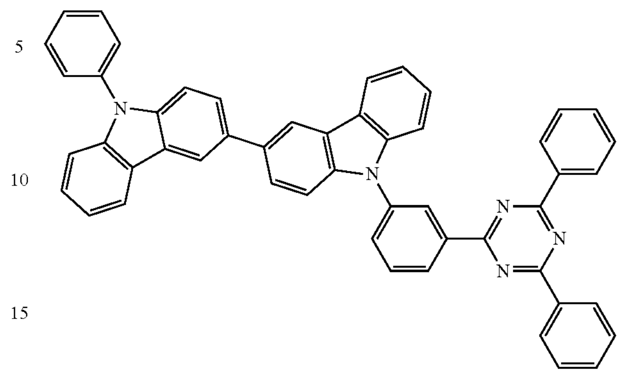
ET39
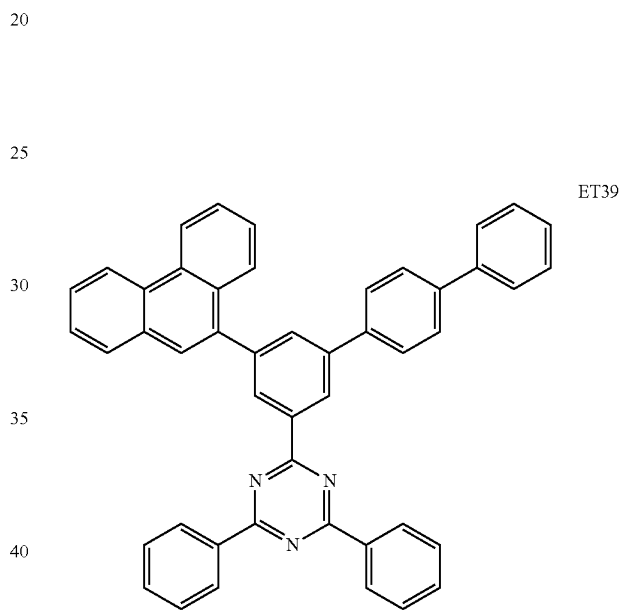
ET40
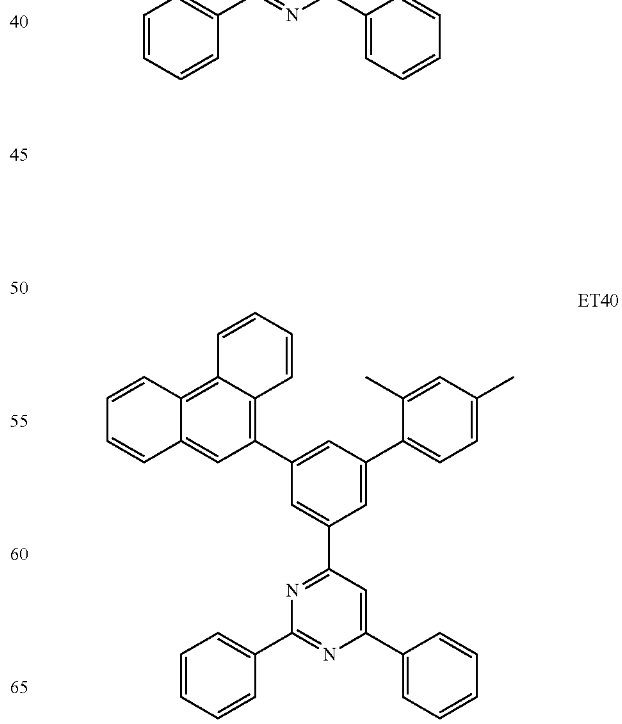
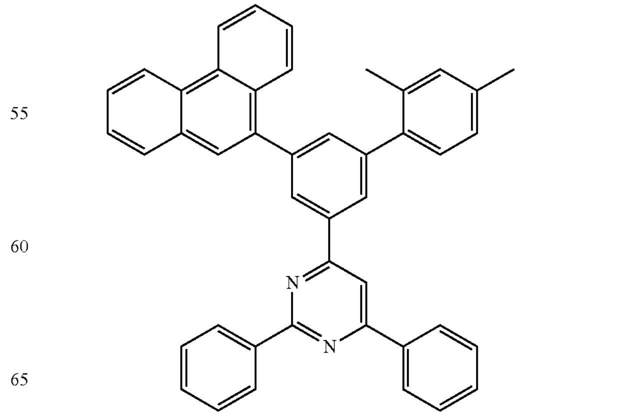

ET41
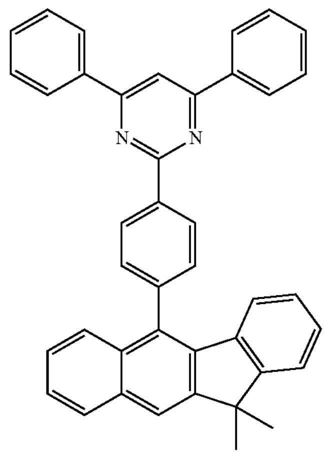
ET42
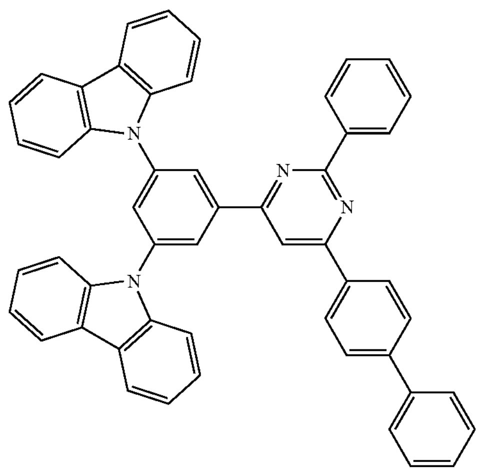
ET43
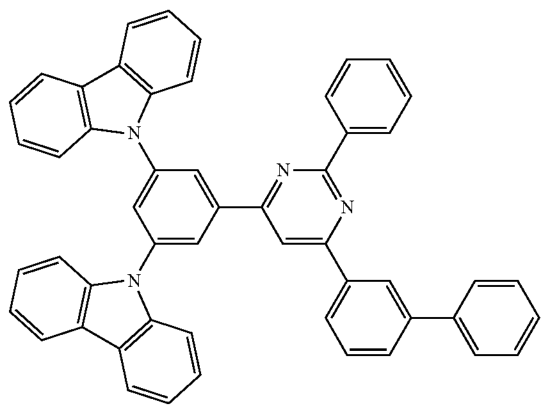
ET44
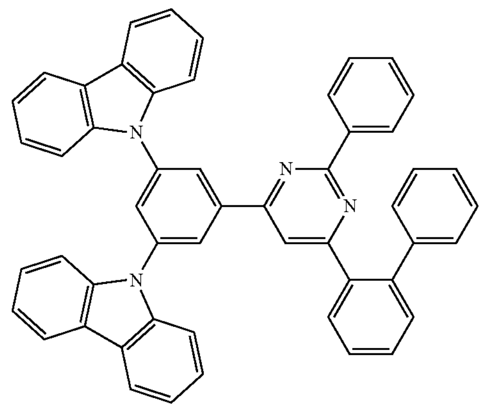
ET45
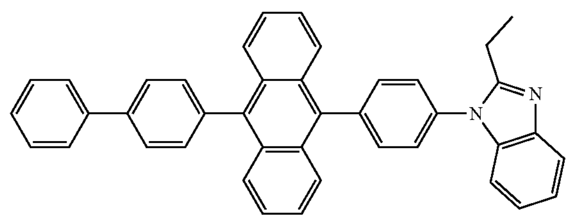
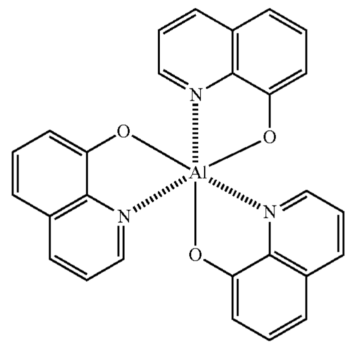
$Alq_3$
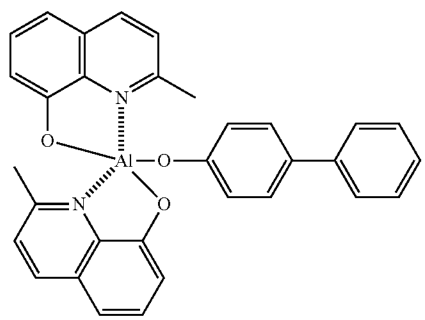
BAlq
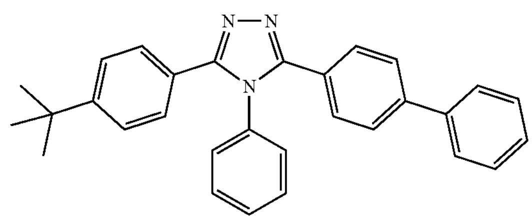
TAZ -continued

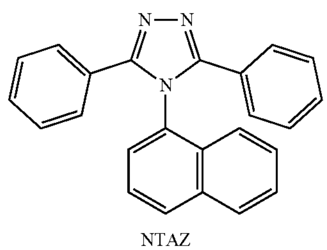

NTAZ

The thickness of the electron transport region may be in a range of about 100 Å to about 5,000 Å, for example, about 160 Å to about 4,000 Å. When the electron transport region includes a buffer layer, a hole blocking layer, an electron control layer, an electron transport layer, or any combination thereof, the thickness of the buffer layer, the hole blocking layer, or the electron control layer may be in a range of about 20 Å to about 1,000 Å, for example, about 30 Å to about 300 Å, and the thickness of the electron transport layer may be in a range of about 100 Å to about 1,000 Å, for example, about 150 Å to about 500 Å. When the thicknesses of the buffer layer, the hole blocking layer, the electron control layer, the electron transport layer, and/or the electron transport region are within these ranges, satisfactory electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a Li ion, a Na ion, a K ion, a Rb ion, or a Cs ion, and the metal ion of an alkaline earth metal complex may be a Be ion, a Mg ion, a Ca ion, a Sr ion, or a Ba ion. Each ligand coordinated with the metal ion of the alkali metal complex and the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, the metal-containing material may include a Li complex. The Li complex may include, for example, Compound ET-D1 (LiQ) or ET-D2:

ET-D1

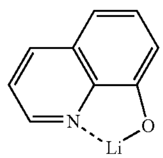

-continued

ET-D2

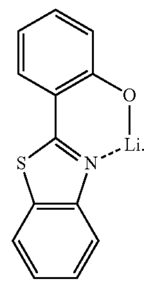

The electron transport region may include an electron injection layer that facilitates the injection of electrons from the second electrode 150. The electron injection layer may be in direct contact with the second electrode 150.

The electron injection layer may have: i) a single-layered structure including (e.g., consisting of) a single layer including (e.g., consisting of) a single material; ii) a single-layered structure including (e.g., consisting of) a single layer including a plurality of different materials; or iii) a multi-layered structure having a plurality of layers including a plurality of different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may include oxides, halides (e.g., fluorides, chlorides, bromides, iodides, and/or the like), tellurides, or any combination thereof of each of the alkali metal, the alkali earth metal, and the rare earth metal.

The alkali metal-containing compound may include alkali metal oxides such as $Li_2O$, $Cs_2O$, $K_2O$, and/or the like, alkali metal halides such as LiF, NaF, CsF, KF, LiI, NaI, CsI, KI, and/or the like, or any combination thereof. The alkaline earth metal-containing compound may include alkaline earth metal compounds, such as BaO, SrO, CaO, $Ba_xSr_{1-x}O$ (wherein x is a real number satisfying 0<x<1), $Ba_xCa_{1-x}O$ (wherein x is a real number satisfying 0<x<1), and/or the like. The rare earth metal-containing compound may include $YbF_3$, $ScF_3$, $SC_2O_3$, $Y_2O_3$, $Ce_2O_3$, $GdF_3$, $TbF_3$, $YbI_3$, $ScI_3$, $TbI_3$, or any combination thereof. In one or more embodiments, the rare earth metal-containing compound may include lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $HO_2Te_3$, $Er_2Te_3$, $Tm_2Te_3$, $Yb_2Te_3$, $Lu_2Te_3$, and/or the like.

The alkali metal complex, the alkaline earth metal complex, and the rare earth metal complex may include: i) at least one selected from among ions of the alkali metal, the alkaline earth metal, and the rare earth metal; and ii) a ligand bonded to the metal ion, e.g., hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenyl benzimidazole, hydroxyphenylbenzothiazole, bipyridine, phenanthroline, cyclopentadiene, and/or any combination thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above.

In one or more embodiments, the electron injection layer may include (e.g., consist of) i) an alkali metal-containing compound (e.g., an alkali metal halide), ii) a) an alkali metal-containing compound (e.g., an alkali metal halide); and b) an alkali metal, an alkaline earth metal, a rare earth metal, or any combination thereof. For example, the electron injection layer may be a KI:Yb co-deposited layer, an RbI:Yb co-deposited layer, a LiF:Yb co-deposited layer, and/or the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth-metal complex, the rare earth metal complex, or any combination thereof may be uniformly or non-uniformly dispersed in a matrix including the organic material.

The thickness of the electron injection layer may be in a range of about 1 Å to about 100 Å, for example, about 3 Å to about 90 Å. When the thickness of the electron injection layer is within these ranges, satisfactory electron injection characteristics may be obtained without a substantial increase in driving voltage.

Second Electrode 150

The second electrode 150 may be arranged on the electron transport region 140. The second electrode 150 may be a cathode, which is an electron injection electrode. In this case, a material for forming the second electrode 150 may be a material having a low work function, for example, a metal, an alloy, an electrically conductive compound, or any combination thereof. The term "low work function material" as utilized herein refers to a substance (e.g., a metal or metal alloy) that requires a relatively small, or low, amount of energy to emit electrons from its surface.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure or a multi-layered structure including a plurality of layers.

Capping Layer

A first capping layer may be arranged outside (e.g., on) the first electrode 110, and/or a second capping layer may be arranged outside (e.g., on) the second electrode 150. For example, the light-emitting device 10 may have a structure in which the first capping layer, the first electrode 110, the interlayer, and the second electrode 150 are sequentially stacked in the stated order, a structure in which the first electrode 110, the interlayer, the second electrode 150, and the second capping layer are sequentially stacked in the stated order, or a structure in which the first capping layer, the first electrode 110, the interlayer, the second electrode 150, and the second capping layer are sequentially stacked in the stated order.

Light generated in the emission layer 130 of the light-emitting device 10 may pass through the first electrode 110, which is a semi-transmissive electrode or a transmissive electrode), and through the first capping layer to the outside. Light generated in the emission layer 130 of the light-emitting device 10 may pass through the second electrode 150, which is a semi-transmissive electrode or a transmissive electrode), and through the second capping layer to the outside.

The first capping layer and the second capping layer may increase external luminous efficiency based on the principle of constructive interference. Accordingly, the light extraction efficiency of the light-emitting device 10 may be enhanced or increased, thus improving the luminous efficiency of the light-emitting device 10.

Each of the first capping layer and the second capping layer may include a material having a refractive index of about 1.2 or higher (at 530 nm).

The first capping layer and the second capping layer may each independently be an organic capping layer including an organic material, an inorganic capping layer including an inorganic material, or an organic-inorganic composite capping layer including an organic material and an inorganic material.

At least one selected from among the first capping layer and/or the second capping layer may each independently include a carbocyclic compound, a heterocyclic compound, an amine group-containing compound, a porphine derivative, a phthalocyanine derivative, a naphthalocyanine derivative, an alkali metal complex, an alkaline earth metal complex, or any combination thereof. The carbocyclic compound, the heterocyclic compound, and the amine group-containing compound may optionally be substituted with a substituent including O, N, S, Se, Si, F, Cl, Br, I, or any combination thereof. In one or more embodiments, at least one selected from among the first capping layer and/or the second capping layer may each independently include an amine group-containing compound.

For example, at least one selected from among the first capping layer and/or the second capping layer may each independently include the compound represented by Formula 201, the compound represented by Formula 202, or any combination thereof.

In one or more embodiments, at least one selected from among the first capping layer and/or the second capping layer may each independently include at least one selected from among Compounds HT28 to HT33, Compounds CP1 to CP6, β-NPB, and/or any combination thereof:

CP1

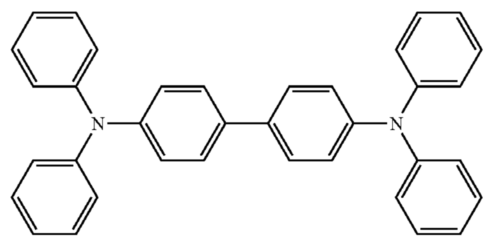

-continued

CP2

CP3

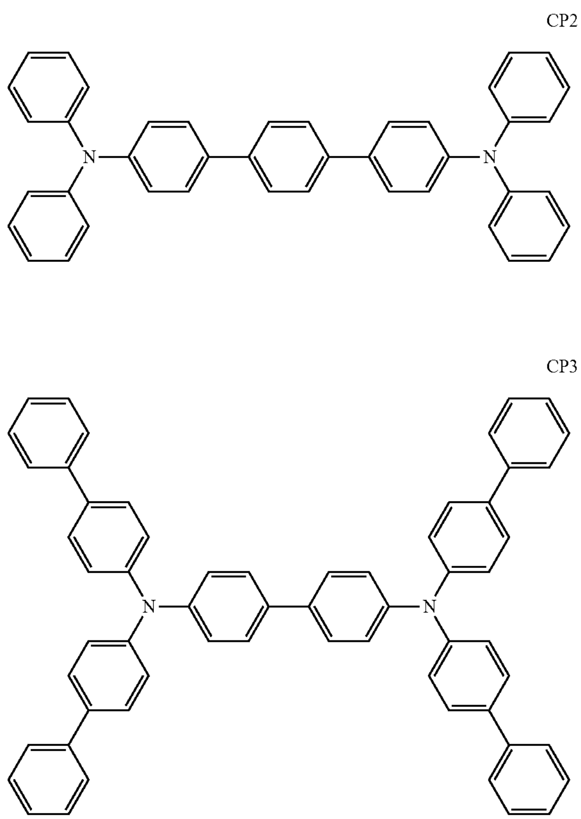

CP4

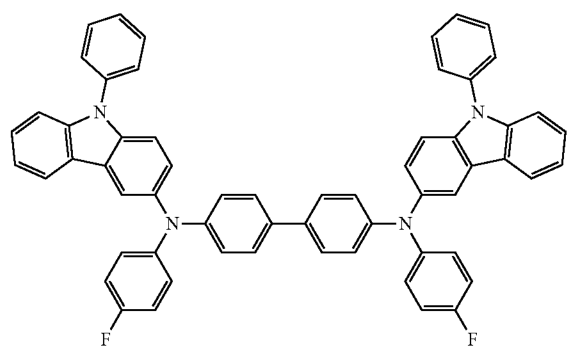

CP5

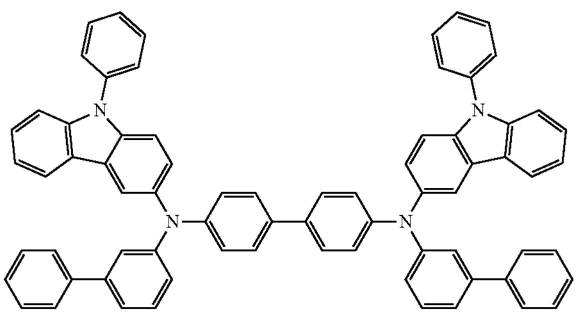

-continued

CP6

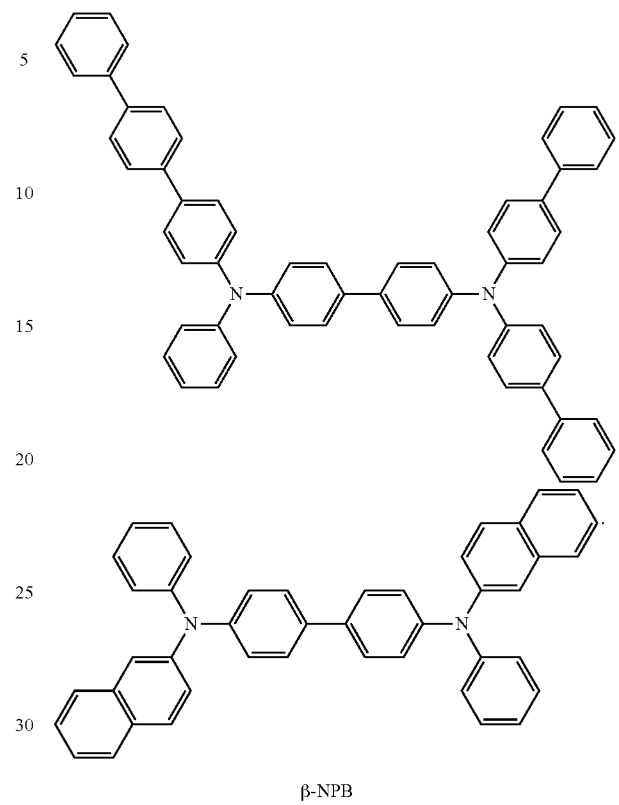

β-NPB

Film

The electronic apparatus may further include a film. The film may be, for example, an optical member (or a light control refers to) (for example, a color filter, a color conversion member, a capping layer, a light extraction efficiency enhancement layer, a selective light absorbing layer, a polarizing layer, a quantum dot-containing layer, or like), a light-shielding member (for example, a light reflective layer, a light absorbing layer, and/or the like), a protective member (for example, an insulating layer, a dielectric layer, and/or the like).

Electronic Apparatus

The light-emitting device may be included in one or more suitable electronic apparatuses. For example, an electronic apparatus including the light-emitting device may be a light-emitting apparatus, an authentication apparatus, and/or the like.

The electronic apparatus (e.g., a display device) may further include, in addition to the light-emitting device, i) a color filter, ii) a color conversion layer, or iii) a color filter and a color conversion layer. The color filter and/or the color conversion layer may be arranged on at least one traveling direction of light emitted from the light-emitting device. For example, the light emitted from the light-emitting device may be blue light or white light. The light-emitting device may be referred to the description thereof provided above. In one or more embodiments, the color conversion layer may include quantum dots. The quantum dot may be, for example, the quantum dot as described herein.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the plurality of sub-pixel areas.

A pixel-defining film may be arranged among the plurality of sub-pixel areas to define each sub-pixel area.

The color filter may further include a plurality of color filter areas and light-shielding patterns arranged among the color filter areas, and the color conversion layer may further include a plurality of color conversion areas and light-shielding patterns arranged among the color conversion areas.

The plurality of color filter areas (or the plurality of color conversion areas) may include: a first area emitting first color light; a second area emitting second color light; and/or a third area emitting third color light, in which the first color light, the second color light, and/or the third color light may have different maximum emission wavelengths. For example, the first color light may be red light, the second color light may be green light, and the third color light may be blue light. For example, the plurality of color filter areas (or the plurality of color conversion areas) may include quantum dots. In particular, the first area may include red quantum dots, the second area may include green quantum dots, and the third area may not include (e.g., may exclude) a quantum dot. For the quantum dot, refer to the description thereof provided herein. The first area, the second area, and/or the third area may each further include a scatter.

For example, the light-emitting device may be to emit first light, the first area may be to absorb the first light to emit 1-1 color light, the second area may be to absorb the first light to emit 2-1 color light, and the third area may be to absorb the first light to emit 3-1 color light. In this regard, the 1-1 color light, the 2-1 color light, and the 3-1 color light may have different maximum emission wavelengths. In one or more embodiments, the first light may be blue light, the 1-1 color light may be red light, the 2-1 color light may be green light, and the 3-1 color light may be blue light.

The electronic apparatus may further include a thin-film transistor, in addition to the light-emitting device as described above. The thin-film transistor may include a source electrode, a drain electrode, and an active layer, in which any one of the source electrode and the drain electrode may be electrically connected to any one of the first electrode and the second electrode of the light-emitting device.

The thin-film transistor may further include a gate electrode, a gate insulating film, and/or the like.

The active layer may include crystalline silicon, amorphous silicon, an organic semiconductor, an oxide semiconductor, and/or the like.

The electronic apparatus may further include an encapsulation unit for encapsulating the light-emitting device. The encapsulation unit may be arranged between the color filter and/or the color conversion layer and the light-emitting device. The encapsulation unit allows light to pass to the outside from the light-emitting device and prevent or reduce the air and moisture to permeate into the light-emitting device at the same time. The encapsulation unit may be an encapsulation substrate including a transparent glass substrate or a plastic substrate. The encapsulation unit may be a thin-film encapsulation layer including at least one of an organic layer and an inorganic layer. When the encapsulation unit is a thin film encapsulation layer, the electronic apparatus may be flexible.

In addition to the color filter and/or the color conversion layer, one or more suitable functional layers may be further arranged on the encapsulation unit depending on the utilize of the electronic apparatus. Examples of the functional layers may include a touch screen layer, a polarizing layer, and/or the like. The touch screen layer may be a resistive touch screen layer, a capacitive touch screen layer, or an infrared beam touch screen layer. The authentication apparatus may be, for example, a biometric authentication apparatus that identifies an individual by utilizing biometric information (e.g., a fingertip, a pupil, and/or the like).

The authentication apparatus may further include a biometric information collector, in addition to the light-emitting device as described above.

The electronic apparatus may be applied to one or more suitable displays, a light source, lighting, a personal computer (e.g., a mobile personal computer), a mobile phone, a digital camera, an electronic note, an electronic dictionary, an electronic game console, a medical device (e.g., an electronic thermometer, a blood pressure meter, a glucometer, a pulse measurement device, a pulse wave measurement device, an electrocardiogram display, an ultrasonic diagnostic device, or an endoscope display device), a fish finder, one or more suitable measurement devices, gauges (e.g., gauges of an automobile, an airplane, and a ship), a projector, and/or the like.

Electronic Equipment

The light-emitting device may be included in one or more suitable electronic equipment.

For example, electronic equipment including the light-emitting device may be at least one selected from among a flat panel display, a curved display, a computer monitor, a medical monitor, a television, a billboard, an indoor or outdoor lighting and/or signaling light, a head-up display, a fully or partially transparent display, a flexible display, a rollable display, a foldable display, a stretchable display, a laser printer, a telephone, a mobile phone, a tablet, a phablet, a personal digital assistant (PDA), a wearable device, a laptop computer, a digital camera, a camcorder, a viewfinder, a microdisplay, a 3D display, a virtual or augmented reality display, a vehicle, a video wall including multiple displays tiled together, a theater or stadium screen, a phototherapy device, a signboard, and/or combinations thereof.

Because the light-emitting device has excellent or suitable effects in terms of luminous efficiency, long lifespan, and/or the like, electronic equipment including the light-emitting device may have characteristics, such as high luminance, high resolution, and low power consumption.

Figure 2:
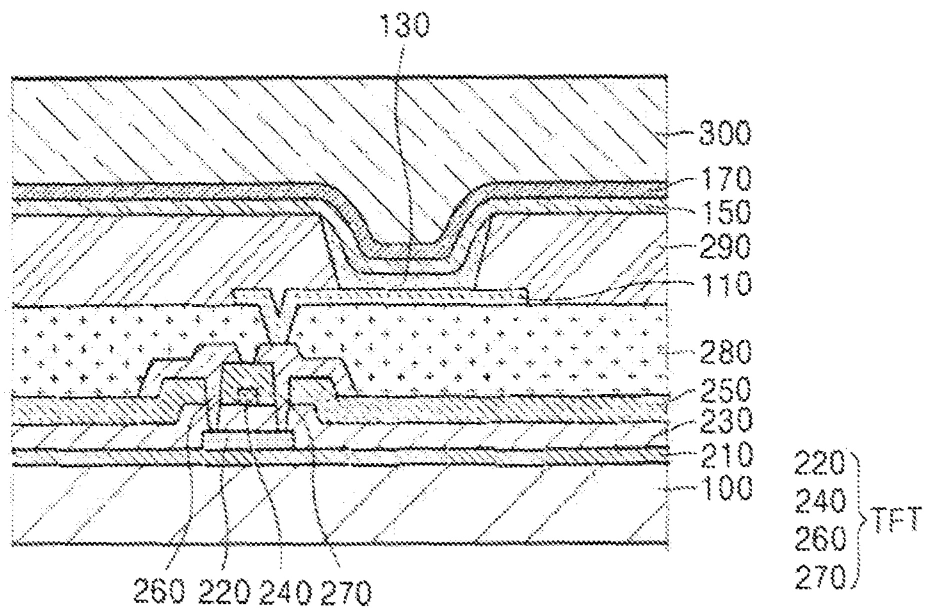
FIG. 2 is a schematic cross-sectional view of an electronic apparatus according to one or more embodiments of the present disclosure.
Figure 3:
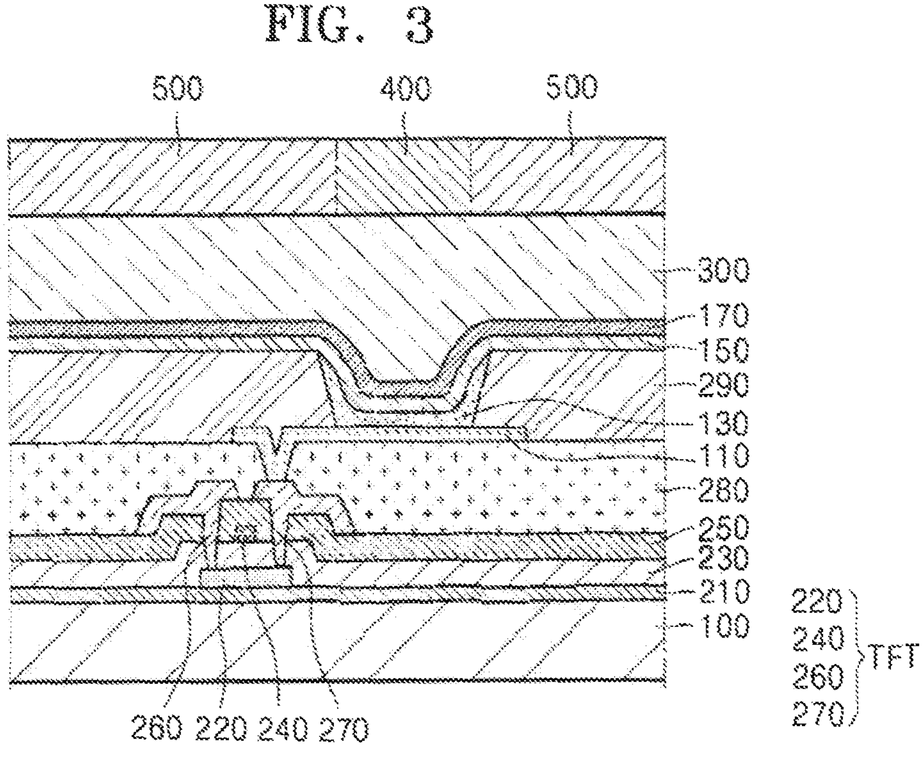
FIG. 3 is a schematic cross-sectional view of an electronic apparatus according to one or more embodiments of the present disclosure.

Descriptions of FIGS. 2 and 3

FIG. 2 is a cross-sectional view of an electronic apparatus according to one or more embodiments.

The electronic apparatus of FIG. 2 includes a substrate 100, a thin-film transistor (TFT), a light-emitting device, and an encapsulation unit 300.

The substrate 100 may be a flexible substrate, a glass substrate, or a metal substrate. A buffer layer 210 may be arranged on the substrate 100. The buffer layer 210 may prevent or reduce penetration of impurities through the substrate 100 and may provide a flat surface on the substrate 100.

The TFT may be arranged on the buffer layer 210. The TFT may include an active layer 220, a gate electrode 240, a source electrode 260, and a drain electrode 270.

The active layer 220 may include an inorganic semiconductor such as silicon or polysilicon, an organic semiconductor, or an oxide semiconductor, and may include a source region, a drain region, and a channel region.

A gate insulating film 230 for insulating the active layer 220 from the gate electrode 240 may be arranged on the active layer 220, and the gate electrode 240 may be arranged on the gate insulating film 230.

An interlayer insulating film 250 may be arranged on the gate electrode 240. The interlayer insulating film 250 may be arranged between the gate electrode 240 and the source electrode 260 and between the gate electrode 240 and the drain electrode 270, to provide insulation therebetween.

The source electrode 260 and the drain electrode 270 may be arranged on the interlayer insulating film 250. The interlayer insulating film 250 and the gate insulating film 230 may be formed to expose the source region and the drain region of the active layer 220, and the source electrode 260 and the drain electrode 270 may be arranged in contact with the exposed portions of the source region and the drain region of the active layer 220.

Such a TFT may be electrically connected to a light-emitting device to drive the light-emitting device, and may be covered and protected by a passivation layer 280. The passivation layer 280 may include an inorganic insulating film, an organic insulating film, or a combination thereof. A light-emitting device may be provided on the passivation layer 280. The light-emitting device may include the first electrode 110, the interlayer, and the second electrode 150.

The first electrode 110 may be arranged on the passivation layer 280. The passivation layer 280 may be arranged to expose a portion of the drain electrode 270, not fully covering the drain electrode 270, and the first electrode 110 may be arranged to be connected to the exposed portion of the drain electrode 270.

A pixel defining layer 290 including an insulating material may be arranged on the first electrode 110. The pixel defining layer 290 may expose a certain region of the first electrode 110, and an interlayer 130 may be formed in the exposed region of the first electrode 110. The pixel defining layer 290 may be a polyimide-based organic film or a polyacrylic organic film. In one or more embodiments, at least some layers of the interlayer may extend to the upper portion of the pixel-defining layer 290 and may be arranged in the form of a common layer(s).

The second electrode 150 may be arranged on the interlayer, and a capping layer 170 may be additionally formed on the second electrode 150. The capping layer 170 may be formed to cover the second electrode 150.

The encapsulation unit 300 may be arranged on the capping layer 170. The encapsulation unit 300 may be arranged on a light-emitting device to protect the light-emitting device from moisture and/or oxygen. The encapsulation unit 300 may include:

an inorganic film including silicon nitride ($SiN_x$), silicon oxide ($SiO_x$), indium tin oxide (ITO), indium zinc oxide (IZO), or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (e.g., polymethyl methacrylate, polyacrylic acid, and/or the like), an epoxy-based resin (e.g., aliphatic glycidyl ether (AGE) and/or the like), or any combination thereof; or a combination of the inorganic film and the organic film.

FIG. 3 is a cross-sectional view of an electronic apparatus according to one or more embodiments.

The electronic apparatus of FIG. 3 is the same as the electronic apparatus of FIG. 2, except that a light-shielding pattern 500 and a functional region 400 are additionally arranged on the encapsulation unit 300. The functional region 400 may be i) a color filter area, ii) a color conversion area, or iii) a combination of the color filter area and the color conversion area. In one or more embodiments, the light-emitting device included in the electronic apparatus of FIG. 3 may be a tandem light-emitting device.

Figure 4:
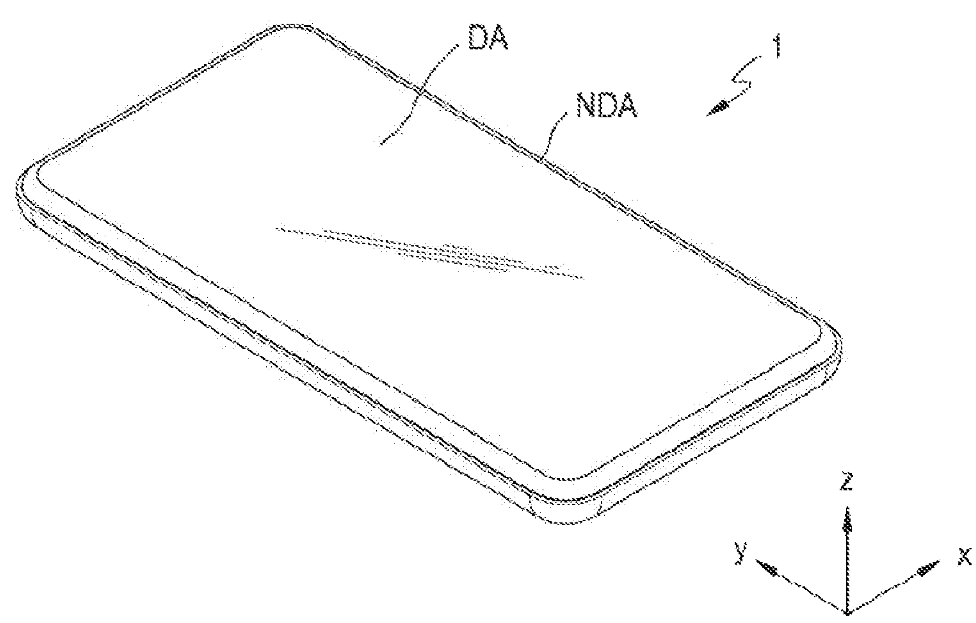
FIG. 4 is a schematic perspective view of electronic equipment including a light-emitting device, according to one or more embodiments of the present disclosure.

Description of FIG. 4

FIG. 4 is a schematic perspective view of electronic equipment 1 including a light-emitting device according to one or more embodiments. The electronic equipment 1 may be, as an apparatus that displays a moving image or still image, portable electronic equipment, such as a mobile phone, a smart phone, a tablet personal computer (PC), a mobile communication terminal, an electronic notebook, an electronic book, a portable multimedia player (PMP), a navigation, or a ultra-mobile PC (UMPC), as well as: one or more suitable products, such as a television, a laptop, a monitor, a billboard, or an Internet of things (IoT); or a part thereof. In some embodiments, the electronic equipment 1 may be: a wearable device, such as a smart watch, a watch phone, a glasses-type or kind display, or a head mounted display (HMD); or a part of the wearable device. However, embodiments of the disclosure are not limited thereto. For example, the electron equipment 1 may be a dashboard of a vehicle, a center fascia of a vehicle, a center information display (CID) arranged on a dashboard of a vehicle, a room mirror display that replaces a side mirror of a vehicle, an entertainment display for the rear seat of a vehicle or a display arranged on the back of the front seat, a head up display (HUD) installed in the front of a vehicle or projected on a front window glass, or a computer generated hologram augmented reality head up display (CGH AR HUD). FIG. 4 illustrates a case in which the electronic equipment 1 is a smart phone for convenience of explanation.

The electronic equipment 1 may include a display area DA and a non-display area NDA outside the display area DA. The electronic equipment 1 may implement an image through an array of a plurality of pixels that are two-dimensionally arranged in the display area DA.

The non-display area NDA is an area that does not display an image, and may entirely surround the display area DA. On the non-display area NDA, a driver for providing electrical signals and/or power to display devices arranged on the display area DA may be arranged. On the non-display area NDA, a pad, which is an area to which an electronic element, a printing circuit board, and/or the like may be electrically connected, may be arranged.

In the electronic equipment 1, a length in the x-axis direction and a length in the y-axis direction may be different from each other. In one or more embodiments, as illustrated in FIG. 4, the length in the x-axis direction may be shorter than the length in the y-axis direction. In one or more embodiments, the length in the x-axis direction may be the same as the length in the y-axis direction. In one or more embodiments, the length in the x-axis direction may be longer than the length in the y-axis direction.

Descriptions of FIGS. 5 and 6A to 6C

Figure 5:
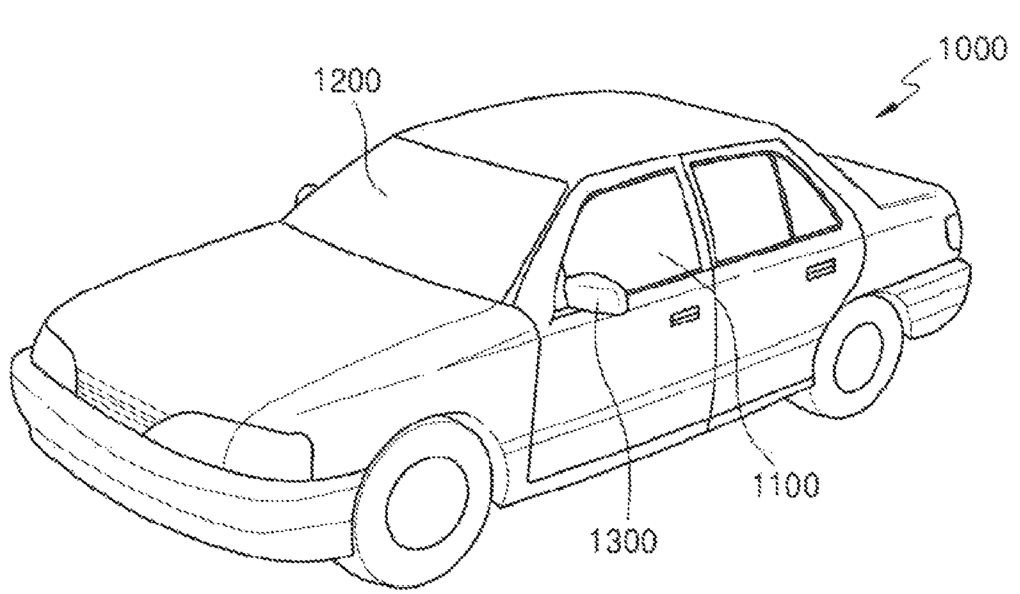
FIG. 5 is a schematic perspective view illustrating the exterior of a vehicle.
Figure 6A:
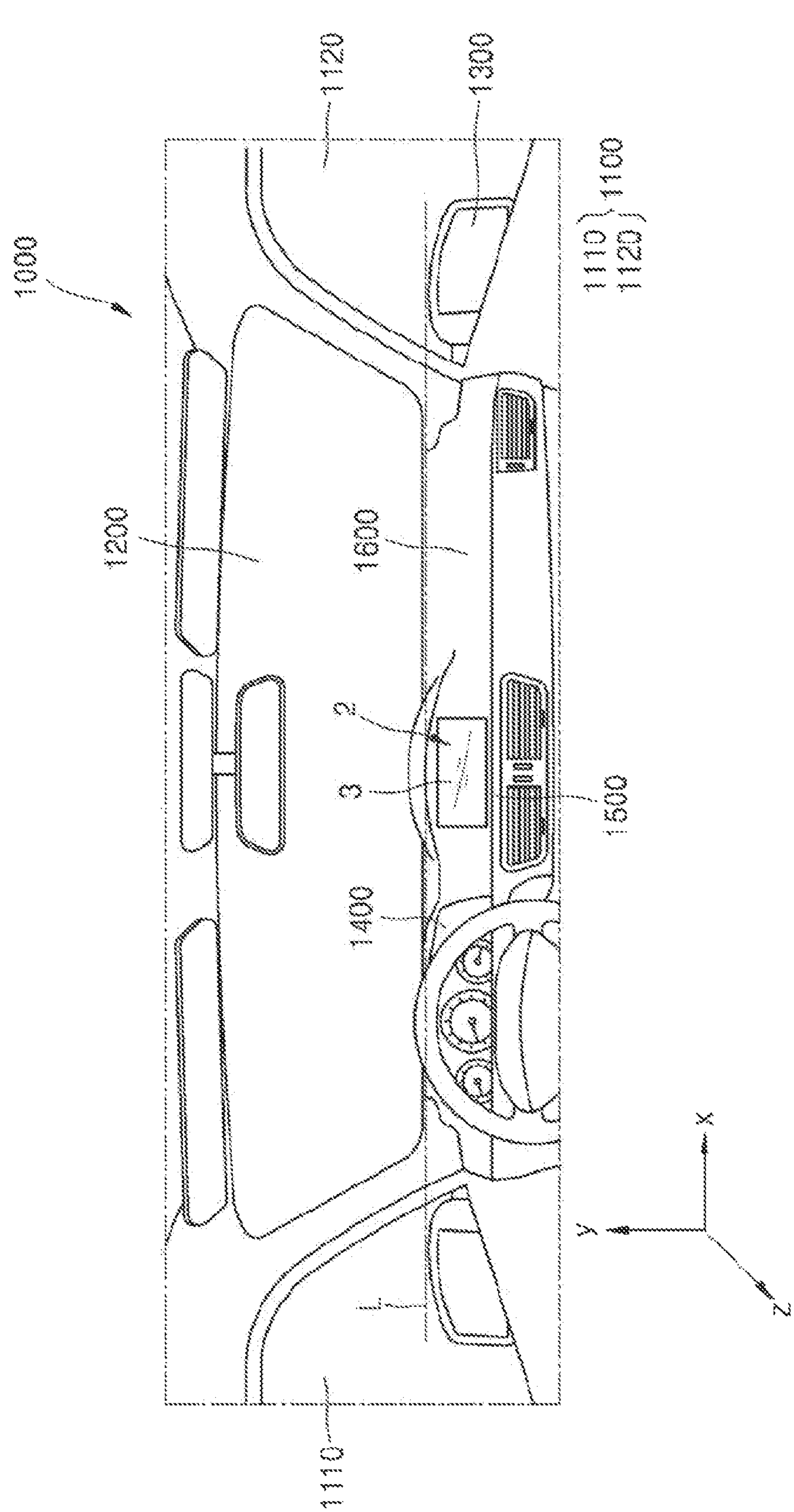
FIG. 6A is a schematic view of the interior of a vehicle that includes electronic equipment including a light-emitting device, according to one or more embodiments of the present disclosure.
Figure 6B:
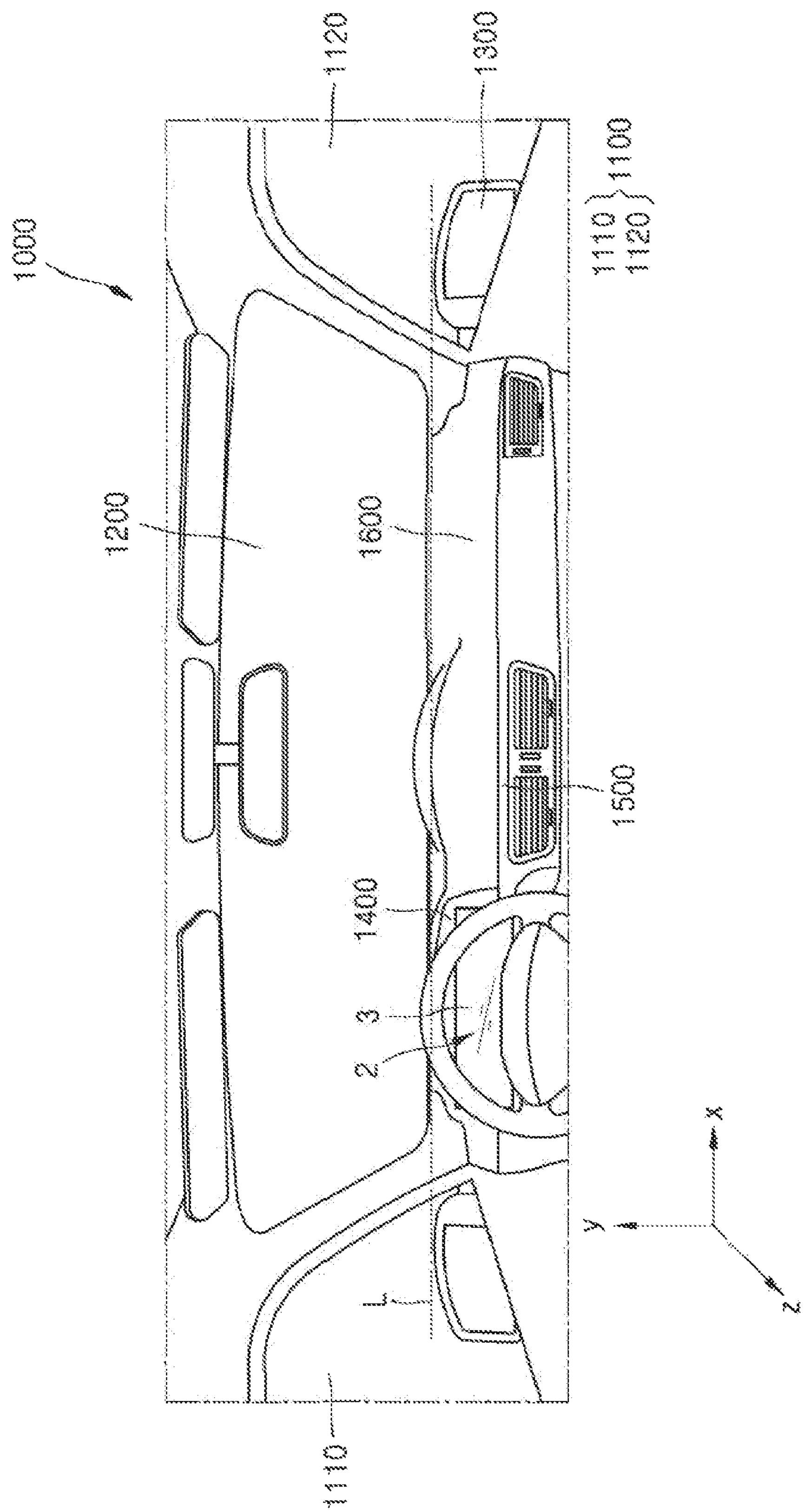
FIG. 6B is a schematic view of the interior of a vehicle that includes electronic equipment including a light-emitting device, according to one or more embodiments of the present disclosure.
Figure 6C:
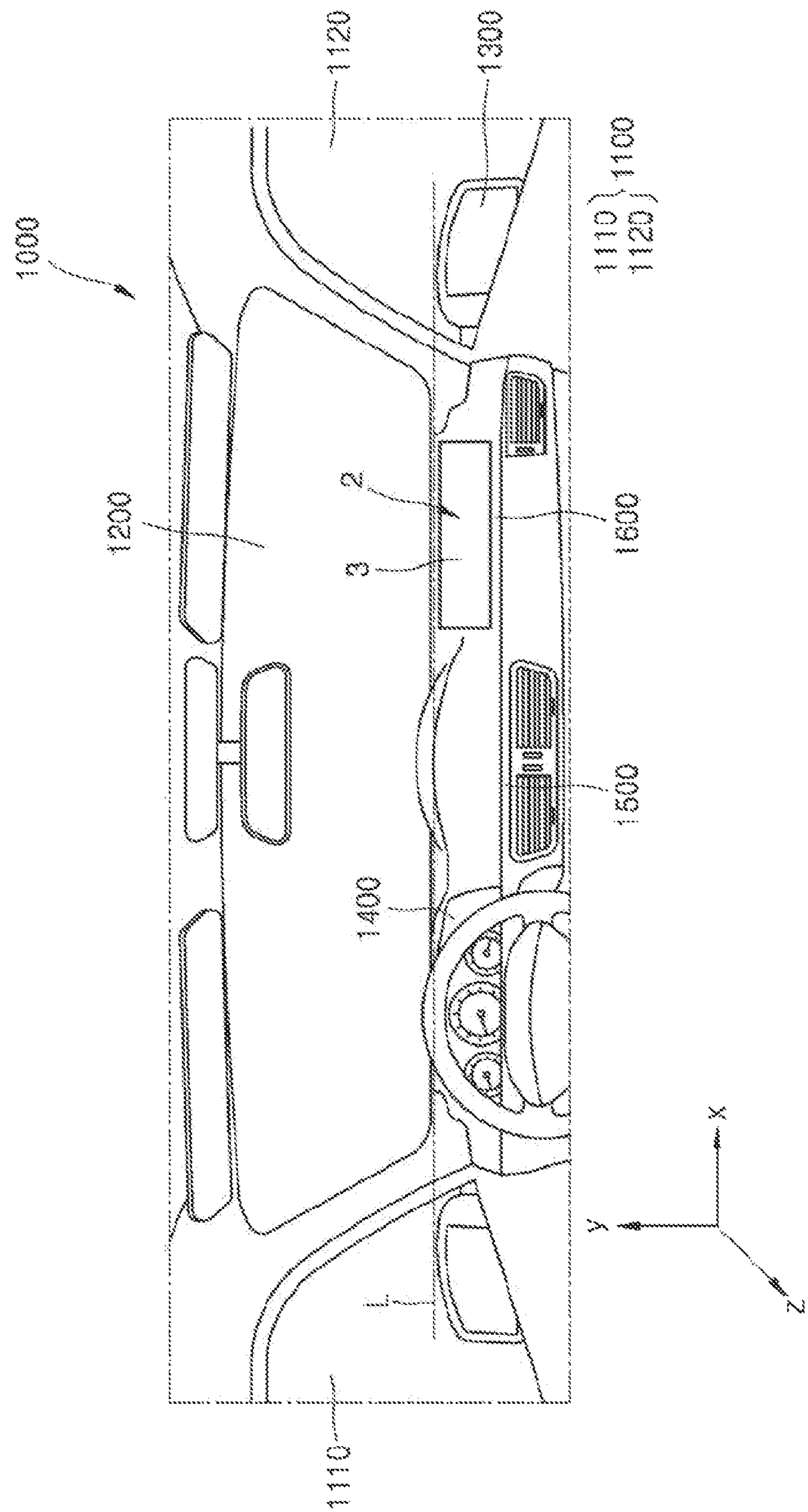
FIG. 6C is a schematic view of the interior of a vehicle that includes electronic equipment including a light-emitting device, according to one or more embodiments of the present disclosure.

FIG. 5 is a schematic perspective view illustrating the exterior of a vehicle 1000 as electronic equipment including a light-emitting device according to one or more embodiments. FIGS. 6A to 6C are each a schematic view illustrating the interior of the vehicle 1000 according to one or more suitable embodiments.

Referring to FIGS. 5, 6A, 6B, and 6C, the vehicle 1000 may refer to one or more suitable apparatus(es) for moving a subject to be transported, such as a human, an object, or an animal, from a departure point to a destination point. The vehicle 1000 may include a vehicle (e.g., automobile) traveling on a road or track, a vessel moving over the sea or river, an airplane flying in the sky utilizing the action of air, and/or the like.

The vehicle 1000 may travel on a road or a track. The vehicle 1000 may move in a set or predetermined direction according to rotation of at least one wheel. For example, the vehicle 1000 may include a three-wheeled or four-wheeled vehicle, a construction machine, a two-wheeled vehicle, a prime mover device, a bicycle, and a train running on a track.

The vehicle 1000 may include a body having an interior and an exterior, and a chassis in which mechanical apparatuses necessary for driving are installed as other parts except for the body. The exterior of the body may include a front panel, a bonnet, a roof panel, a rear panel, a trunk, a pillar provided at a boundary between doors, and/or the like. The chassis of the vehicle 1000 may include a power generating device, a power transmitting device, a driving device, a steering device, a braking device, a suspension device, a transmission device, a fuel device, front/rear and left/right wheels, and/or the like.

The vehicle 1000 may include a side window glass 1100, a front window glass 1200, a side mirror 1300, a cluster 1400, a center fascia 1500, a passenger seat dashboard 1600, and a display device 2.

The side window glass 1100 and the front window glass 1200 may be partitioned by a pillar arranged between the side window glass 1100 and the front window glass 1200.

The side window glass 1100 may be installed on the side of the vehicle 1000. In one or more embodiments, the side window glass 1100 may be installed on a door of the vehicle 1000. A plurality of side window glasses 1100 may be provided and may face each other. In one or more embodiments, the side window glass 1100 may include a first side window glass 1110 and a second side window glass 1120. In one or more embodiments, the first side window glass 1110 may be arranged adjacent to the cluster 1400. The second side window glass 1120 may be arranged adjacent to the passenger seat dashboard 1600.

In one or more embodiments, the side window glasses 1100 may be spaced apart from each other in the x-direction or the −x-direction. For example, the first side window glass 1110 and the second side window glass 1120 may be spaced apart from each other in the x direction or the −x direction. In other words, an imaginary straight line L connecting the side window glasses 1100 may extend in the x-direction or the −x-direction. For example, an imaginary straight line L connecting the first side window glass 1110 and the second side window glass 1120 to each other may extend in the x direction or the −x direction.

The front window glass 1200 may be installed in front of the vehicle 1000. The front window glass 1200 may be arranged between the side window glasses 1100 facing each other.

The side mirror 1300 may provide a rear view of the vehicle 1000. The side mirror 1300 may be installed on the exterior of the vehicle body. In one or more embodiments, a plurality of side mirrors 1300 may be provided. Any one of the plurality of side mirrors 1300 may be arranged outside the first side window glass 1110. The other one of the plurality of side mirrors 1300 may be arranged outside the second side window glass 1120.

The cluster 1400 may be arranged in front of the steering wheel. The cluster 1400 may include a tachometer, a speedometer, a coolant thermometer, a fuel gauge turn indicator, a high beam indicator, a warning lamp, a seat belt warning lamp, an odometer, an automatic shift selector indicator lamp, a door open warning lamp, an engine oil warning lamp, and/or a low fuel warning light.

The center fascia 1500 may include a control panel on which a plurality of buttons for adjusting an audio device, an air conditioning device, and a heater of a seat are provided. The center fascia 1500 may be arranged on one side of the cluster 1400.

The passenger seat dashboard 1600 may be spaced apart from the cluster 1400 with the center fascia 1500 arranged therebetween. In one or more embodiments, the cluster 1400 may be arranged to correspond to a driver seat, and the passenger seat dashboard 1600 may be provided to correspond to a passenger seat. In one or more embodiments, the cluster 1400 may be adjacent to the first side window glass 1110, and the passenger seat dashboard 1600 may be adjacent to the second side window glass 1120.

In one or more embodiments, the display device 2 may include a display panel 3, and the display panel 3 may display an image. The display device 2 may be arranged inside the vehicle 1000. In one or more embodiments, the display device 2 may be arranged between the side window glasses 1100 facing each other. The display device 2 may be arranged on at least one of the cluster 1400, the center fascia 1500, and the passenger seat dashboard 1600.

The display device 2 may include an organic light-emitting display device, an inorganic EL display device, a quantum dot display device, and/or the like. Hereinafter, as the display device 2 according to one or more embodiments, an organic light-emitting display device including the light-emitting device according to the disclosure will be described as an example, but one or more suitable types (kinds) of display devices as described above may be utilized in embodiments of the disclosure.

Referring to FIG. 6A, the display device 2 may be arranged on the center fascia 1500. In one or more embodiments, the display device 2 may display navigation information. In one or more embodiments, the display device 2 may display audio, video, or information regarding vehicle settings.

Referring to FIG. 6B, the display device 2 may be arranged on the cluster 1400. In this case, the cluster 1400 may display driving information and/or the like through the display device 2. For example, the cluster 1400 may be implemented digitally. The digital cluster 1400 may display vehicle information and driving information as images. For example, a needle and a gauge of a tachometer and one or more suitable warning light icons may be displayed by a digital signal.

Referring to FIG. 6C, the display device 2 may be arranged on the passenger seat dashboard 1600. The display device 2 may be embedded in the passenger seat dashboard 1600 or arranged on the passenger seat dashboard 1600. In one or more embodiments, the display device 2 arranged on the passenger seat dashboard 1600 may display an image related to information displayed on the cluster 1400 and/or information displayed on the center fascia 1500. In one or more embodiments, the display device 2 arranged on the passenger seat dashboard 1600 may display information different from information displayed on the cluster 1400 and/or information displayed on the center fascia 1500.

Manufacturing Method

Respective layers included in the hole transport region 120, the emission layer 130, and respective layers included in the electron transport region 140 may be formed in a suitable region by utilizing one or more suitable methods such as vacuum deposition, spin coating, casting, a Langmuir-Blodgett (LB) method, ink-jet printing, laser-printing, and laser-induced thermal imaging (LITI).

When respective layers included in the hole transport region 120, the emission layer 130, and respective layers included in the electron transport region 140 are formed by vacuum deposition, the deposition may be performed at a deposition temperature of about 100° C. to about 500° C., a vacuum degree of about $10^{-8}$ torr to about $10^{-3}$ torr, and a deposition rate of about 0.01 Å/sec to about 100 Å/sec, depending on the material to be included in each layer and the structure of each layer to be formed.

Definition of Terms

The term "$C_3$-$C_{60}$ carbocyclic group" as utilized herein refers to a cyclic group consisting of carbon only as a ring-forming atom and having 3 to 60 carbon atoms. The term "$C_1$-$C_{60}$ heterocyclic group" as utilized herein refers to a cyclic group that has 1 to 60 carbon atoms and further has, in addition to carbon, a heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. For example, the number of ring-forming atoms of the $C_1$-$C_{60}$ heterocyclic group may be from 3 to 61.

The "cyclic group" as utilized herein may include both (e.g., simultaneously) the $C_3$-$C_{60}$ carbocyclic group and the $C_1$-$C_{60}$ heterocyclic group.

The term "π electron-rich $C_3$-$C_{60}$ cyclic group" as utilized herein refers to a cyclic group that has 3 to 60 carbon atoms and does not include *—N═*' as a ring-forming moiety.

The term "π electron-deficient nitrogen-containing $C_1$-$C_{60}$ cyclic group" as utilized herein refers to a heterocyclic group that has 1 to 60 carbon atoms and includes *—N═*' as a ring-forming moiety.

For example, the $C_3$-$C_{60}$ carbocyclic group may be i) a T1 group or ii) a condensed cyclic group in which two or more T1 groups are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a T2 group, ii) a condensed cyclic group in which at least two T2 groups are condensed with each other, or iii) a condensed cyclic group in which at least one T2 group and at least one T1 group are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and/or the like), the π electron-rich $C_3$-$C_{60}$ cyclic group may be i) a T1 group, ii) a condensed cyclic group in which at least two T1 groups are condensed with each other, iii) a T3 group, iv) a condensed cyclic group in which at least two T3 groups are condensed with each other, or v) a condensed cyclic group in which at least one T3 group and at least one T1 group are condensed with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, and/or the like), the π electron-deficient nitrogen-containing $C_1$-$C_{60}$ cyclic group may be i) a T4 group, ii) a condensed cyclic group in which at least two T4 groups are condensed with each other, iii) a condensed cyclic group in which at least one T4 group and at least one T1 group are condensed with each other, iv) a condensed cyclic group in which at least one T4 group and at least one T3 group are condensed with each other, or v) a condensed cyclic group in which at least one T4 group, at least one T1 group, and at least one T3 group are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and/or the like).

The T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, or a benzene group.

The T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group.

The T3 group may be a furan group, a thiophene group, a 1H-pyrrole group, a silole group, or a borole group.

The T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group, the $C_3$-$C_{60}$ carbocyclic group, the $C_1$-$C_{60}$ heterocyclic group, the π electron-rich $C_3$-$C_{60}$ cyclic group, or the π electron-deficient nitrogen-containing $C_1$-$C_{60}$ cyclic group" as utilized herein refer to i) a group condensed to any cyclic group, ii) a monovalent group, or iii) a polyvalent group (for example, a divalent group, a trivalent group, a tetravalent group, etc.) according to the structure of a formula for which the corresponding term is utilized.

For example, the "benzene group" may be a benzo group, a phenyl group, a phenylene group, and/or the like, which may be easily understood by one of ordinary skill in the art according to the structure of a formula including the "benzene group."

Depending on context, a divalent group may refer or be a polyvalent group (e.g., trivalent, tetravalent, etc., and not just divalent) per, e.g., the structure of a formula in connection with which of the terms are utilized.

Examples of the monovalent $C_3$-$C_{60}$ carbocyclic group and monovalent $C_1$-$C_{60}$ heterocyclic group are a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

Examples of the divalent $C_3$-$C_{60}$ carbocyclic group and the monovalent $C_1$-$C_{60}$ heterocyclic group are a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as utilized herein refers to a linear or branched aliphatic hydrocarbon monovalent group that has one to sixty carbon atoms, and specific examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group.

The term "$C_1$-$C_{60}$ alkylene group" as utilized herein refers to a divalent group having the same structure as the $C_1$-$C_{60}$ alkyl group.

The term "$C_2$-$C_{60}$ alkenyl group" as utilized herein refers to a monovalent hydrocarbon group having at least one carbon-carbon double bond in the middle or at the terminus of the $C_2$-$C_{60}$ alkyl group, and examples thereof are an ethenyl group, a propenyl group, a butenyl group, and/or the like.

The term "$C_2$-$C_{60}$ alkenylene group" as utilized herein refers to a divalent group having the same structure as the $C_2$-$C_{60}$ alkenyl group.

The term "$C_2$-$C_{60}$ alkynyl group" as utilized herein refers to a monovalent hydrocarbon group having at least one carbon-carbon triple bond in the middle or at the terminus of the $C_2$-$C_{60}$ alkyl group, and examples thereof are an ethynyl group, a propynyl group, and/or the like.

The term "$C_2$-$C_{60}$ alkynylene group" as utilized herein refers to a divalent group having the same structure as the $C_2$-$C_{60}$ alkynyl group.

The term "$C_1$-$C_{60}$ alkoxy group" as utilized herein refers to a monovalent group represented by $—OA_{101}$ (wherein $A_{101}$ is the $C_1$-$C_{60}$ alkyl group), and examples thereof are a methoxy group, an ethoxy group, an isopropyloxy group, and/or the like.

The term "$C_3$-$C_{10}$ cycloalkyl group" as utilized herein refers to a monovalent saturated hydrocarbon cyclic group having 3 to 10 carbon atoms, and examples thereof are a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, a bicyclo[2.2.2]octyl group, and/or the like.

The term "$C_3$-$C_{10}$ cycloalkylene group" as utilized herein refers to a divalent group having the same structure as the $C_3$-$C_{10}$ cycloalkyl group.

The term "$C_1$-$C_{10}$ heterocycloalkyl group" as utilized herein refers to a monovalent cyclic group of 1 to 10 carbon atoms, further including, in addition to carbon atoms, at least one heteroatom, as ring-forming atoms, and examples thereof are a 1,2,3,4-oxatriazolidinyl group, a tetrahydrofuranyl group, a tetrahydrothiophenyl group, and/or the like.

The term "$C_1$-$C_{10}$ heterocycloalkylene group" as utilized herein refers to a divalent group having the same structure as the $C_1$-$C_{10}$ heterocycloalkyl group.

The term "$C_3$-$C_{10}$ cycloalkenyl group" as utilized herein refers to a monovalent cyclic group that has three to ten carbon atoms and at least one carbon-carbon double bond in the ring thereof and no aromaticity, and examples thereof are a cyclopentenyl group, a cyclohexenyl group, a cycloheptenyl group, and/or the like.

The term "$C_3$-$C_{10}$ cycloalkenylene group" as utilized herein refers to a divalent group having the same structure as the $C_3$-$C_{10}$ cycloalkenyl group.

The term "$C_1$-$C_{10}$ heterocycloalkenyl group" as utilized herein refers to a monovalent cyclic group of 1 to 10 carbon atoms, further including, in addition to carbon atoms, at least one heteroatom, as ring-forming atoms, and having at least one carbon-carbon double bond in the cyclic structure thereof. Examples of the $C_1$-$C_{10}$ heterocycloalkenyl group are a 4,5-dihydro-1,2,3,4-oxatriazolyl group, a 2,3-dihydrofuranyl group, a 2,3-dihydrothiophenyl group, and/or the like.

The term "$C_1$-$C_{10}$ heterocycloalkenylene group" as utilized herein refers to a divalent group having the same structure as the $C_1$-$C_{10}$ heterocycloalkenyl group.

The term "$C_6$-$C_{60}$ aryl group" as utilized herein refers to a monovalent group having a carbocyclic aromatic system of 6 to 60 carbon atoms.

The term "$C_6$-$C_{60}$ arylene group" as utilized herein refers to a divalent group having a carbocyclic aromatic system of 6 to 60 carbon atoms.

Examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, an ovalenyl group, and/or the like.

When the $C_6$-$C_{60}$ aryl group and the $C_6$-$C_{60}$ arylene group each include two or more rings, the rings may be condensed with each other.

The term "$C_1$-$C_{60}$ heteroaryl group" as utilized herein refers to a monovalent group having a heterocyclic aromatic system of 1 to 60 carbon atoms, further including, in addition to carbon atoms, at least one heteroatom, as ring-forming atoms.

The term "$C_1$-$C_{60}$ heteroarylene group" as utilized herein refers to a divalent group having a heterocyclic aromatic system of 1 to 60 carbon atoms, further including, in addition to carbon atoms, at least one heteroatom, as ring-forming atoms.

Examples of the $C_1$-$C_{60}$ heteroaryl group are a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group.

When the $C_1$-$C_{60}$ heteroaryl group and the $C_1$-$C_{60}$ heteroarylene group each include two or more rings, the rings may be condensed with each other.

The term "monovalent non-aromatic condensed polycyclic group" as utilized herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group are an indenyl group, a fluorenyl group, a spiro-bifluorenyl group, a benzofluorenyl group, an indenophenanthrenyl group, an indeno anthracenyl group, and/or the like.

The term "divalent non-aromatic condensed polycyclic group" as utilized herein refers to a divalent group having the same structure as the monovalent non-aromatic condensed polycyclic group described above.

The term "monovalent non-aromatic condensed heteropolycyclic group" as utilized herein refers to a monovalent group (for example, having 1 to 60 carbon atoms) having two or more rings condensed to each other, further including, in addition to carbon atoms, at least one heteroatom, as ring-forming atoms, and having non-aromaticity in its entire molecular structure. Examples of the monovalent non-aromatic condensed heteropolycyclic group include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group.

The term "divalent non-aromatic condensed heteropolycyclic group" as utilized herein refers to a divalent group having the same structure as the monovalent non-aromatic condensed heteropolycyclic group described above.

The term "$C_6$-$C_{60}$ aryloxy group" as utilized herein indicates —$OA_{102}$ (wherein $A_{102}$ is the $C_6$-$C_{60}$ aryl group).

The term "$C_6$-$C_{60}$ arylthio group" as utilized herein indicates —$SA_{103}$ (wherein $A_{103}$ is the $C_6$-$C_{60}$ aryl group).

The term "$C_7$-$C_{60}$ arylalkyl group" as utilized herein refers to —$A_{104}A_{105}$ (wherein $A_{104}$ is a $C_1$-$C_{54}$ alkylene group, and $A_{105}$ is a $C_6$-$C_{59}$ aryl group).

The term "$C_2$-$C_{60}$ heteroarylalkyl group" as utilized herein refers to —$A_{106}A_{107}$ (wherein $A_{106}$ is a $C_1$-$C_{59}$ alkylene group, and $A_{107}$ is a $C_1$-$C_{59}$ heteroaryl group).

The term "$R_{10a}$" as utilized herein may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

In the present specification, $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ arylalkyl group; or a $C_2$-$C_{60}$ heteroarylalkyl group.

The term "heteroatom" as utilized herein refers to any atom other than a carbon atom. Examples of the heteroatom are O, S, N, P, Si, B, Ge, Se, and any combination thereof.

In the present specification, the third-row transition metal may include hafnium (Hf), tantalum (Ta), tungsten (W), rhenium (Re), osmium (Os), iridium (Ir), platinum (Pt), gold (Au), and/or the like.

In the present specification, "D" may refer to hydrogen, "Ph" refers to a phenyl group, "Me" refers to a methyl group, "Et" refers to an ethyl group, "tert-Bu" or "But" refers to a tert-butyl group, and "OMe" refers to a methoxy group. The term "biphenyl group" as utilized herein refers to "a phenyl group substituted with a phenyl group." In other words, the "biphenyl group" may be a substituted phenyl group having a $C_6$-$C_{60}$ aryl group as a substituent.

The term "terphenyl group" as utilized herein refers to "a phenyl group substituted with a biphenyl group." In other words, the "terphenyl group" may be a substituted phenyl group having, as a substituent, a $C_6$-$C_{60}$ aryl group substituted with a $C_6$-$C_{60}$ aryl group.

* and *' as utilized herein, unless defined otherwise, each refer to a binding site to a neighboring atom in the corresponding formula or moiety.

In the present specification, the x-axis, y-axis, and z-axis are not limited to three axes in an orthogonal coordinate system, and may be interpreted in a broad sense including these axes. For example, the x-axis, y-axis, and z-axis may refer to those orthogonal to each other, or may refer to those in different directions that are not orthogonal to each other.

Hereinafter, compounds according to one or more embodiments and light-emitting devices according to one or more embodiments will be described in more detail with reference to the following synthesis examples and examples. The expression "B was utilized instead of A" utilized in describing synthesis examples refers to that an amount of B was identical to an amount of A in terms of molar equivalents.

EXAMPLES

Evaluation Example 1

The HOMO values of compounds listed in Table 2 were measured utilizing a method described in Table 1, and the results thereof are shown in Table 2. The HOMO values are negative values.

TABLE 1

| | |
|---|---|
| HOMO energy level evaluation method (by differential pulse voltammetry (DPV) measurement) | HOMO energy levels and LUMO energy levels were measured utilizing a DPV measurement method. For example, an electrolyte solution in which 0.10M of $(n\text{-}Bu)_4PF_6$ was mixed in a DMF solution was utilized as an electrolyte, and the potential of each of a reference sample and a measurement sample was measured at a reference potential ($E^o(Fc/Fc^+)$) of 0.55 V by connecting respective electrodes of a vial for measurement to a reference electrode (RE), a counter electrode (CE), and a working electrode (WE). Ferrocene was utilized as the reference sample. |

TABLE 2

| Compound | | HOMO (eV) |
|---|---|---|
| Sensitizer | S1 | −5.1 |
| | S2 | −5.1 |
| | S3 | −5.1 |
| | S4 | −5.1 |
| | S5 | −5.3 |
| | A1 | −5.2 |
| | PD13 | −5.2 |
| | A2 | −5.2 |
| | A3 | −5.2 |
| | A4 | −5.2 |
| Emitter | E1 | −5.26 |
| | E2 | −5.15 |
| | E3 | −5.20 |
| | B1 | −5.3 |
| | B2 | −5.1 |
| | B3 | −5.1 |
| | B4 | −5.1 |

TABLE 2-continued
| Compound | HOMO (eV) |
|---|---|
| S1 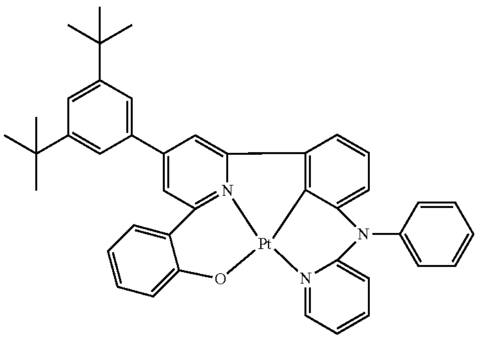 | |
| S2 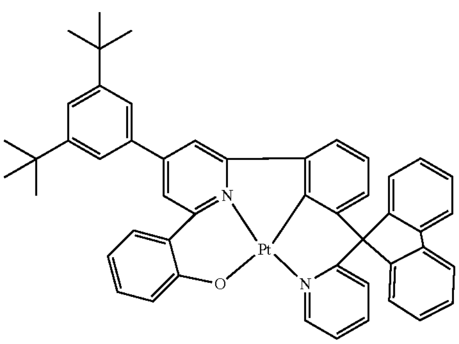 | |
| S3 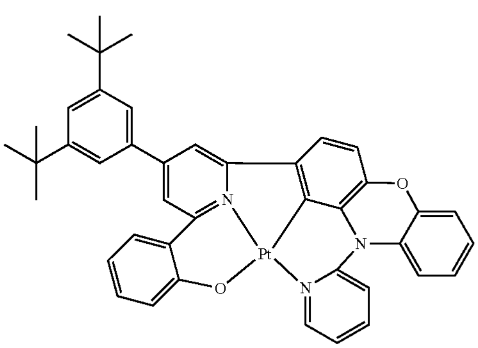 | |
| S4 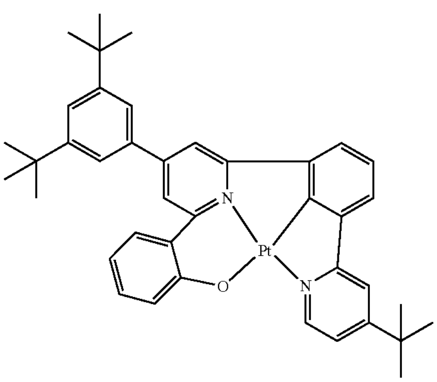 | |
TABLE 2-continued
| Compound | HOMO (eV) |
|---|---|
| S5 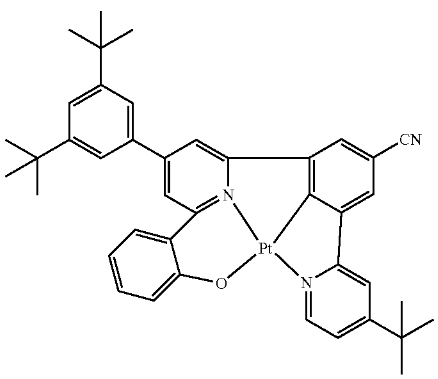 | |
| A1 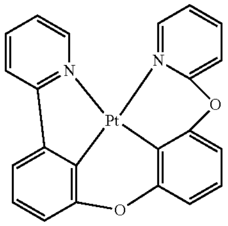 | |
| PD13 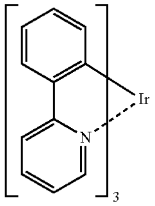 | |
| A2 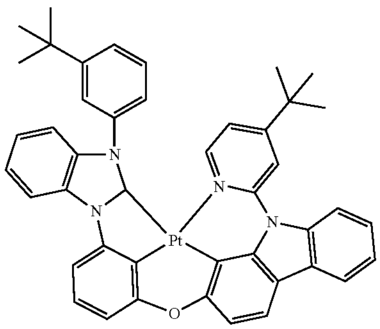 | |
| A3 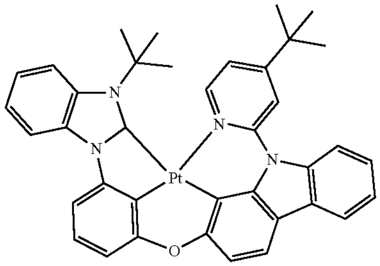 | |

TABLE 2-continued
| Compound | HOMO (eV) |
|---|---|
| A4 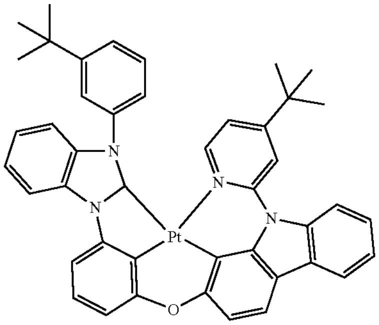 | |
| E1 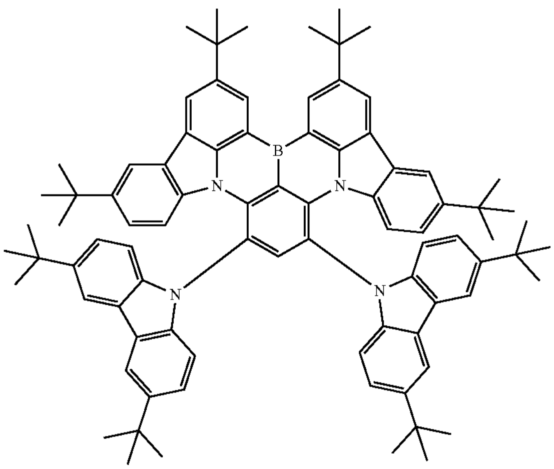 | |
| E2 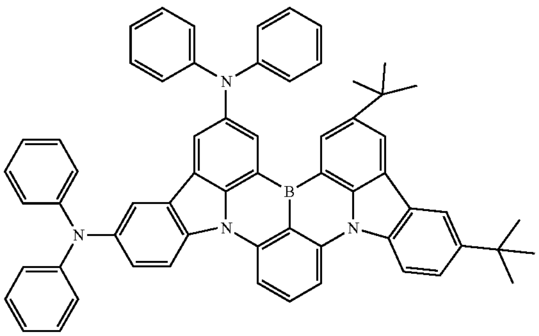 | |
| E3 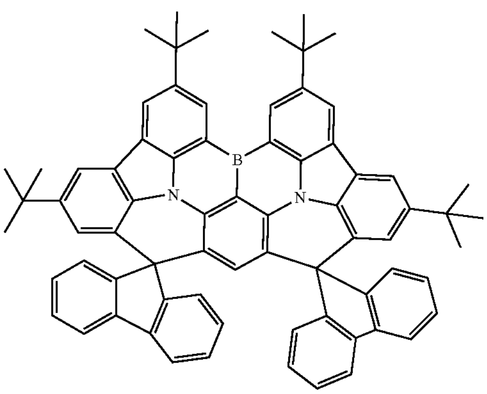 | |
TABLE 2-continued
| Compound | HOMO (eV) |
|---|---|
| B1 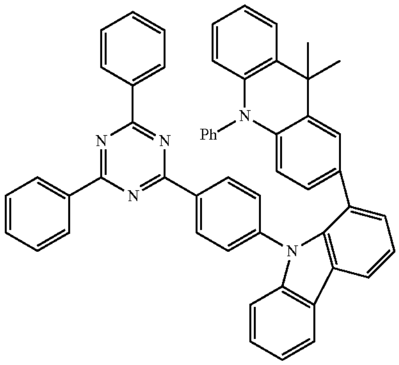 | |
| B2 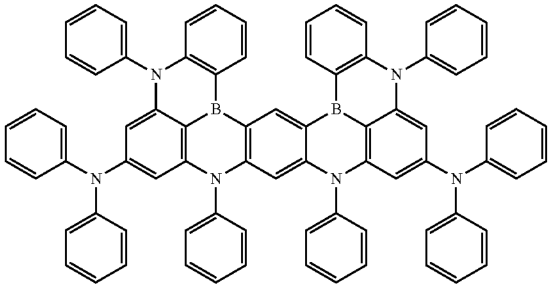 | |
| B3 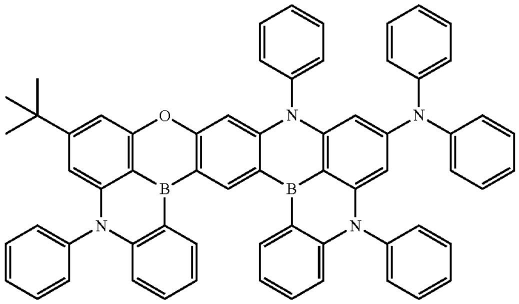 | |
| B4 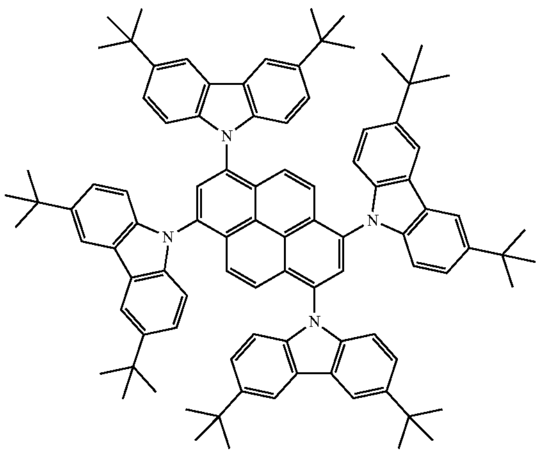 | |
Evaluation Example 2
The emission spectrum, absorption spectrum and molar extinction coefficient of each of compounds listed in Tables 4 and 5 were evaluated utilizing a method described in Table 3, and the results thereof are shown in Tables 4 and 5.

TABLE 3

| | |
|---|---|
| Emission spectrum | PMMA and a compound to be measured (10 wt % with respect to PMMA) were mixed in a toluene solution, and then the resultant obtained therefrom was coated on a quartz substrate utilizing a spin coater and heat-treated in an oven at 80° C. Subsequently, the heat-treated resultant was cooled to room temperature to manufacture a film having a thickness of 40 nm. The emission spectrum of the film was measured by utilizing equipment equipped with a Quantaurus-QY Absolute PL quantum yield spectrometer manufactured by Hamamatsu, a monochromator, a photonic multichannel analyzer, and an integrating sphere, and PLQY measurement software (Hamamatsu Photonics, Ltd., Shizuoka, Japan). The measured spectrum was taken to calculate the emission peak wavelength (maximum emission wavelength). |
| Absorption spectrum | A 5 μmol/L toluene solution of the compound to be measured was prepared and placed in a quartz cell, and the absorption spectrum (vertical axis: absorption intensity/ horizontal axis: wavelength (nm)) of the solution was measured at room temperature (300 K) utilizing a streak camera (manufactured by Hamamatsu) and a ps laser (EKSPLA). |
| Molar extinction coefficient (ε) ($M^{-1}cm^{-1}$) | The molar extinction coefficient was calculated by dividing the absorption intensity of an absorption peak located on the longest wavelength side of the absorption spectrum by the concentration of the solution. The absorption peak located on the longest wavelength side of the absorption spectrum is a peak appearing on the longest wavelength side among peaks having an absorption intensity of 1/10 or more of the absorption peak wavelength. |

TABLE 4

| Sensitizer | Emission peak wavelength (nm) |
|---|---|
| S1 | 520 |
| S2 | 520 |
| S3 | 530 |
| S4 | 515 |
| S5 | 530 |
| A1 | 520 |
| PD13 | 520 |
| A2 | 459 |
| A3 | 460 |
| A4 | 458 |

TABLE 5

| Emitter | Emission peak wavelength (nm) | Absorption peak wavelength (nm) | Molar extinction coefficient ($M^{-1}cm^{-1}$) |
|---|---|---|---|
| E1 | 540 | 504 | $3.8 \times 10^4$ |
| E2 | 530 | 503 | $3.0 \times 10^4$ |
| E3 | 530 | 505 | $4.5 \times 10^4$ |
| B1 | 530 | 490 | $1.5 \times 10^4$ |
| B2 | 470 | 456 | $1.2 \times 10^5$ |
| B3 | 462 | 445 | $8.0 \times 10^4$ |
| B4 | 458 | 428 | $3.7 \times 10^4$ |

Example 1

A 15 ohm per square centimeter ($\Omega/cm^2$) (1,200 angstrom (Å)) ITO glass substrate (anode) available from Corning Inc. was cut to a size of 50 millimeter (mm)×50 mm×0.7 mm, sonicated in isopropyl alcohol and pure water for 5 minutes each, and then cleaned by irradiation of ultraviolet rays and exposure to ozone for 30 minutes, and then the glass substrate was mounted on a vacuum deposition apparatus.

Compound 2-TNATA was vacuum-deposited on the glass substrate to form a hole injection layer having a thickness of 600 Å. Compound HAT-CN was vacuum-deposited on the hole injection layer to form a hole transport layer having a thickness of 300 Å.

A host (mCBP), a sensitizer, and an emitter were co-deposited on the hole transport layer in a weight ratio of 85:13.5:1.5 to form an emission layer having a thickness of 300 Å. The sensitizer and the emitter may each independently be the same as described in Table 6.

ET1 was vacuum-deposited on the emission layer to form an electron transport layer having a thickness of 300 Å. Yb was vacuum-deposited on the electron transport layer to form an electron injection layer having a thickness of 10 Å. Al was vacuum-deposited on the electron injection layer to form a second electrode (cathode) having a thickness of a 3,000 Å, thereby completing the manufacture of a light-emitting device.

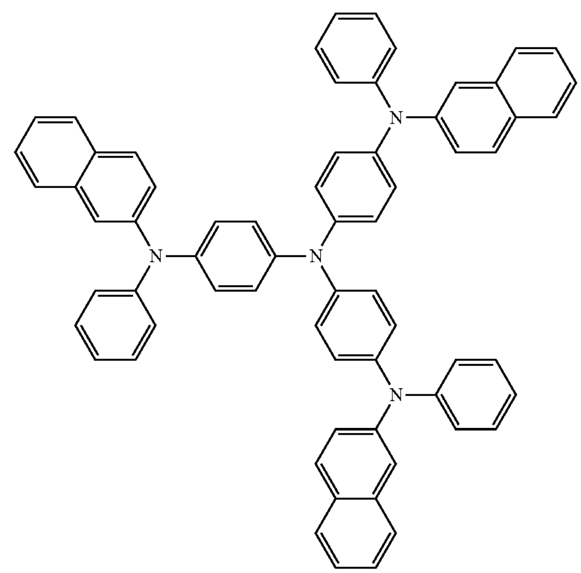

2-TNATA

-continued

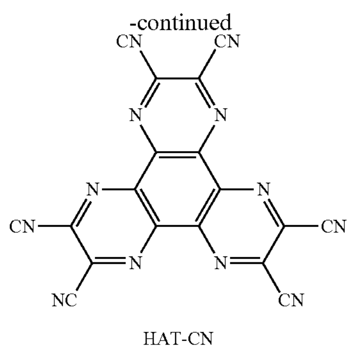

HAT-CN

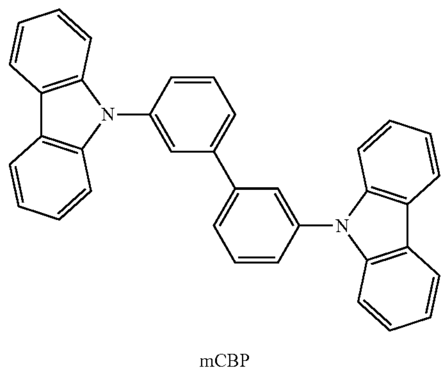

mCBP

ET1

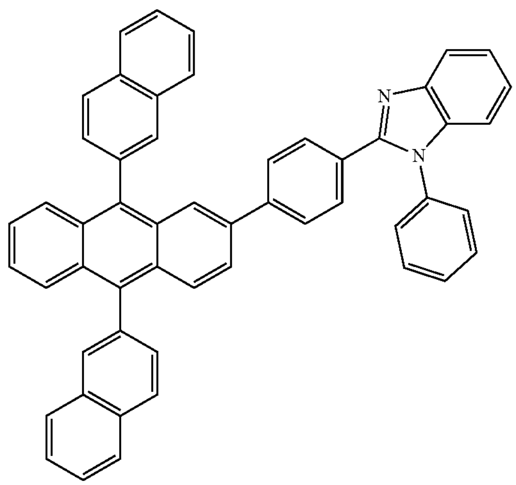

Comparative Examples 1 to 10

Light-emitting devices were manufactured in substantially the same manner as in Example 1, except that, in forming the respective emission layer, compounds and weight ratios shown in Table 6 were utilized. The weight ratio indicates the parts by weight of each of the sensitizer and the emitter with respect to 100 parts by weight of the emission layer.

Evaluation Example 3

The color coordinates, current efficiency, and lifespan ($LT_{95}$) of each of the light-emitting devices of Example 1 and Comparative Examples 1 to 10 were measured utilizing the following methods, and the results thereof are shown in Table 6.

The spectral overlap integral was calculated utilizing the Excel program according to Equation 1 described herein for each of the emission spectrum and the absorption spectrum described in Table 3.

Color coordinates were measured utilizing a luminance meter PR650 after power was supplied from a current-voltmeter (Keithley SMU 236).

Current efficiency was measured utilizing a luminance meter PR650 after power was supplied from a current-voltmeter (Keithley SMU 236), and a relative ratio with respect to the current efficiency of Comparative Example 1 was shown.

Lifespan ($LT_{95}$) indicates the time (hr) taken until the luminance reached 95% relative to 100% of initial luminance of 1000 nit (i.e., candela per square meter (cd/$m^2$)), L and a relative ratio with respect to the lifespan of Comparative Example 1 was exhibited.

TABLE 6

| | Compound in emission layer | | Spectral | | | Relative | |
|---|---|---|---|---|---|---|---|
| | Sensitizer (parts by weight) | Emitter (parts by weight) | overlap integral ($M^{-1}cm^4$) | Color coordinates CIEx | CIEy | current efficiency (%) | LT95 (%) |
| Example 1 | S4 (13.5) | E1 (1.5) | $2 \times 10^{14}$ | 0.25 | 0.76 | 120 | 130 |
| Comparative Example 1 | S4 (15) | — | — | 0.25 | 0.75 | 100 | 100 |
| Comparative Example 2 | — | E1 (1.5) | — | 0.26 | 0.76 | 80 | 70 |
| Comparative Example 3 | S4 (13.5) | B1 (1.5) | $1 \times 10^{13}$ | 0.35 | 0.68 | 70 | 50 |
| Comparative Example 4 | S5 (13.5) | E1 (1.5) | $1 \times 10^{14}$ | 0.25 | 0.78 | 105 | 75 |

TABLE 6-continued

| | Compound in emission layer | | Spectral | | | Relative | |
|---|---|---|---|---|---|---|---|
| | Sensitizer (parts by weight) | Emitter (parts by weight) | overlap integral ($M^{-1}cm^4$) | Color coordinates | | current efficiency (%) | LT95 (%) |
| | | | | CIEx | CIEy | | |
| Comparative Example 5 | A1 (13.5) | E1 (1.5) | $8 \times 10^{13}$ | 0.30 | 0.69 | 80 | 60 |
| Comparative Example 6 | PD13 (13.5) | E1 (1.5) | $5 \times 10^{12}$ | 0.29 | 0.69 | 90 | 70 |
| Comparative Example 7 | S4 (14.2) | E1 (0.8) | $2 \times 10^{14}$ | 0.30 | 0.68 | 105 | 80 |
| Comparative Example 8 | A2 (13.5) | B2 (1.5) | $4 \times 10^{14}$ | 0.12 | 0.13 | 114 | less than 1 |
| Comparative Example 9 | A3 (13.5) | B3 (1.5) | $3.5 \times 10^{14}$ | 0.12 | 0.12 | 110 | less than 1 |
| Comparative Example 10 | A4 (13.5) | B4 (1.5) | $1 \times 10^{14}$ | 0.12 | 0.13 | 90 | less than 1 |

From the results shown in Table 6, it can be confirmed that the light-emitting device of Example 1 emits green light and has enhanced or improved current efficiency and enhanced or improved lifespan characteristics, compared to the light-emitting devices of Comparative Examples 1 to 10.

For example, it can be confirmed that the light-emitting device of Example 1 has improved current efficiency and improved lifespan, compared to i) the light-emitting device of Comparative Example 1 utilizing only a sensitizer and the light-emitting device of Comparative Example 2 utilizing only an emitter, ii) the light-emitting device of Comparative Example 3 having the spectral overlap integral of not at least (e.g., greater than) $1\times10^{13}$ $M^{-1}$ $cm^4$, iii) the light-emitting device of Comparative Example 4 in which the HOMO energy level of the sensitizer is not greater than the HOMO energy level of the emitter (HOMO energy level (−5.3 eV) of Sensitizer S5<HOMO energy level (−5.26 eV) of Emitter E1, iv) the light-emitting device of Comparative Example 5 utilizing Compound $A_1$ not including at least one tert-butyl group, v) the light-emitting device of Comparative Example 6 utilizing Compound PD13 not including at least one tert-butyl group and having the spectral overlap integral of not at least (e.g., greater than) $1\times10^{13}$ $M^{-1}$ $cm^4$, vi) the light-emitting device of Comparative Example 7 including less than 1 part by weight of the emitter with respect to 100 parts by weight of the emission layer, and vii) the light-emitting devices of Comparative Examples 8 to 10 in which the HOMO energy level of the sensitizer is not greater than the HOMO energy level of the emitter and which emit blue light.

Although the disclosure has been described with reference to the Synthesis Examples and Examples, these examples are provided for illustrative purpose only, and one of ordinary skill in the art may understand that these examples may have one or more suitable modifications and other examples equivalent thereto. Accordingly, the scope of the disclosure should be determined by the technical concept of the claims.

According to the one or more embodiments above, a light-emitting device may have improved current efficiency and improved lifespan while emitting green light.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that one or more suitable changes in form and details may be made therein without departing from the spirit and scope as defined by the following claims and equivalents thereof.

What is claimed is:

1. A light-emitting device comprising:

a first electrode;

a second electrode facing the first electrode; and an interlayer between the first electrode and the second electrode and comprising an emission layer, wherein the emission layer comprises a first compound comprising at least one π electron-deficient nitrogen-containing $C_1$-$C_{60}$ heterocyclic group, a second compound comprising a group represented by Formula 2, or any combination thereof, wherein the emission layer comprises a sensitizer and an emitter, a spectral overlap integral of an emission spectrum of the sensitizer and an absorption spectrum of the emitter is at least $1\times10^{13}$ $M^{-1}cm^4$, a highest occupied molecular orbital (HOMO) energy level of the sensitizer is higher than a HOMO energy level of the emitter, the spectral overlap integral is evaluated by Equation 1:

$$J(\lambda) = \int_0^\infty \varepsilon(\lambda)\lambda^4 F_D(\lambda)d\lambda,$$

wherein, in Equation 1,

J(λ) is the spectral overlap integral of the emission spectrum of the sensitizer and the absorption spectrum of the emitter, ε(λ) is a molar extinction coefficient of the emitter calculated from the absorption spectrum of the emitter, λ is a wavelength of the emission spectrum and the absorption spectrum, and $F_D(\lambda)$ is a normalized emission spectrum of the sensitizer:

Formula 2

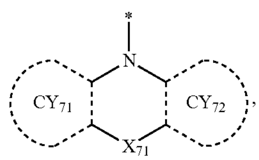

and wherein, in Formula 2, ring $CY_{71}$ and ring $CY_{72}$ are each independently a π electron-rich $C_3$-$C_{60}$ cyclic group or a pyridine group, $X_{71}$ is a single bond or a linking group comprising O, S, N, B, C, Si, or any combination thereof, and

* indicates a binding site to any atom included in the remaining portion other than the group represented by Formula 2 in the second compound.

2. The light-emitting device of claim 1, wherein J(λ) is $4\times10^{14}$ $M^{-1}cm^4$ or less.

3. The light-emitting device of claim 1, wherein the HOMO energy level of the sensitizer is about −5.5 eV to about −4.7 eV.

4. The light-emitting device of claim 1, wherein the HOMO energy level of the emitter is about −6.0 eV to about −5.0 eV.

5. The light-emitting device of claim 1, wherein ε(λ) is at least $1.5\times10^4$ $M^{-1}cm^{-1}$.

6. The light-emitting device of claim 1, wherein the sensitizer is a transition metal-containing organometallic compound.

7. The light-emitting device of claim 6, wherein the sensitizer comprises oxygen (O) directly bonded to the transition metal.

8. The light-emitting device of claim 1, wherein the sensitizer comprises at least one tert-butyl group.

9. The light-emitting device of claim 1, wherein the sensitizer does not comprise a ring comprising at least two nitrogen (N) atoms as ring-forming atoms.

10. The light-emitting device of claim 1, wherein the emitter is a compound comprising at least one boron (B).

11. The light-emitting device of claim 1, wherein the emitter comprises at least one tert-butyl group.

12. The light-emitting device of claim 1, wherein a weight of the emitter is 1 part by weight or more with respect to 100 parts by weight of the emission layer.

13. The light-emitting device of claim 1, wherein an exciton is configured to transition from a lowest excited triplet energy level of the sensitizer to a lowest excited singlet energy level of the emitter, and the exciton is configured to transition from the lowest excited singlet energy level of the emitter to a ground state to emit light.

14. The light-emitting device of claim 1, wherein the emission layer is configured to emit light having a maximum emission wavelength of about 510 nm to about 550 nm.

15. The light-emitting device of claim 1, wherein the sensitizer is any one selected from among Compounds S1 to S5:

S1

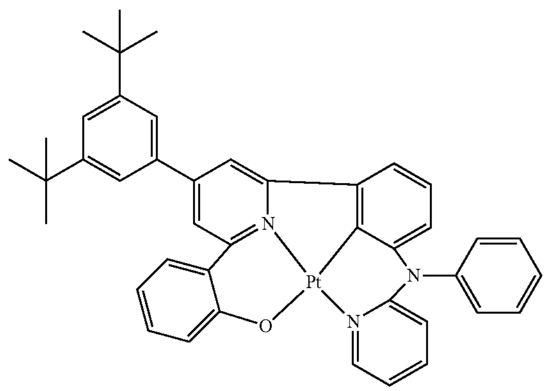

S2

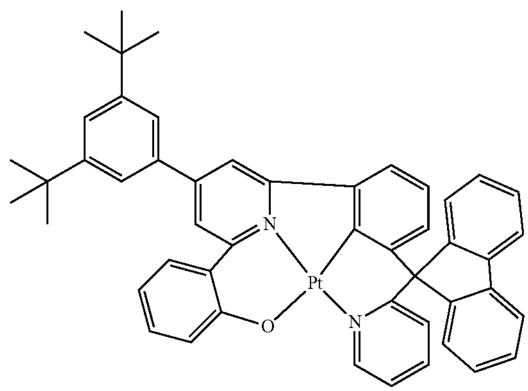

S3

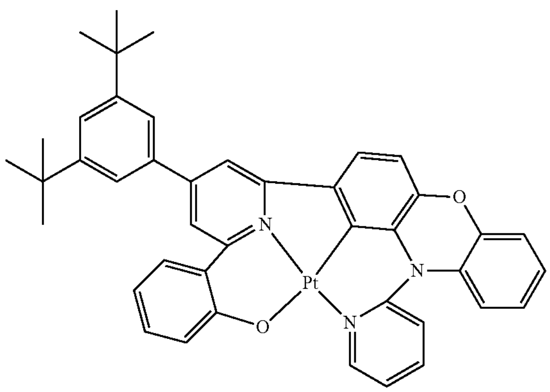

S4

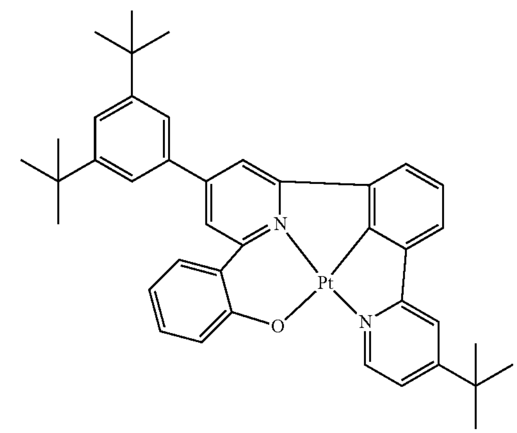

-continued

S5

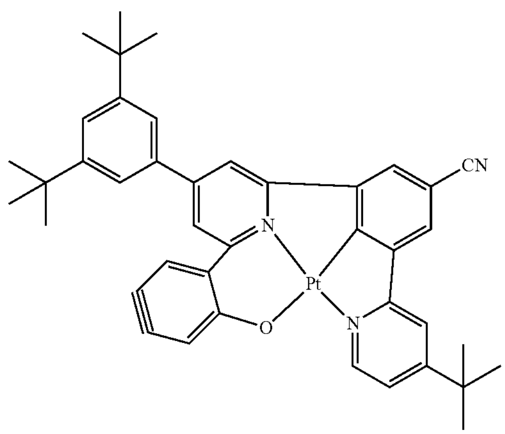

16. The light-emitting device of claim 1, wherein the emitter is any one selected from among Compounds E1 to E3:

E1

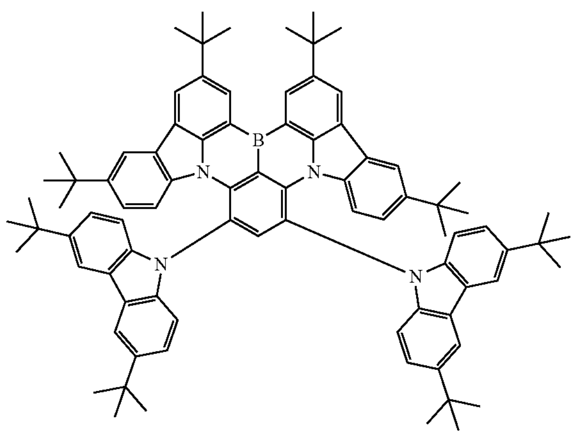

E2

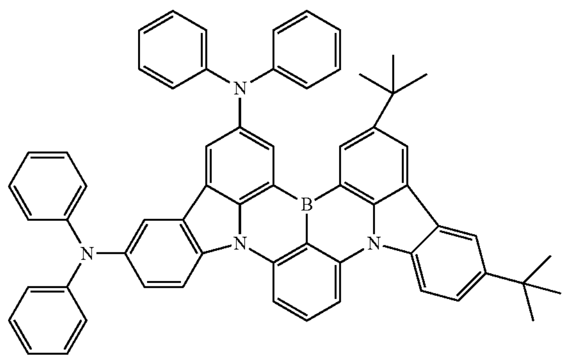

-continued

E3

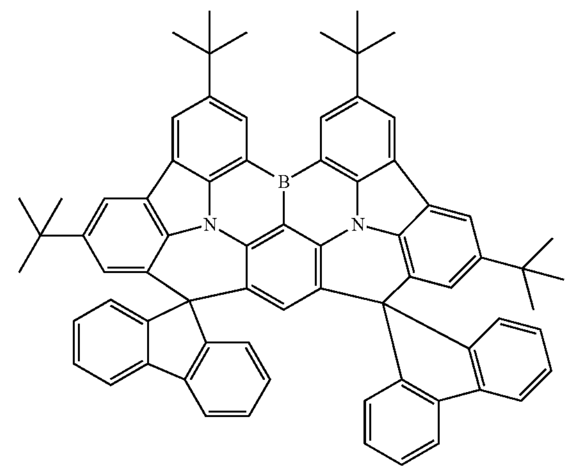

17. An electronic apparatus comprising the light-emitting device of claim 1.

18. The electronic apparatus of claim 17, further comprising:

a thin-film transistor electrically connected to the light-emitting device; and a color filter, a color conversion layer, a touch screen layer, a polarizing layer, or any combination thereof.

19. An electronic equipment comprising the light-emitting device of claim 1, wherein the electronic equipment is at least one selected from among a flat panel display, a curved display, a computer monitor, a medical monitor, a television, a billboard, an indoor or outdoor light and/or light for signal, a head-up display, a fully or partially transparent display, a flexible display, a rollable display, a foldable display, a stretchable display, a laser printer, a telephone, a portable phone, a tablet personal computer, a phablet, a personal digital assistant (PDA), a wearable device, a laptop computer, a digital camera, a camcorder, a viewfinder, a micro display, a three-dimensional (3D) display, a virtual reality or augmented reality display, a vehicle, a video wall with multiple displays tiled together, a theater or stadium screen, a phototherapy device, a signboard, and combinations thereof.

20. A light-emitting device comprising:

a first electrode;

a second electrode facing the first electrode;

an interlayer between the first electrode and the second electrode and comprising an emission layer, wherein the emission layer comprises an emitter and a sensitizer, the sensitizer being a transition metal-containing organometallic compound comprising oxygen (O) directly bonded to the transition metal, a spectral overlap integral of an emission spectrum of the sensitizer and an absorption spectrum of the emitter is at least $1\times10^{13}$ $M^{-1}cm^{4}$, a highest occupied molecular orbital (HOMO) energy level of the sensitizer is higher than a HOMO energy level of the emitter, the spectral overlap integral is evaluated by Equation 1:

$$J(\lambda) = \int_0^\infty \varepsilon(\lambda)\lambda^4 F_D(\lambda)d\lambda,$$

wherein, in Equation 1, $J(\lambda)$ is the spectral overlap integral of the emission spectrum of the sensitizer and the absorption spectrum of the emitter, $\varepsilon(\lambda)$ is a molar extinction coefficient of the emitter calculated from the absorption spectrum of the emitter, $\lambda$ is a wavelength of the emission spectrum and the absorption spectrum, and $F_D(\lambda)$ is a normalized emission spectrum of the sensitizer.

* * * * *